(12) United States Patent

Kawasaki et al.

(10) Patent No.: US 12,604,474 B2

(45) Date of Patent: Apr. 14, 2026

(54) TRENCH PATTERNING PROCESS USING MICROCRACKING

(71) Applicant: WESTERN DIGITAL TECHNOLOGIES, INC., San Jose, CA (US)

(72) Inventors: Motoki Kawasaki, Yokkaichi (JP); Shunsuke Takuma, Yokkaichi (JP); Seiji Shimabukuro, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 461 days.

(21) Appl. No.: 18/475,826

(22) Filed: Sep. 27, 2023

(65) Prior Publication Data

US 2025/0107083 A1 Mar. 27, 2025

(51) Int. Cl.
| | |
|---|---|
| *H10B 43/27* | (2023.01) |
| *H10B 51/20* | (2023.01) |
| *H10B 63/10* | (2023.01) |

(52) U.S. Cl.
CPC ............. *H10B 43/27* (2023.02); *H10B 51/20* (2023.02); *H10B 63/10* (2023.02)

(58) Field of Classification Search
CPC ........ H10B 43/27; H10B 51/20; H10B 63/10; H10B 43/10; H10B 43/35; H10B 43/50
See application file for complete search history.

(56) References Cited

U.S. PATENT DOCUMENTS

| | | | |
|---|---|---|---|
| 9,679,906 | B2 | 6/2017 | Lu et al. |
| 11,380,707 | B2 | 7/2022 | Matsuno et al. |
| 11,450,685 | B2 | 9/2022 | Yoshida |
| 11,532,570 | B2 | 12/2022 | Mizuno et al. |
| 2017/0047334 | A1 | 2/2017 | Lu et al. |

(Continued)

FOREIGN PATENT DOCUMENTS

| | | |
|---|---|---|
| CN | 1416157 A | 5/2003 |
| CN | 114023756 A | 2/2022 |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Ratisha Mehta

(74) *Attorney, Agent, or Firm* — THE MARBURY LAW GROUP PLLC

(57) ABSTRACT

A method includes forming a first-tier structure over a substrate, forming first-tier trenches laterally extending along a first horizontal direction and laterally spaced apart from each other along a second horizontal direction through the first-tier structure, non-conformally depositing a plurality of material layers over the first-tier structure such that first-tier cavities are formed in volumes of the first-tier trenches that are not filled with the plurality of material layers, and inducing laterally-extending cracks in portions of the plurality of material layers that overlie the first-tier cavities, such that the laterally-extending cracks are connected to a respective underlying one of the first-tier cavities and vertically extend to a topmost material layer of the plurality of material layers.

20 Claims, 56 Drawing Sheets

(56) References Cited

U.S. PATENT DOCUMENTS

| | | | |
|---|---|---|---|
| 2020/0235123 A1 | 7/2020 | Sugiura et al. | |
| 2021/0217694 A1 | 7/2021 | Jain et al. | |
| 2021/0366808 A1 | 11/2021 | Cui et al. | |
| 2021/0391345 A1 | 12/2021 | Otsu et al. | |
| 2022/0157849 A1 | 5/2022 | Lee | |
| 2022/0208556 A1 | 6/2022 | Tirukkonda et al. | |
| 2022/0208785 A1 | 6/2022 | Titus et al. | |
| 2022/0223614 A1 | 7/2022 | Takuma et al. | |
| 2022/0254728 A1 | 8/2022 | Matsuno et al. | |
| 2022/0254733 A1 | 8/2022 | Mizuno et al. | |
| 2022/0254804 A1 | 8/2022 | Yoshida | |
| 2022/0352200 A1* | 11/2022 | Sano | H10B 41/50 |
| 2023/0013984 A1 | 1/2023 | Otsu | |
| 2023/0018927 A1 | 1/2023 | Wang et al. | |
| 2023/0055230 A1 | 2/2023 | Itou et al. | |
| 2023/0057885 A1 | 2/2023 | Itou et al. | |
| 2023/0345722 A1* | 10/2023 | Kim | H10B 43/27 |

FOREIGN PATENT DOCUMENTS

| | | |
|---|---|---|
| KR | 20110058122 A | 6/2011 |
| KR | 20220068059 A | 5/2022 |

OTHER PUBLICATIONS

U.S. Appl. No. 17/494,114, filed Oct. 5, 2021, SanDisk Technologies LLC.

U.S. Appl. No. 17/508,036, filed Oct. 22, 2021, SanDisk Technologies LLC.

U.S. Appl. No. 17/590,278, filed Feb. 1, 2022, SanDisk Technologies LLC.

U.S. Appl. No. 17/657,521, filed Mar. 31, 2022, SanDisk Technologies LLC.

U.S. Appl. No. 17/819,081, filed Aug. 11, 2022, SanDisk Technologies LLC.

U.S. Appl. No. 17/819,097, filed Aug. 11, 2022, SanDisk Technologies LLC.

U.S. Appl. No. 17/936,479, filed Sep. 29, 2022, SanDisk Technologies LLC.

U.S. Appl. No. 18/229,489, filed Aug. 2, 2023, Western Digital Technologies, Inc.

U.S. Appl. No. 18/357,781, filed Jul. 24, 2023, Western Digital Technologies, Inc.

U.S. Appl. No. 18/360,541, filed Jul. 27, 2023, SanDisk Technologies LLC.

U.S. Appl. No. 18/360,641, filed Aug. 15, 2023, SanDisk Technologies LLC.

U.S. Appl. No. 18/450,150, filed Aug. 15, 2023, Western Digital Technologies, Inc.

U.S. Appl. No. 18/450,791, filed Aug. 16, 2023, SanDisk Technologies LLC.

ISR-WO—Notification of Transmittal of The International Search Report and Written Opinion of the International Searching Authority for International Patent Application No. PCT/US2024/031324, mailed Sep. 10, 2024, 9 pages.

* cited by examiner

TRENCH PATTERNING PROCESS USING MICROCRACKING

FIELD

The present disclosure relates generally to the field of semiconductor devices, and particularly to a method of forming trenches in a semiconductor structure by employing local microcracking of a layer stack.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method includes forming a first-tier structure over a substrate, forming first-tier trenches laterally extending along a first horizontal direction and laterally spaced apart from each other along a second horizontal direction through the first-tier structure, non-conformally depositing a plurality of material layers over the first-tier structure such that first-tier cavities are formed in volumes of the first-tier trenches that are not filled with the plurality of material layers, and inducing laterally-extending cracks in portions of the plurality of material layers that overlie the first-tier cavities, such that the laterally-extending cracks are connected to a respective underlying one of the first-tier cavities and vertically extend to a topmost material layer of the plurality of material layers.

DETAILED DESCRIPTION

Figure 1:
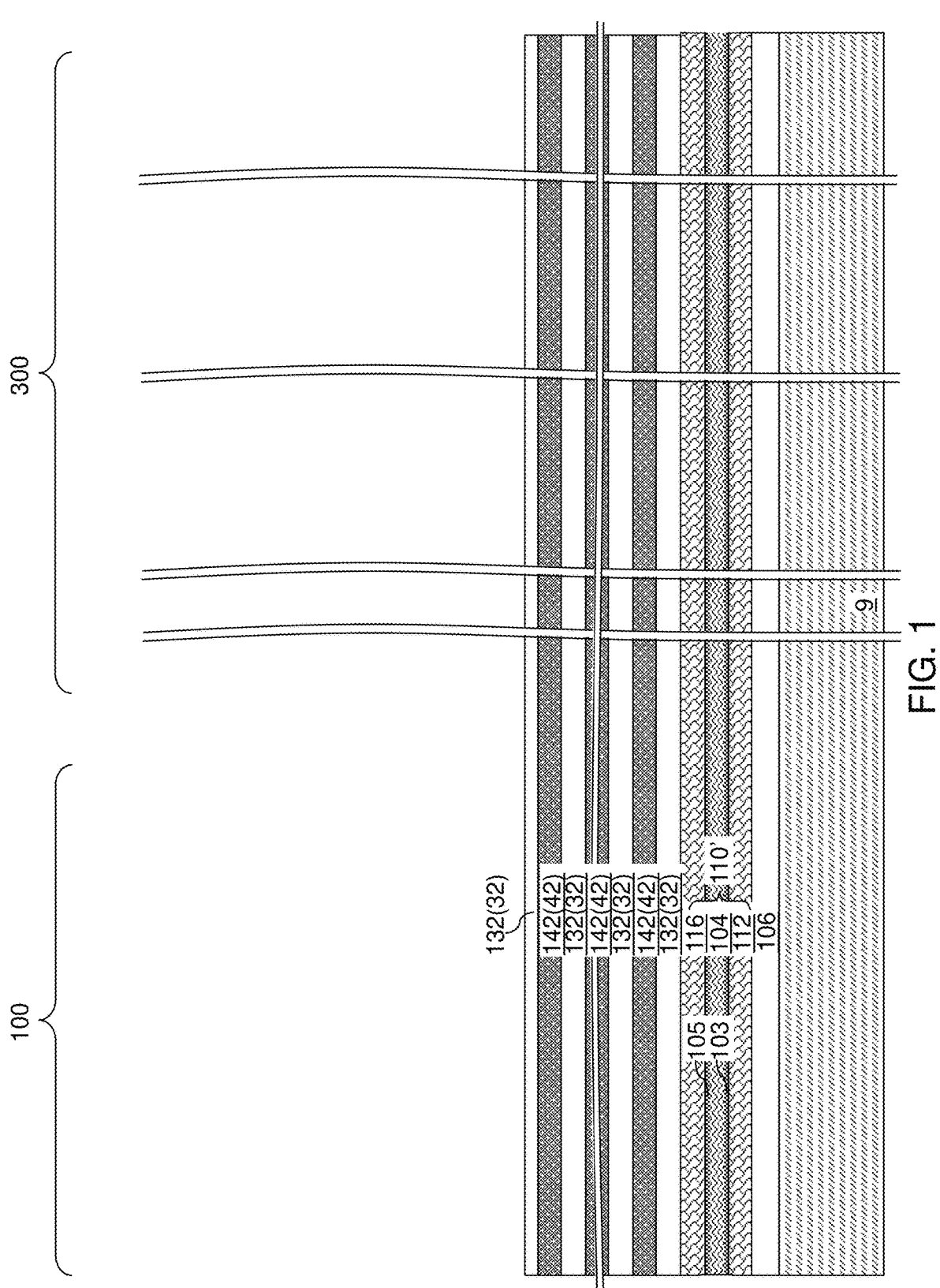
FIG. 1 is a schematic vertical cross-sectional view of an exemplary structure for forming a memory die after formation of a stopper insulating layer, in-process source-level material layers, and a first alternating stack of first insulating layers and first sacrificial material layers over a carrier substrate according to an embodiment of the present disclosure.

As discussed above, the embodiments of the present disclosure are directed to a method of forming trenches in a semiconductor structure by local microcracking of a layer stack, the various aspects of which are described below. Embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, an exemplary structure according to an embodiment of the present disclosure is illustrated. The exemplary structure comprises a carrier substrate 9, which may be a semiconductor substrate. For example, the carrier substrate 9 may comprise a commercially available silicon wafer. Alternatively, the carrier substrate 9 may comprise any material that may be removed selective to the materials of overlying materials which are subsequently formed.

An optional insulating material layer can be formed on a top surface of the carrier substrate 9. The insulating material layer can be subsequently employed as a stopping material layer for an optional process that removes the carrier substrate 9, and is herein referred to as a stopper insulating layer 106. In one embodiment, the stopper insulating layer 106 comprises a dielectric material such as undoped silicate glass (i.e., silicon oxide), a doped silicate glass, or silicon nitride. The thickness of the stopper insulating layer 106 may be in a range from 50 nm to 600 nm, such as from 100 nm to 300 nm, although lesser and greater thicknesses may also be employed.

In-process source-level material layers 110' can be formed over the stopper insulating layer 106. The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner 103, a source-level sacrificial layer 104, an optional upper sacrificial liner 105, and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 (or selective to the lower source-level semiconductor layer 112) and the upper sacrificial liner 105 (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner 103 (if present) and the upper sacrificial liner 105 (if present) include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

A first alternating stack (132, 142) of first insulating layers 132 and first sacrificial material layers 142 can be formed over the in-process source-level material layers 110'. The first insulating layers 132 comprise an insulating material, such as undoped silicate glass (i.e., silicon oxide) or a doped silicate glass, and the first sacrificial material layers 142 comprise a sacrificial material, such as silicon nitride. In one embodiment, the first insulating layers 132 may comprise silicon oxide layers, and the first sacrificial material layers 142 may comprise silicon nitride layers. The first alternating stack (132, 142) may comprise multiple repetitions of a unit layer stack including a first insulating layer 132 and a first sacrificial material layer 142. The total number of repetitions of the unit layer stack within the first alternating stack (132, 142) may be, for example, in a range from 8 to 1,024, such as from 32 to 256, although lesser and greater number of repetitions may also be employed. The first insulating layers 132 comprise a first subset of insulating layers 32 to be employed in the exemplary structure, and the first sacrificial material layers 142 comprise a first subset of sacrificial material layers 42 to be employed in the exemplary structure.

Each of the first insulating layers 132 may have a thickness in a range from 20 nm to 100 nm, such as from 30 nm to 60 nm, although lesser and greater thicknesses may also be employed. Each of the first sacrificial material layers 142 may have a thickness in a range from 20 nm to 100 nm, such as from 30 nm to 60 nm, although lesser and greater thicknesses may also be employed.

The exemplary structure comprises a memory array region 100 in which a three-dimensional array of memory elements is to be subsequently formed, and a contact region 300 in which layer contact via structures contacting word lines are to be subsequently formed.

Figure 2:
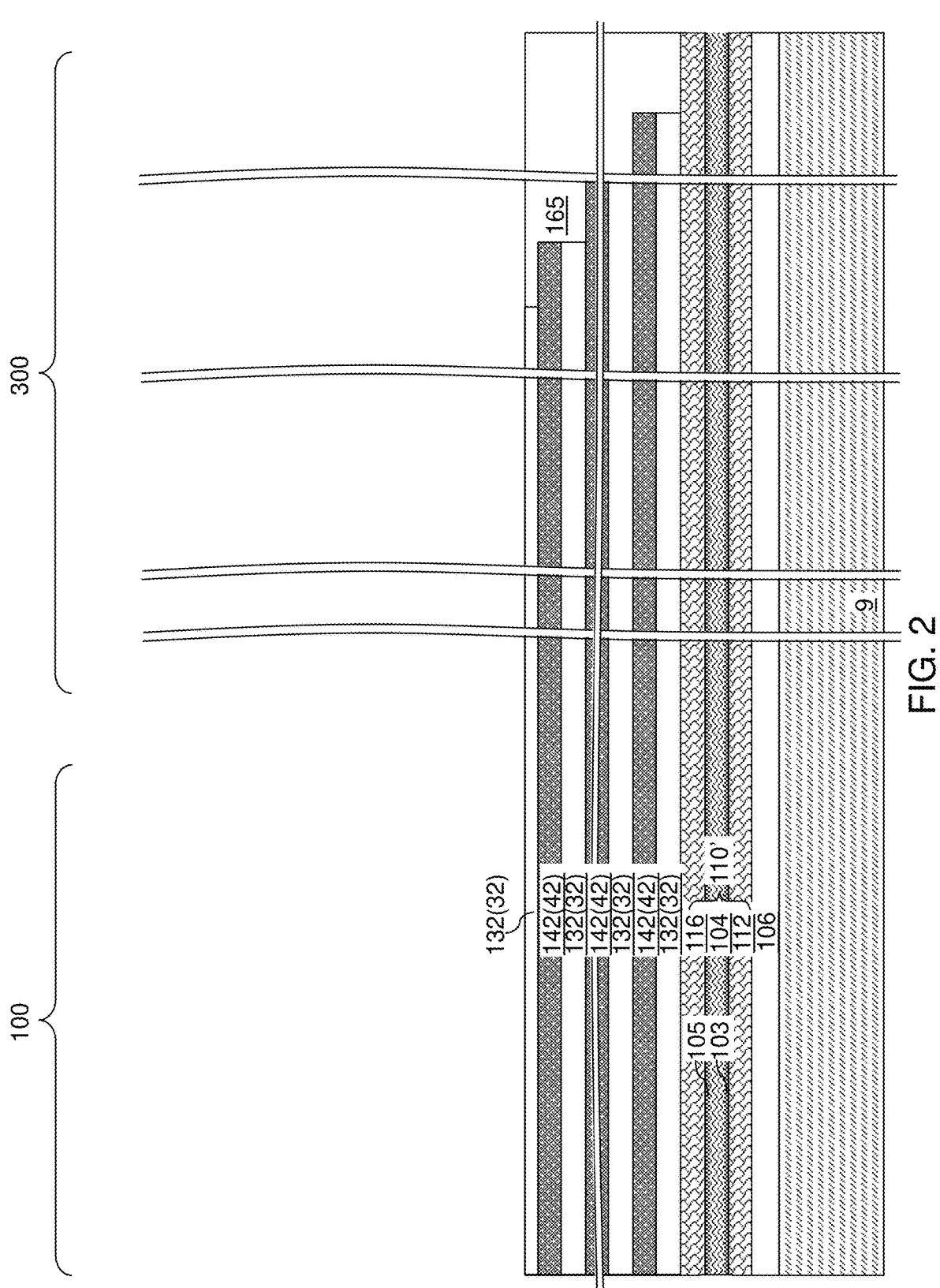
FIG. 2 is a schematic vertical cross-sectional view of the exemplary structure after formation of first stepped surfaces and a first retro-stepped dielectric material portion according to an embodiment of the present disclosure.

Referring to FIG. 2, first stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A first stepped cavity is formed within the volume from which portions of the first alternating stack (132, 142) are removed through formation of the first stepped surfaces. A "stepped cavity" refers to a cavity having stepped surfaces.

The first stepped cavity can have various first stepped surfaces such that the horizontal cross-sectional shape of the first stepped cavity changes in steps as a function of the vertical distance from the top surface of the in-process source-level material layers 110'. In one embodiment, the first stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each first sacrificial material layer 142 other than a topmost first sacrificial material layer 142 within the first alternating stack (132, 142) laterally extends farther than any overlying first sacrificial material layer 142 within the first alternating stack (132, 142) in the terrace region. The first stepped surfaces of the first alternating stack (132, 142) continuously extend from a bottommost layer within the first alternating stack (132, 142) to the topmost layer within the first alternating stack (132, 142). Generally, the first stepped surfaces continuously extend from a bottommost layer within the first alternating stack (132, 142) at least to a topmost layer within the first alternating stack (132, 142).

A first stepped dielectric material portion 165 (i.e., an insulating fill material portion) can be formed in the first stepped cavity by deposition of a dielectric material therein. For example, a dielectric material such as silicon oxide can be deposited in the first stepped cavity. Excess portions of the deposited dielectric material can be removed from above the top surface of the topmost first insulating layer 132, for example, by chemical mechanical planarization (CMP). The remaining portion of the deposited dielectric material filling the first stepped cavity constitutes the first stepped dielectric material portion 165. As used herein, a "stepped" element refers to an element that has first stepped surfaces and a horizontal cross-sectional area that increases monotonically as a function of a vertical distance from a top surface of a substrate on which the element is present. If silicon oxide is employed for the first stepped dielectric material portion 165, the silicon oxide of the first stepped dielectric material portion 165 may, or may not, be doped with dopants such as B, P, and/or F. In one embodiment, the first stepped dielectric material portion 165 overlies and contacts the first stepped surfaces, and has a top surface that is coplanar with the top surface of the topmost first insulating layer 132. Thus, a first-tier structure (132, 142, 165) is formed over the in-process source-level material layers 110'.

Figure 3A:
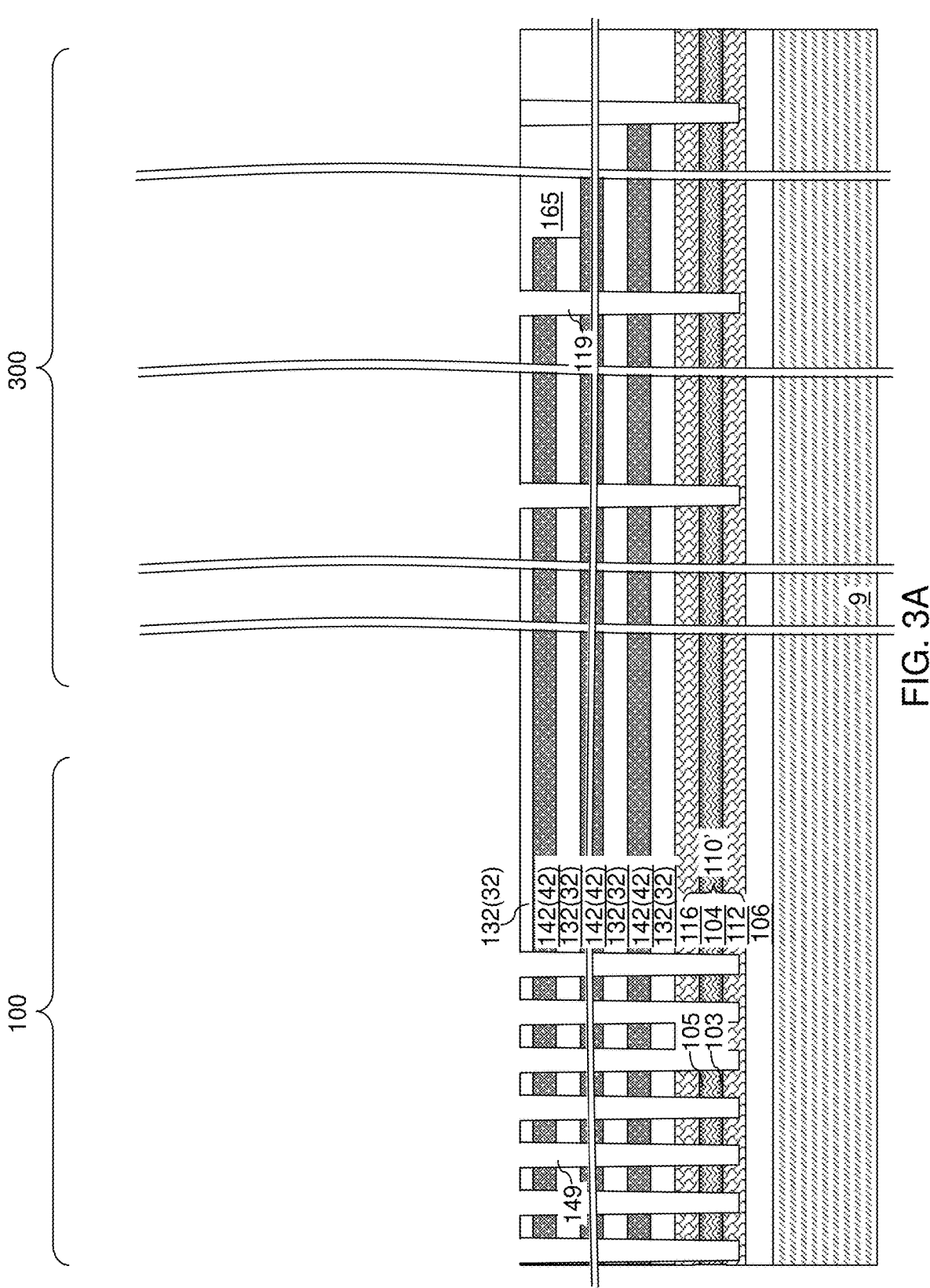
FIG. 3A is a schematic vertical cross-sectional view of the exemplary structure after forming first-tier memory openings and first-tier support openings according to an embodiment of the present disclosure.
Figure 3B:
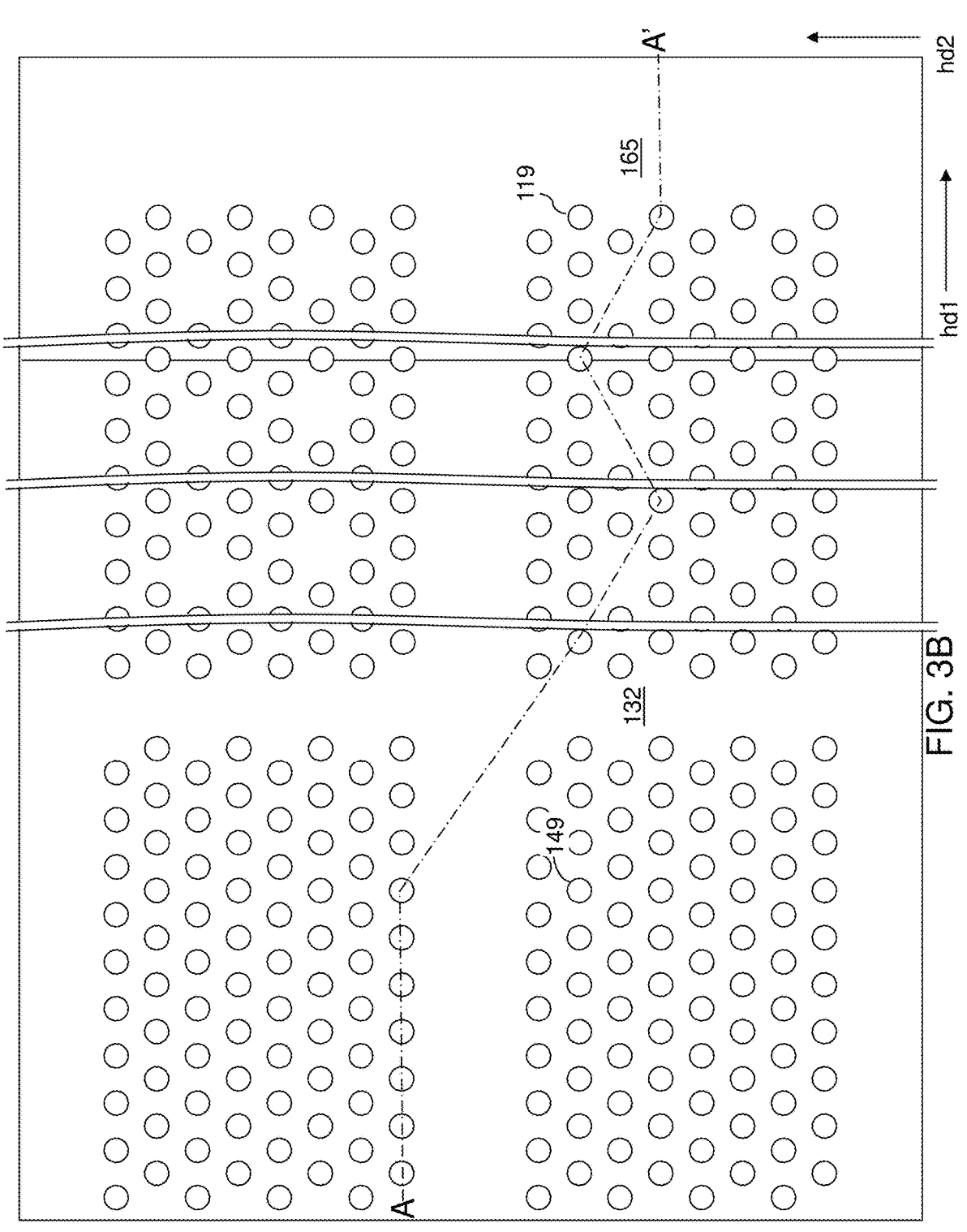
FIG. 3B is a top-down view of the exemplary structure of FIG. 3A. The vertical plane A-A' is the cut plane of the vertical cross-sectional view of FIG. 3A.

Referring to FIGS. 3A and 3B, a first etch mask layer (such as a patterned photoresist layer) can be formed over the topmost first insulating layer 132, and can be lithographically patterned to form various openings therein. A first anisotropic etch process can be performed to transfer the pattern of the openings in the first etch mask layer through the first alternating stack (132, 142) and the first stepped dielectric material portion 165. Various openings can be formed through the first alternating stack (132, 142) and the first stepped dielectric material portion 165. The various openings may comprise first-tier memory openings 149 that are formed in the memory array region 100 and first-tier support openings 119 that are formed in the contact region 300. Each of the first-tier memory openings 149 and the first-tier support openings 119 can vertically extend through the first alternating stack (132, 142) and into the in-process source-level material layers 110'. In one embodiment, bottom surfaces of the first-tier memory openings 149 and the first-tier support openings 119 may be formed within the lower source-level semiconductor layer 112 or at an interface between the lower source-level semiconductor layer and the stopper insulating layer 106. The first etch mask layer can be subsequently removed.

The first-tier support openings 119 may have a maximum diameter in a range from 50 nm to 400 nm, such as from 70 nm to 300 nm, although lesser and greater maximum diameters may be employed. The first-tier memory openings 149 may have a maximum diameter in a range from 50 nm to 400 nm, such as from 70 nm to 300 nm, although lesser and greater maximum diameters may be employed.

In one embodiment, the memory array region 100 may be laterally spaced apart from the contact region 300 along a first horizontal direction hd1. The first-tier memory openings 149 may comprise rows of first-tier memory openings 149 that are arranged along the first horizontal direction hd1 and laterally spaced apart along a second horizontal direction hd2 that is perpendicular to the first horizontal direction hd2. Multiple clusters of first-tier memory openings 149, each containing a respective two-dimensional periodic array of first-tier memory openings 149, may be formed in the memory array region 100. The clusters of first-tier memory openings 149 may be laterally spaced apart along the second horizontal direction hd2.

Figure 4:
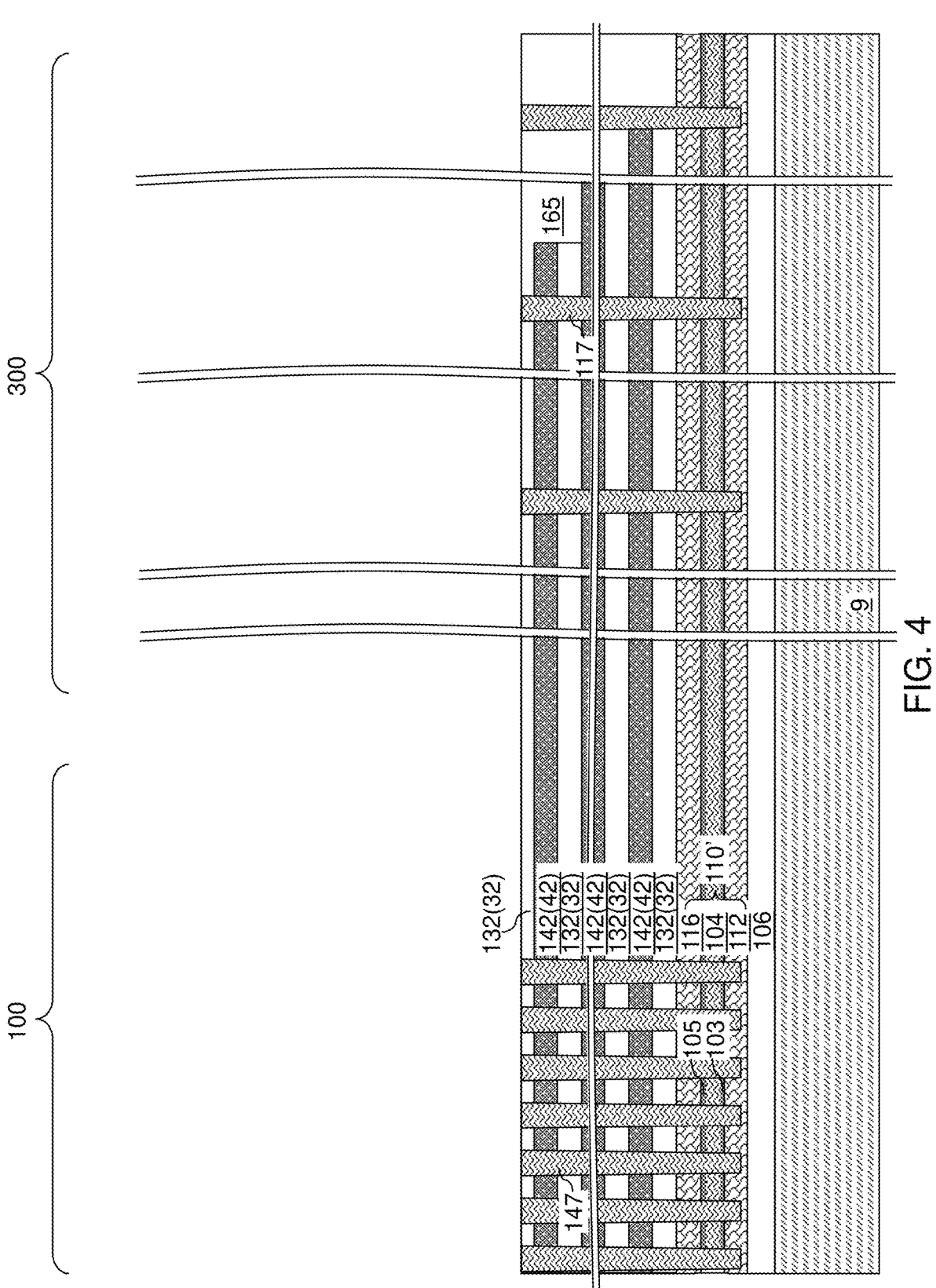
FIG. 4 is a schematic vertical cross-sectional view of the exemplary structure after formation of first-tier sacrificial memory opening fill structures and first-tier sacrificial support opening fill structures according to an embodiment of the present disclosure.

Referring to FIG. 4, an optional etch stop liner (not shown) and a first sacrificial fill material can be deposited in the first-tier memory openings 149 and the first-tier support openings 119. The optional etch stop liner (if present) comprises a thin silicon oxide layer having a thickness in a range from 1 nm to 6 nm. The first sacrificial fill material may comprise a carbon-based material, such as amorphous carbon or diamond-like carbon.

A recess etch process can be performed to remove portions of the first sacrificial fill material from above the horizontal plane including the top surface of the topmost first insulating layer 132. Remaining portions of the first sacrificial fill material that fill the first-tier memory openings 149 and the first-tier support openings 119 constitute first-tier sacrificial opening fill structures (147, 117). The first-tier sacrificial opening fill structures (147, 117) comprise first-tier sacrificial memory opening fill structures 147 that are formed in the first-tier memory openings 149, and first-tier sacrificial support opening fill structures that are formed in the first-tier support openings 119.

Figure 5A:
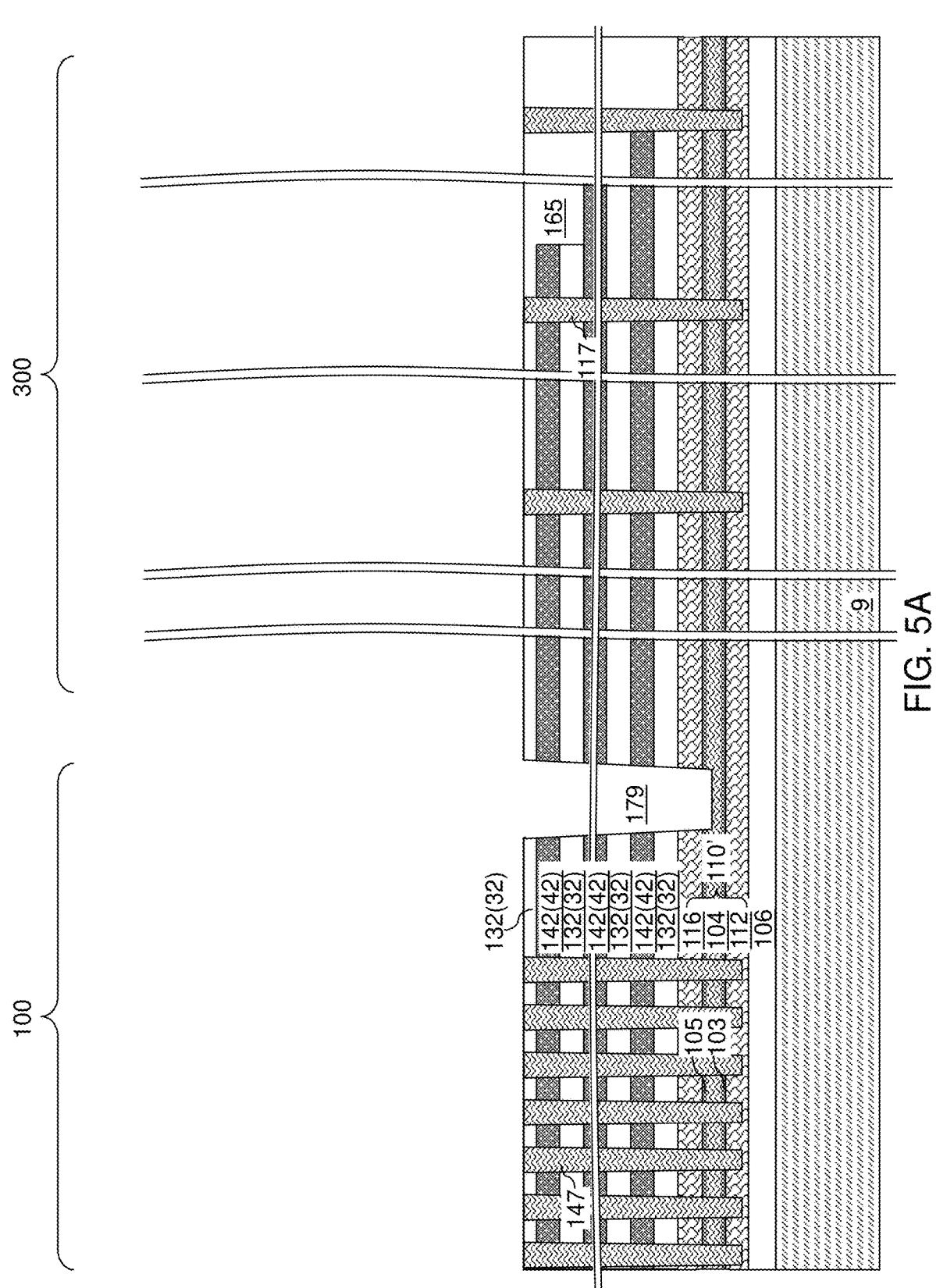
FIG. 5A is a schematic vertical cross-sectional view of the exemplary after formation of first-tier lateral isolation trenches according to an embodiment of the present disclosure.
Figure 5B:
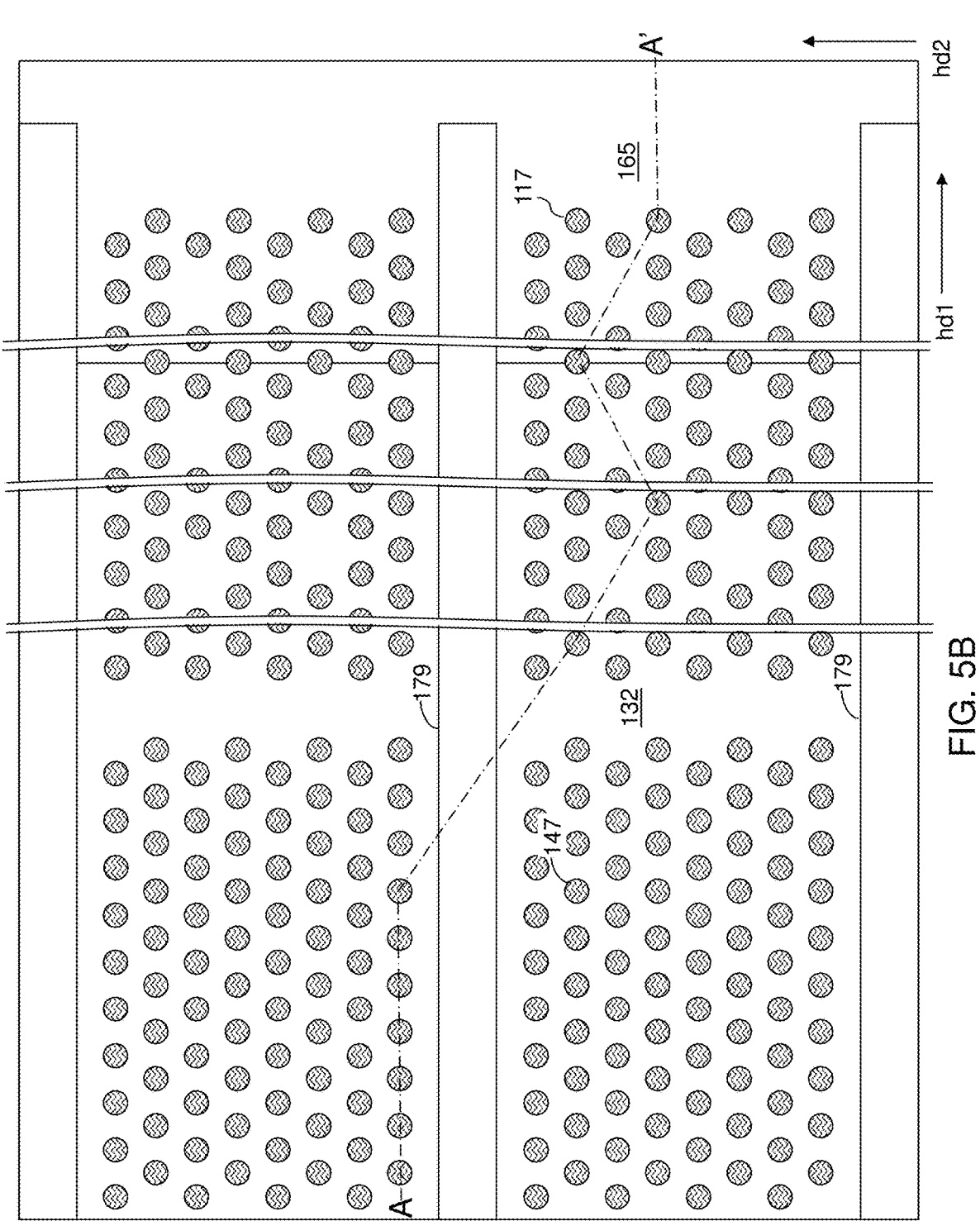
FIG. 5B is a top-down view of the exemplary structure of FIG. 5A. The vertical plane A-A' is the cut plane of the vertical cross-sectional view of FIG. 5A.

Referring to FIGS. 5A and 5B, a photoresist layer (not shown) can be applied over the first-tier alternating stack (132, 142), and can be lithographically patterned to form elongated openings that laterally extend along the first horizontal direction hd1 between neighboring clusters of first-tier sacrificial memory opening fill structures 147. An anisotropic etch process can be performed to transfer the pattern of the openings in the photoresist layer through the first-tier alternating stack (132, 142). First-tier lateral isolation trenches 179 laterally extending along the first horizontal direction hd1 (which can be a word line direction) can be formed through the first-tier alternating stack (132, 142) and the first stepped dielectric material portion 165. Each of the first-tier lateral isolation trenches 179 may comprise a respective pair of lengthwise sidewalls that are parallel to the first horizontal direction hd1. The width of each first-tier lateral isolation trench 179 may be in a range from 150 nm to 1,000 nm, such as from 300 nm to 600 nm, although lesser and greater widths may also be employed. The photoresist layer can be subsequently removed, for example, by ashing.

The first alternating stack of first insulating layers 132 and first sacrificial material layers 142 can be divided into a plurality of first alternating stacks (132, 142) each including respective first insulating layers 132 and respective first sacrificial material layers 142. The first-tier structure comprises first-tier lateral isolation trenches 179 laterally extending along the first horizontal direction hd1 and laterally spaced apart from each other along a second horizontal direction hd2, which may be perpendicular to the first horizontal direction hd1. In summary, the first-tier structure comprises at least one alternating stack of insulating layers and sacrificial material layers that are interlaced along a vertical direction, and further comprises at least one first-tier trench, such as at least one first-tier lateral isolation trench 179.

Figure 6:
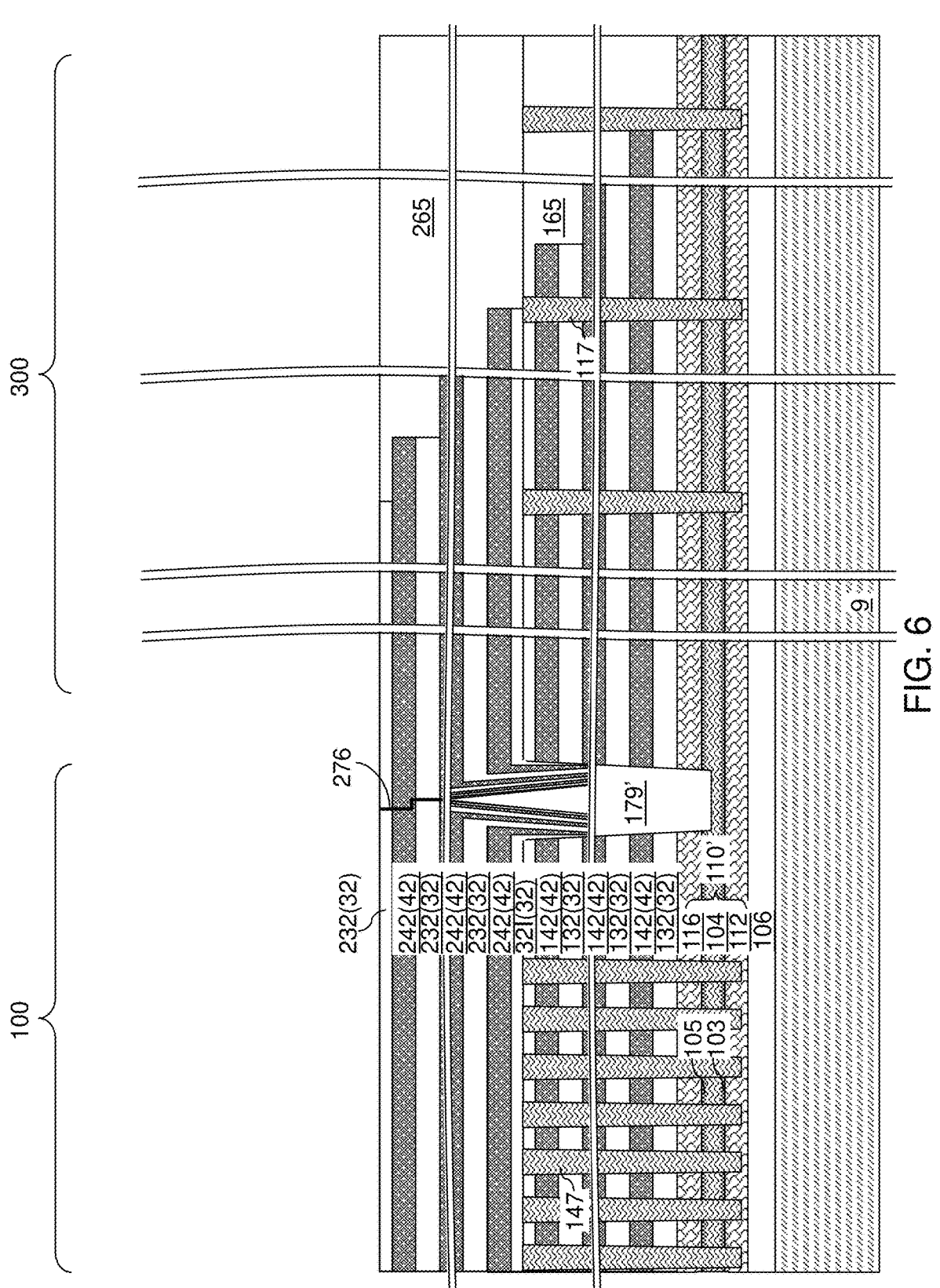
FIG. 6 is a schematic vertical cross-sectional view of the exemplary structure after formation of a second alternating stack of second insulating layers and second sacrificial material layers according to an embodiment of the present disclosure.

Referring to FIG. 6, a second alternating stack (232, 242) of second insulating layers 232 and second sacrificial material layers 242 can be formed over the first-tier structure. In one embodiment, the second insulating layers 232 may comprise silicon oxide layers, and the second sacrificial material layers 242 may comprise silicon nitride layers. The second alternating stack (232, 242) may comprise multiple repetitions of a unit layer stack including a second insulating layer 232 and a second sacrificial material layer 242. The total number of repetitions of the unit layer stack within the second alternating stack (232, 242) may be, for example, in a range from 8 to 1,024, such as from 32 to 256, although lesser and greater number of repetitions may also be employed. The second insulating layers 232 comprise a second subset of the insulating layers 32 to be employed in the exemplary structure, and the second sacrificial material layers 242 comprise a second subset of the sacrificial material layers 42 to be employed in the exemplary structure.

The second alternating stack (232, 242) comprises a plurality of material layers that are formed over the first-tier structure employing non-conformal deposition methods. Specifically, each of the second insulating layers 232 and the second sacrificial material layers 242 may be deposited by a respective non-conformal deposition process such as a plasma-enhanced chemical vapor deposition process. A first subset of material layers (232, 242) within second alternating stack (232, 242) can be formed with a respective downward-protruding portion that is deposited in peripheral portions of the first-tier lateral isolation trenches 179 with a variable lateral width that decreases with a downward distance from a horizontal plane including the topmost surface of the first-tier structure. First-tier cavities 179' are formed in volumes of the first-tier lateral isolation trenches 179 that are not filled with the materials of the second alternating stack (232, 242). A topmost layer of the first subset of material layers covers the top of each first-tier cavity 179'.

A second subset of material layers (232, 242) within second alternating stack (232, 242) overlies the first subset of material layers. Each material layer (i.e., each second insulating layer 232 and each sacrificial material layer 242) within the second subset of material layers does not include any downward-protruding portion that protrudes into any first-tier lateral isolation trench 179. However, in one embodiment, a non-uniformity 276 may be located in the second subset of material layers (232, 242) above the first-tier cavity 179'. The non-uniformity may comprise a recess (i.e., dent), a structurally weak region, or a microcrack which may extend through the second subset of material layers (232, 242) above the first-tier cavity 179'. If the microcrack which extends through the second subset of material layers (232, 242) is not formed, then each material layer (i.e., each second insulating layer 232 and each sacrificial material layer 242) within the second subset of material layers is not exposed to any first-tier cavity 179'. In one embodiment, the total thickness of the plurality of material layers (232, 242), i.e., the second alternating stack (232, 242), above a topmost horizontal surface of the first-tier structure may be at least 10 times the maximum lateral width of a first-tier lateral isolation trenches 179.

According to an embodiment of the present disclosure, the second insulating layers 232 comprise silicon oxide layers, and the second sacrificial material layers 242 comprise hydrogen-containing silicon nitride layers. In one embodiment, the atomic ratio of hydrogen atoms to silicon atoms in the hydrogen-containing silicon nitride layers as deposited may be in a range from 0.05 to 0.20, such as from 0.07 to 0.15. In other words, there may be at least 5 hydrogen atoms, such as 5 to 20 hydrogen atoms, for every 100 silicon atoms. Generally, an atomic ratio of hydrogen atoms silicon atoms greater than 0.05 in the hydrogen-containing silicon nitride layers may be provided by increasing the ratio of the ammonia flow rate to nitrogen flow rate during the plasma enhanced chemical vapor deposition of the hydrogen-containing silicon nitride layers. In a non-limiting illustrative example, the flow rate of ammonia in a PECVD process chamber may be in a range from 5 standard liters per minute (slm) to 20 slm, such as from 7 slm to 12 slm, and the flow rate of nitrogen gas into a same process chamber may be in a range from 10 slm to 30 slm, such as from 15 slm to 25 slm, although lesser and greater ratios may also be employed. The flow rate of silane into the same process camber may be in a range from 500 standard cubic centimeters per minute (sccm) to 1500 sccm, such as 800 sccm to 1000 sccm, although lesser and greater flow rates may also be employed. The atomic ratio of nitrogen atoms to silicon atoms in the hydrogen-containing silicon nitride layers of the second sacrificial material layers 242 may be (4-d): 3, in which d is in a range from 0 to 0.30. While an embodiment is described in which the sacrificial material layers 242 comprise hydrogen-containing silicon nitride materials, in other embodiments, other sacrificial material layers 242 that comprise compressive stress materials which provide a thermal contraction may be used. Furthermore, insulating layers 232 may comprise an insulating material other than silicon oxide in alternative embodiments.

Second stepped surfaces can be formed in the contact region 300 by pattering the second alternating stack (232, 242). A second stepped dielectric material portion 265 can be formed over the second stepped surfaces.

Figure 7A:
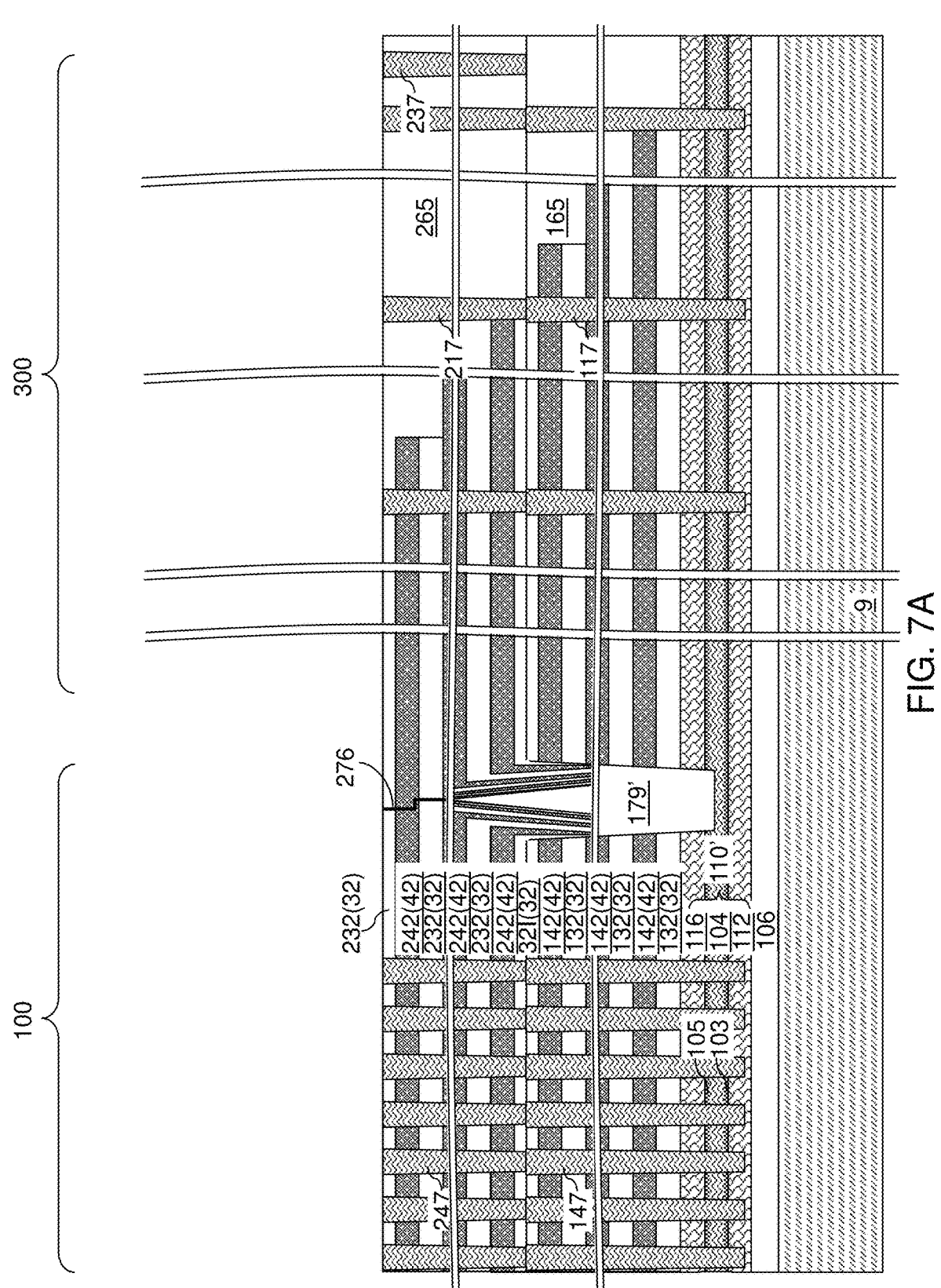
FIGS. 7A and 7C are schematic vertical cross-sectional views of the exemplary structures after formation of second-tier sacrificial memory opening fill structures and second-tier sacrificial support opening fill structures according to alternative embodiments of the present disclosure.
Figure 7B:
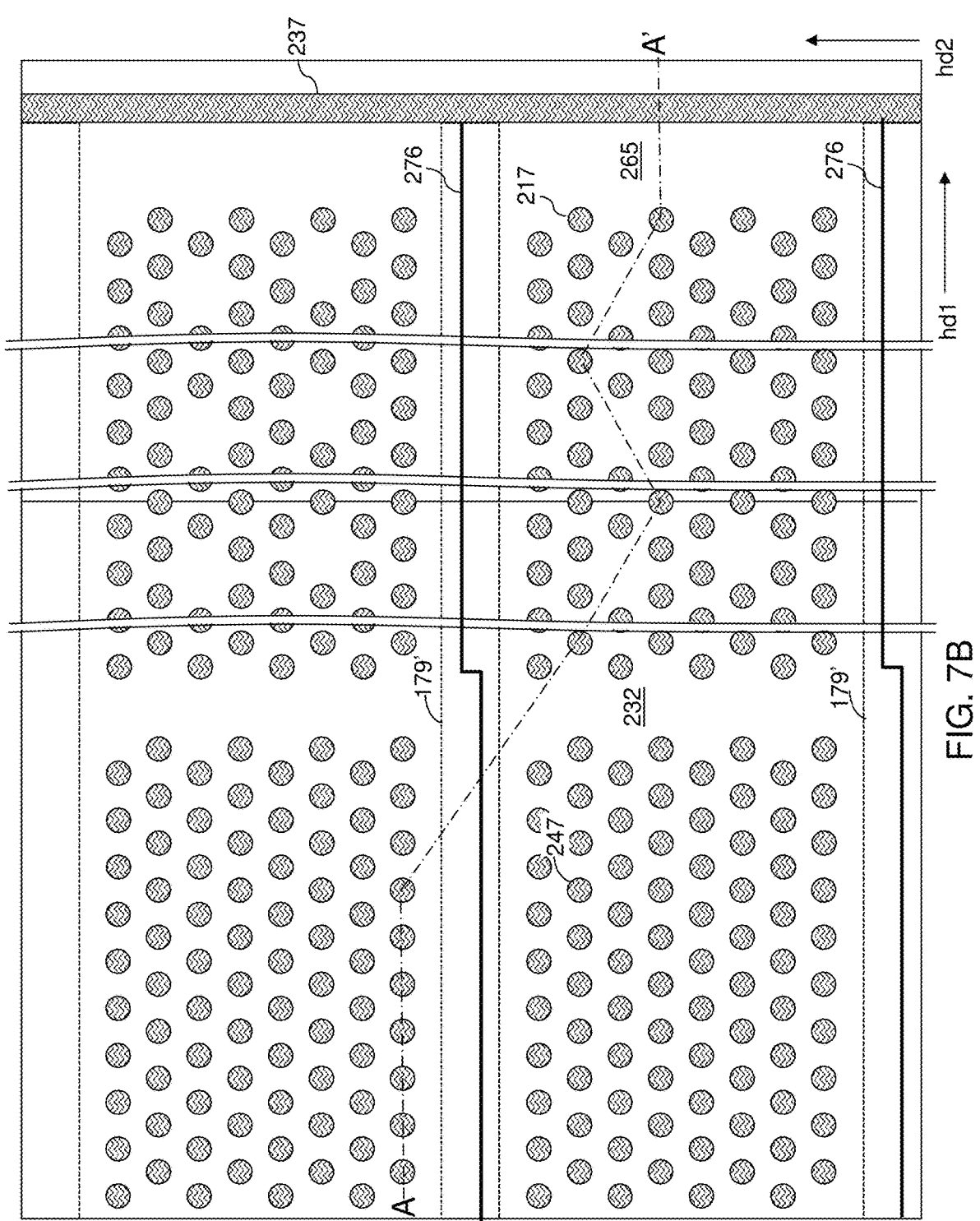
FIG. 7B is a top-down view of the exemplary structure of FIG. 7A. The vertical plane A-A' is the cut plane of the vertical cross-sectional view of FIG. 7A.

Referring to FIGS. 7A and 7B, a second etch mask layer (such as a patterned photoresist layer) can be formed over the topmost second insulating layer 232, and can be lithographically patterned to form various openings therein. A second anisotropic etch process can be performed to transfer the pattern of the openings in the second etch mask layer through the second alternating stack (232, 242) and the second stepped dielectric material portion 265. Various openings can be formed through the second alternating stack (232, 242) and the second stepped dielectric material portion 265. The various openings may comprise second-tier memory openings that are formed in the memory array region 100 and second-tier support openings that are formed in the contact region 300. Optional first crack-stop trenches are formed in the contact region 300. The first crack-stop trenches may be elongated along the second horizontal direction (e.g., bit line direction) hd2.

Each of the second-tier memory openings, the second-tier support openings, and the first crack-stop trenches can vertically extend through the second alternating stack (232, 242). Each second-tier memory opening may be formed on a respective one of the first-tier sacrificial memory openings fill structures 147, and each second-tier support opening may be formed on a respective one of the first-tier sacrificial support opening fill structures 117. The second-tier support openings may have a maximum diameter in a range from 50 nm to 400 nm, such as from 70 nm to 300 nm, although lesser and greater maximum diameters may be employed. The second-tier memory openings may have a maximum diameter in a range from 50 nm to 400 nm, such as from 70 nm to 300 nm, although lesser and greater maximum diameters may be employed.

The first crack-stop trenches can be formed in an area having an areal overlap with or located adjacent to end walls of the first-tier lateral isolation trenches 179. The area of each first crack-stop trench may optionally have an areal overlap with end portions of the first-tier lateral isolation trenches 179 in a plan view. In one embodiment, the areas of the first-tier lateral isolation trenches 179 do not extend along the first horizontal direction hd1 beyond the areas of the first crack-stop trenches. In one embodiment, areas of a plurality of first-tier lateral isolation trenches 179 may be located between a pair of first crack-stop trenches. Thus, a pair of crack-stop trenches may be formed around an area of one of the first-tier lateral isolation trenches 179 through the second-tier structure. In one embodiment, the area of each of the set of first-tier lateral isolation trenches 179 is located between and does not have an areal overall in a plan view with areas of the pair of crack-stop trenches. The second etch mask layer may be subsequently removed.

An optional etch stop liner (not shown) and a second sacrificial fill material can be deposited in the second-tier memory openings, the second-tier support openings, and the crack-stop trenches (if present). The optional etch stop liner (if present) comprises a thin silicon oxide layer having a thickness in a range from 2 nm to 6 nm. The second sacrificial fill material may comprise a carbon-based material, such as amorphous carbon or diamond-like carbon, or a semiconductor material, such as amorphous silicon.

A recess etch process can be performed to remove portions of the second sacrificial fill material from above the horizontal plane including the top surface of the topmost second insulating layer 232. Remaining portions of the second sacrificial fill material that fill the second-tier memory openings and the second-tier support openings constitute second-tier sacrificial opening fill structures (247, 217). The second-tier sacrificial opening fill structures (247, 217) comprise second-tier sacrificial memory opening fill structures 247 that are formed in the second-tier memory openings, and second-tier sacrificial support opening fill structures 217 that are formed in the second-tier support openings. Remaining portions of the second sacrificial fill material that fills the crack-stop trenches constitute first crack-stop structures 237, which are subsequently employed to limit lateral extent of cracks to be formed in the second alternating stack (232, 242). In one embodiment, the first crack-stop structures 237 may be located in a kerf region (i.e., the dicing channel region through which the substrate 9 is diced into separate dies).

In one embodiment, the second sacrificial fill material may comprise a material having an average Young's modulus that is less than the average Young's modulus of the second sacrificial material layers 242. In one embodiment, the second sacrificial fill material may comprise a carbon-based material including carbon (such as amorphous carbon) at an atomic percentage greater than 80% or a semiconductor material (such as amorphous silicon). In an illustrative example, the second sacrificial material layers 242 may comprise a hydrogen-containing silicon nitride material having Young's modulus in a range from 200 GPa to 300 GPa, and the second sacrificial fill material in the second-tier sacrificial memory opening fill structures 247, the second-tier sacrificial support opening fill structures 217, and the first crack-stop structures 237 may comprise conformally deposited amorphous carbon having Young's modulus in a range from 50 GPa to 180 GPa.

Figure 7C:
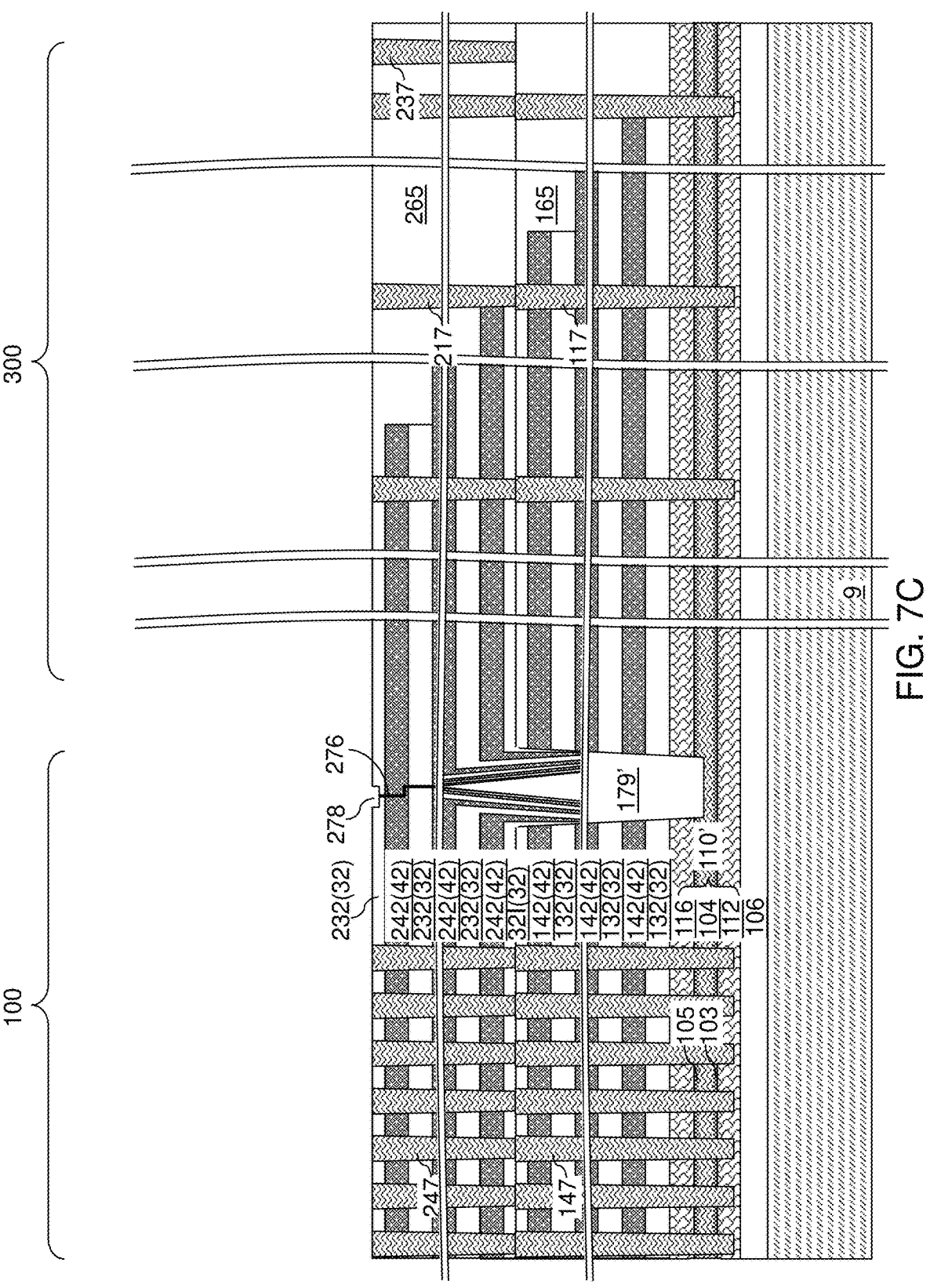

Referring to FIG. 7C, in an alternative embodiment, an optional wedge (i.e., shallow trench) 278 may be formed at the top of the second alternating stack (232, 242) by photolithography and etching. The wedge 278 may extend through one or more topmost layers of the second alternating stack (232, 242). The wedge 278 may be present over the non-uniformity 276. If the non-uniformity is omitted, then the wedge 278 may be present over the cavity 179'.

Figure 8A:
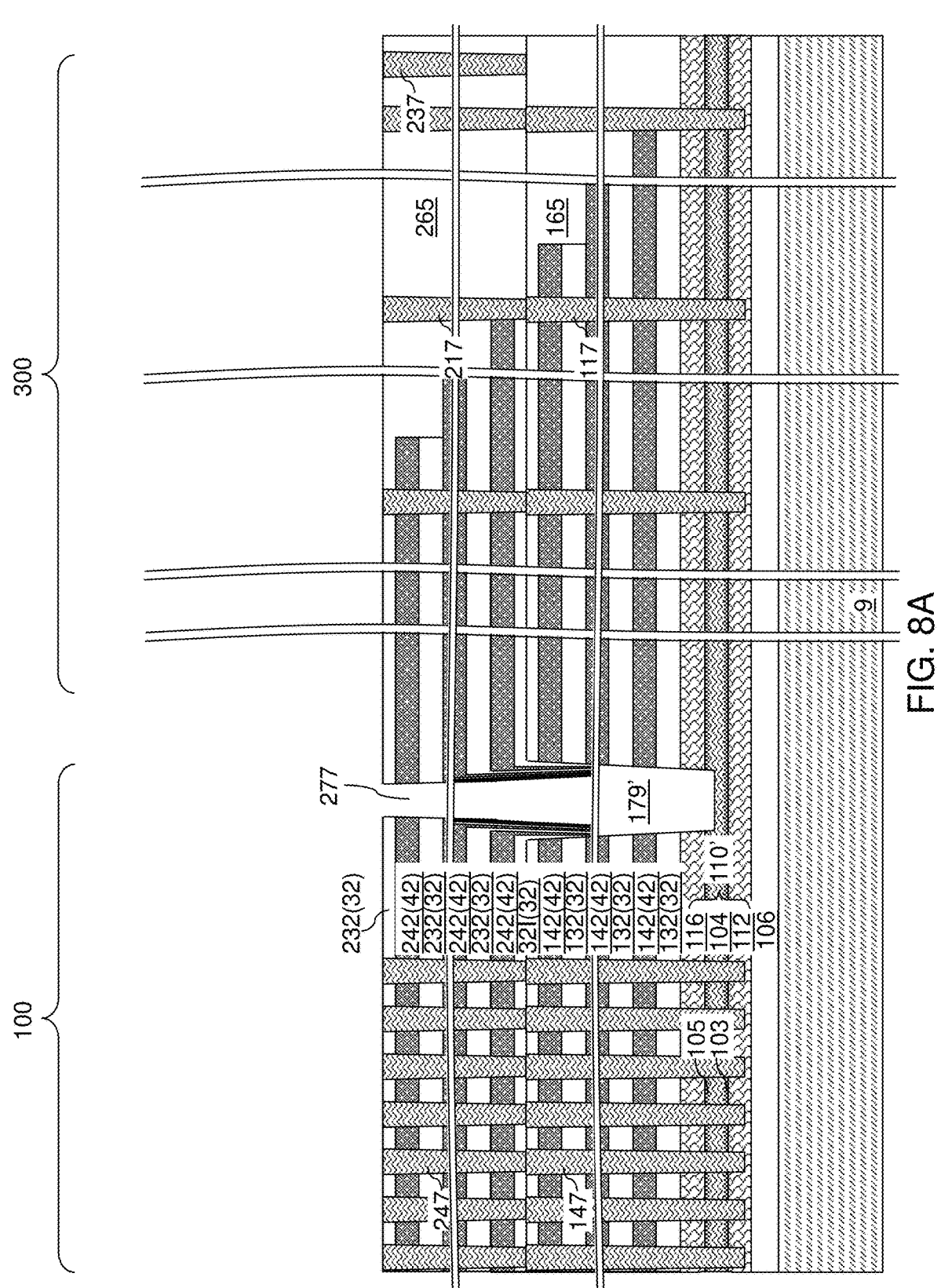
FIG. 8A is a schematic vertical cross-sectional view of the exemplary structure after formation of second-tier laterally-extending cracks in the second alternating stack according to an embodiment of the present disclosure.
Figure 8B:
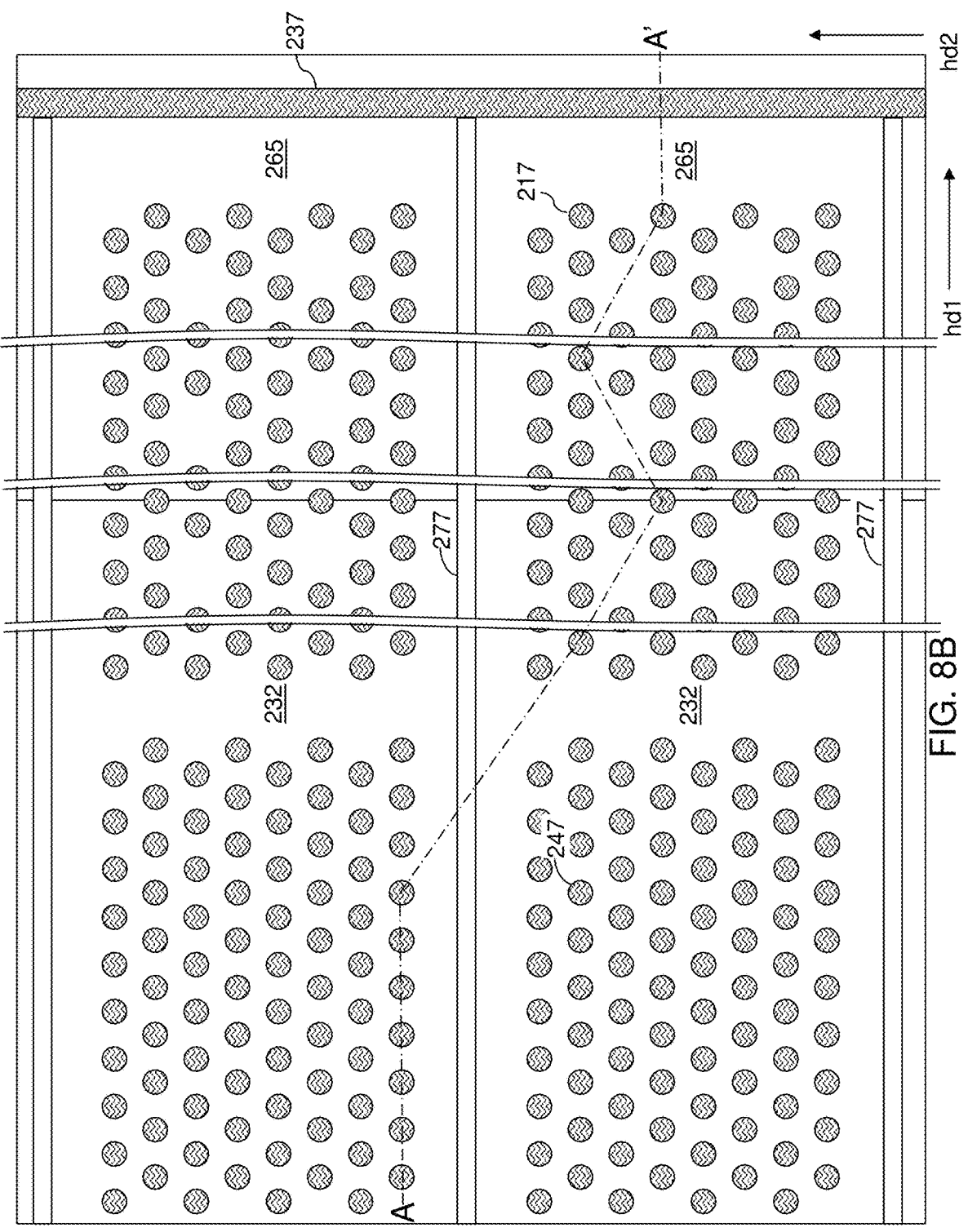
FIG. 8B is a top-down view of the exemplary structure of FIG. 8A. The vertical plane A-A' is the cut plane of the vertical cross-sectional view of FIG. 8A.

Referring to FIGS. 8A and 8B, second-tier laterally-extending cracks 277 can be formed through the second alternating stack (232, 242) by performing a first anneal process. If the wedge 278 is present, then it assists in formation of the second-tier laterally-extending cracks 277. In one embodiment, the first anneal process may be conducted in a nitrogen-containing ambient, such as a $N_2$ containing ambient. The substrate (such as the carrier substrate 9) and the plurality of material layers of the second-tier structure (i.e., the second alternating stack (232, 242)) expand differently from each other during the first anneal process due to their different coefficients of thermal expansion. Specifically, the first anneal process can be performed at an elevated temperature. The elevated temperature may be in a range from 800 degrees Celsius to 1,100 degrees Celsius, and the duration of the first anneal temperature at the elevated temperature may be in a in a range from 1 second to 30 minutes. The first anneal process may be carried out in a furnace and/or in a rapid thermal anneal (RTA) apparatus.

The first anneal process causes stress in the second sacrificial material layers 242, which results in tension in the non-uniformity 276 in the second sacrificial material layers 242. The tension causes the second sacrificial material layers 242 to separate at the non-uniformity 276 to induce formation of second-tier laterally-extending cracks 277 located over the first-tier cavities 179'. The second-tier laterally-extending cracks 277 are connected to a respective underlying one of the first-tier cavities 179' and vertically extend to a topmost material layer of the second alternating stack (232, 242). At least one of the second-tier laterally-extending cracks 277 extends to and stops at the respective first crack-stop structures 237, as shown in FIG. 8B.

Without wishing to be bound by a particular theory, it is believed that the first anneal process reduces the hydrogen content in the hydrogen-containing silicon nitride material of the second sacrificial material layers 242, and increases the nitrogen content in the second sacrificial material layers 242. This change in material composition increases the stress within the second sacrificial material layers 242, and the second-tier laterally-extending cracks 277 cracks are formed in the second sacrificial material layers 242 at locations of the non-uniformities 276, such as dents, weak regions and/or microcracks.

Figure 9A:
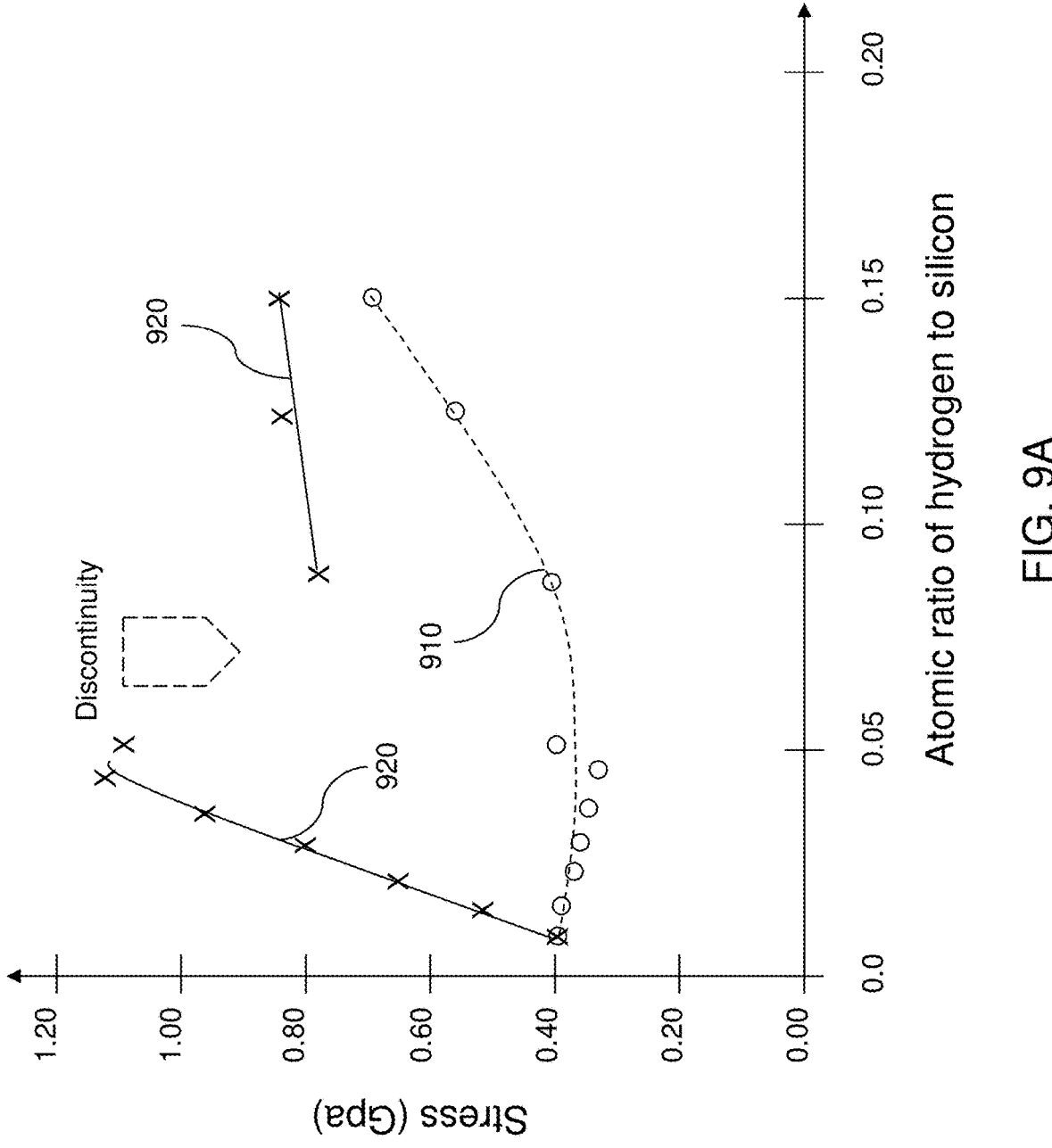
FIG. 9A is a graph illustrating the dependence of stress in hydrogen-containing silicon nitride materials as a function of an atomic ration of hydrogen to silicon.

FIG. 9A is a graph illustrating the dependence of stress in hydrogen-containing silicon nitride materials as a function of an atomic ration of hydrogen to silicon. A first curve 910 illustrates dependence of stress in hydrogen-containing silicon nitride materials prior to an anneal process as a function of an atomic ration of hydrogen to silicon. A second curve 920 illustrates dependence of stress hydrogen-containing silicon nitride materials after an anneal process as a function of an atomic ration of hydrogen to silicon after the anneal process. Generally, the hydrogen concentration after the anneal process is lower than the hydrogen concentration prior to the anneal process, except for low-hydrogen content silicon nitride material. A discontinuity in the second curve 920 may occur in a range of the atomic ratio of hydrogen to silicon from 0.05 to 0.10. The discontinuity in the second curve 920 corresponds to the threshold atomic ratio of hydrogen to silicon, above which cracks are generated in the annealed silicon nitride materials. Thus, use of a hydrogen-containing silicon nitride material for the second sacrificial material layers 242 can induce the second-tier laterally-extending cracks 277.

Figure 9B:
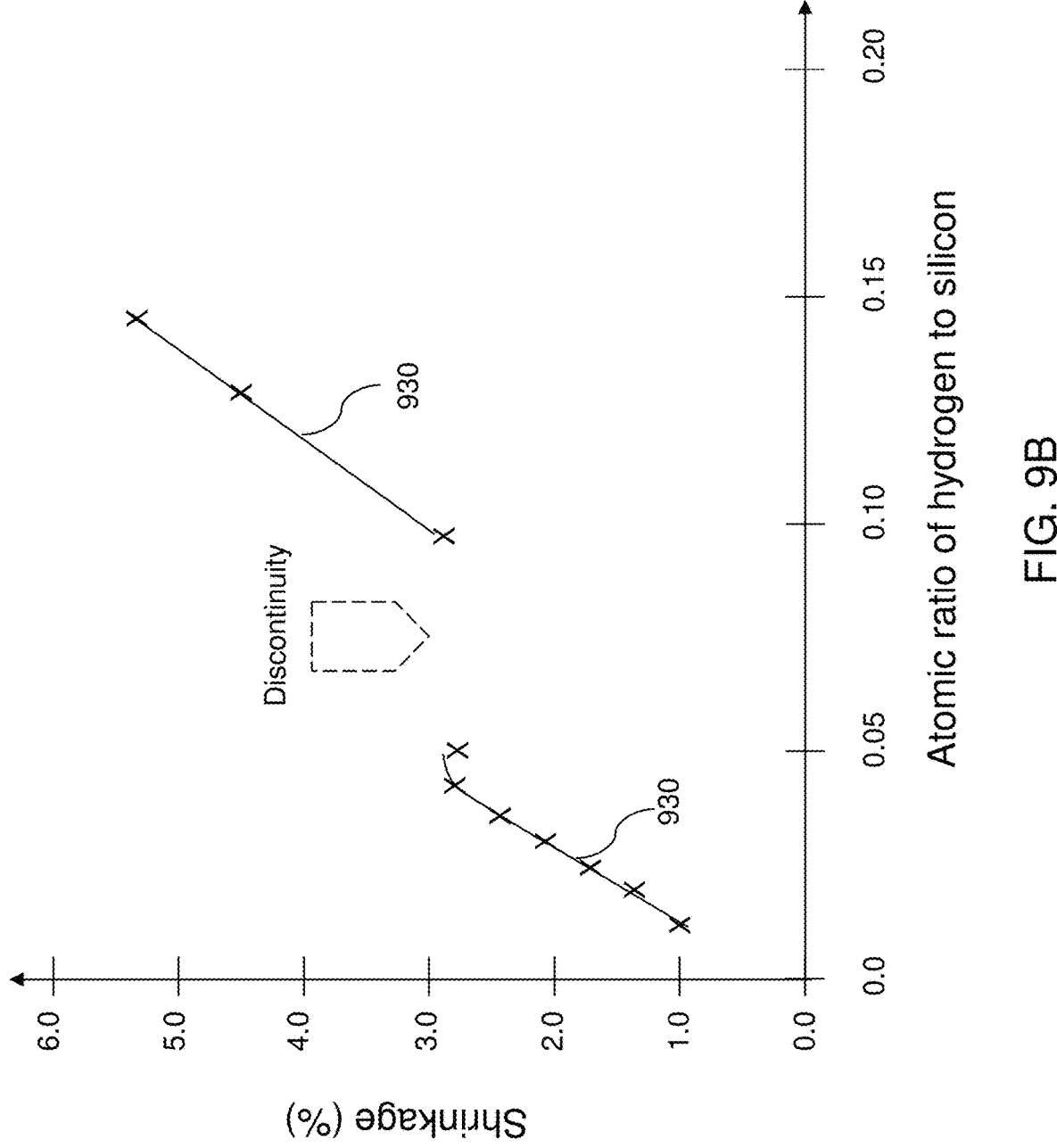
FIG. 9B is a graph illustrating the dependence of percentage shrinkage of hydrogen-containing silicon nitride materials as a function of an atomic ration of hydrogen to silicon.

FIG. 9B is a graph illustrating the dependence of percentage shrinkage of hydrogen-containing silicon nitride materials after an anneal process in a nitrogen-containing ambient as a function of an atomic ration of hydrogen to silicon. A third curve 930 is fitted to the data points. A discontinuity in the shrinkage may occur in the range of the atomic ratio of hydrogen to silicon from 0.05 to 0.10. The discontinuity in the third curve 930 is believed to correspond to generation of cracks in the annealed silicon nitride material. While an embodiment is described in which the sacrificial material layers comprise hydrogen-containing silicon nitride materials, in other embodiments, other sacrificial material layers that comprise compressive stress materials which provide a thermal contraction may be used instead.

Figure 10A:
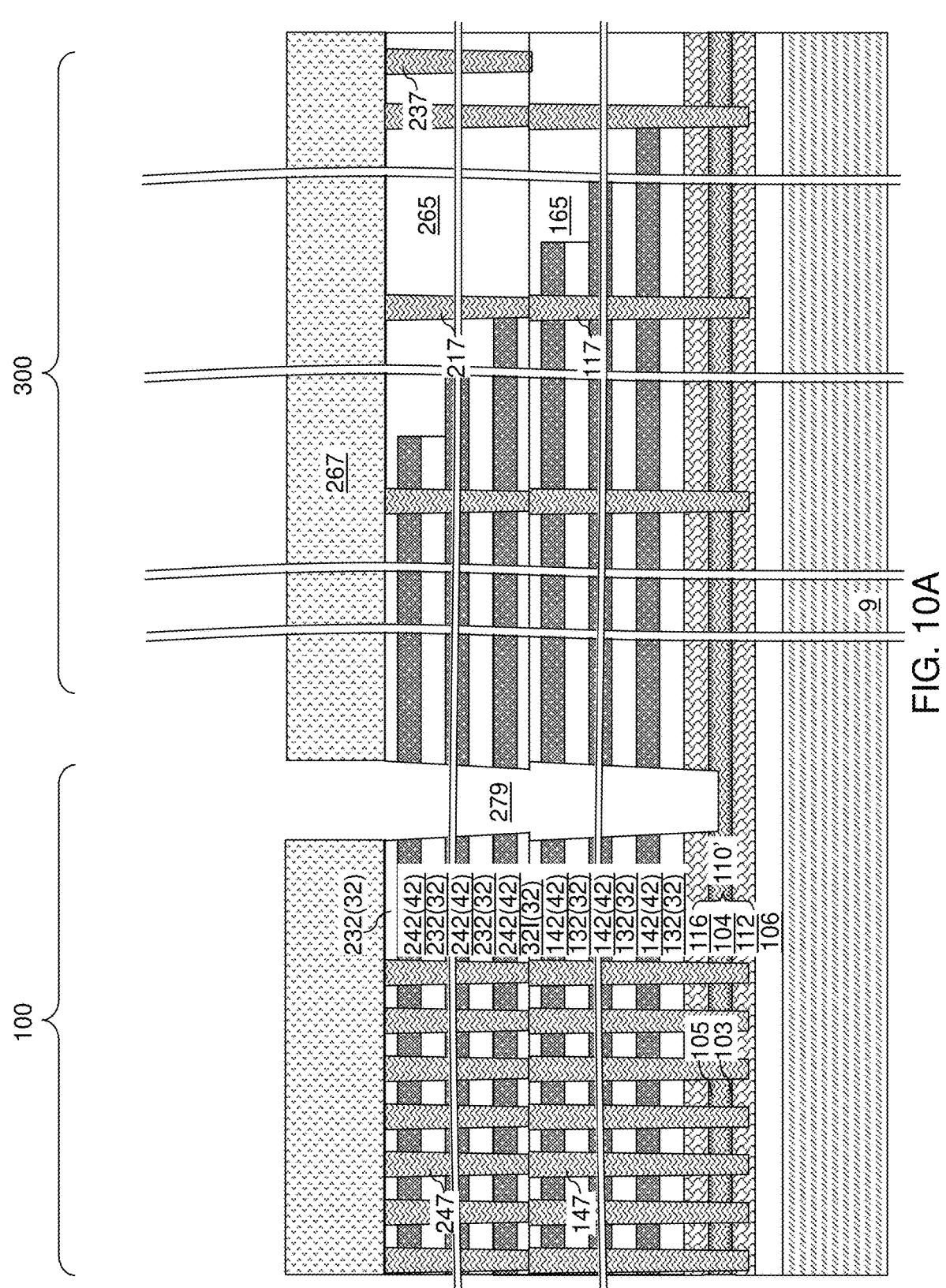
FIG. 10A is a schematic vertical cross-sectional view of the exemplary after formation of second-tier lateral isolation trenches according to an embodiment of the present disclosure.
Figure 10B:
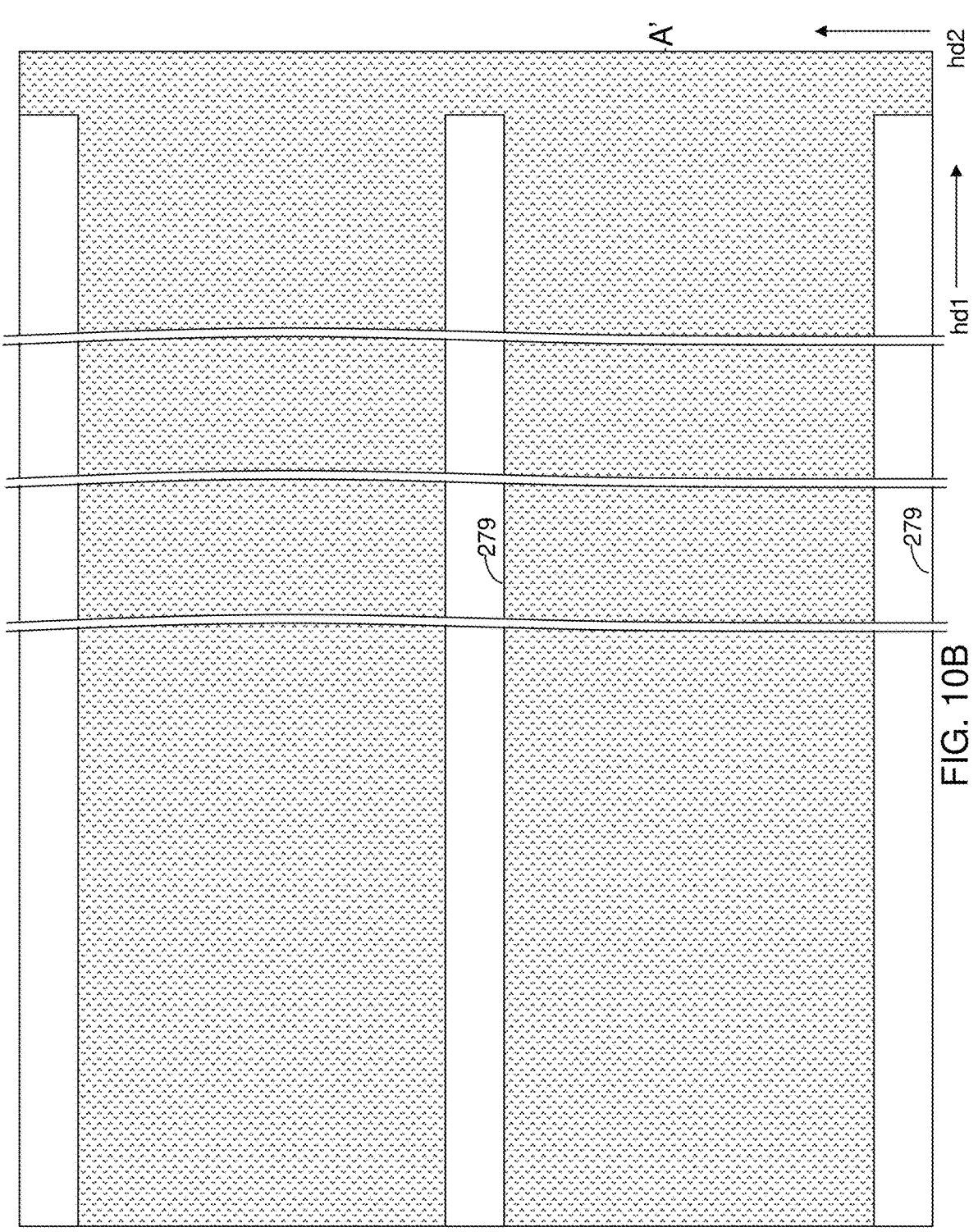
FIG. 10B is a top-down view of the exemplary structure of FIG. 10A. The vertical plane A-A' is the cut plane of the vertical cross-sectional view of FIG. 10A.

Referring to FIGS. 10A and 10B, a photoresist layer 267 can be applied over the exemplary structure, and can be lithographically patterned to form elongated opening over the second-tier laterally-extending cracks 277. In one embodiment, the areas of the elongated openings in the photoresist layer 267 can be greater than the areas of the second-tier laterally-extending cracks 277. In some embodiments, the areas of the elongated opening in the photoresist layer 267 may be the same as, or may be substantially the same as, the areas of the first-tier lateral isolation trenches 179.

An anisotropic etch process can be performed to etch unmasked portions of the second alternating stack (232, 242). According to an aspect of the present disclosure, all layers of the second alternating stack (232, 242) have sidewalls that are exposed to the second-tier laterally-extending cracks 277. Thus, each second-tier laterally-extending crack 277 can be expanded in volume to form a second-tier lateral isolation trench 279. Due to the exposure of each physically exposed sidewall of the second alternating stack (232, 242) to the etchant ion throughout the anisotropic etch process, the duration of the anisotropic etch time can be significantly shorter than a conventional etch process that etches each layer of the second alternating stack (232, 242) from top to bottom.

The materials of the second alternating stack (232, 242) that are deposited in the first-tier lateral isolation trenches 179 are removed by the anisotropic etch process. The anisotropic etch process expands the laterally-extending cracks 277, and converts the laterally-extending cracks 277 into second-tier lateral isolation trenches 279 that are adjoined to a respective one of the first-tier lateral isolation trenches 179. Each second-tier lateral isolation trench 279 overlies and is adjoined to a respective underlying first-tier lateral isolation trench 179. The second-tier structure includes patterned portions of the second alternating stack (232, 242) as formed at the processing steps of FIG. 6 and the second-tier lateral isolation trenches 279. The photoresist layer 267 can be subsequently removed, for example, by ashing.

Figure 11A:
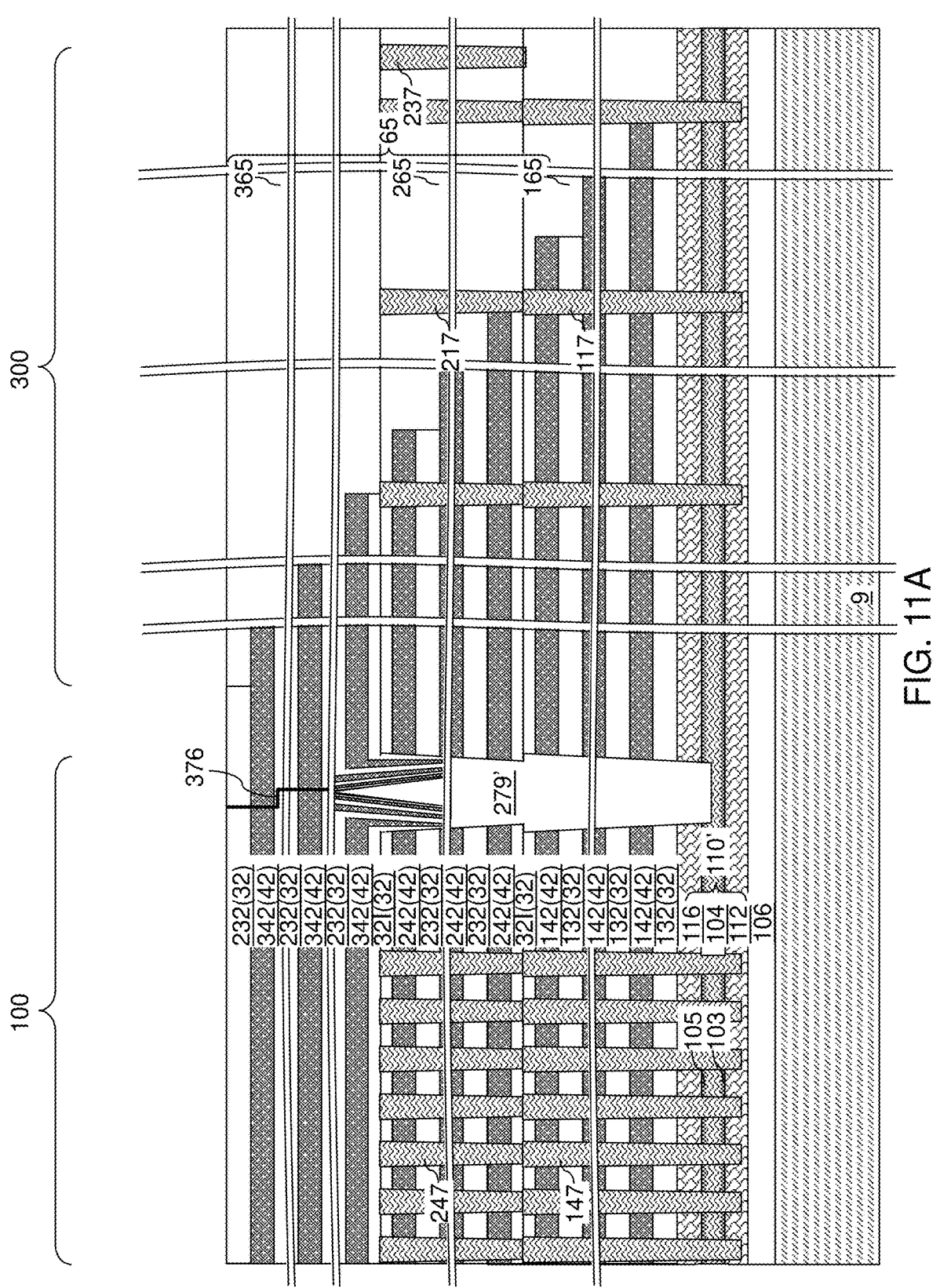
FIGS. 11A and 11B are schematic vertical cross-sectional views of the exemplary structures after formation of a third alternating stack of third insulating layers and third sacrificial material layers according to alternative embodiment of the present disclosure.

Referring to FIG. 11A, a third alternating stack (332, 342) of third insulating layers 332 and third sacrificial material layers 342 can be formed over the second-tier structure. In one embodiment, the third insulating layers 332 may comprise silicon oxide layers, and the third sacrificial material layers 342 may comprise silicon nitride layers. The third alternating stack (332, 342) may comprise multiple repetitions of a unit layer stack including a third insulating layer 332 and a third sacrificial material layer 342. The total number of repetitions of the unit layer stack within the third alternating stack (332, 342) may be, for example, in a range from 8 to 1,024, such as from 32 to 256, although lesser and greater number of repetitions may also be employed. The third insulating layers 332 comprise a third subset of the insulating layers 32 to be employed in the exemplary structure, and the third sacrificial material layers 342 comprise a third subset of the sacrificial material layers 42 to be employed in the exemplary structure.

The third alternating stack (332, 342) comprises a plurality of material layers that are formed over the second-tier structure employing non-conformal deposition methods. Specifically, each of the third insulating layers 332 and the third sacrificial material layers 342 may be deposited by a respective non-conformal deposition process such as a plasma-enhanced chemical vapor deposition process. A first subset of material layers (332, 342) can be formed with a respective downward-protruding portion that is deposited in peripheral portions of the second-tier lateral isolation trenches 279 with a variable lateral width that decreases with a downward distance from a horizontal plane including the topmost surface of the second-tier structure. Second-tier cavities 279' are formed in volumes of the second-tier lateral isolation trenches 279 that are not filled with the materials of the third alternating stack (332, 342). A topmost layer of the first subset of material layers (332, 342) covers the top of each of the second-tier lateral isolation trenches 279.

A second subset of material layers (332, 342) within the second alternating stack (332, 342) overlies the first subset of material layers (332, 342). Each material layer (i.e., each third insulating layer 332 and each third sacrificial material layer 342) within the second subset of material layers does not include any downward-protruding portion that protrudes into any second-tier lateral isolation trenches 279. However, in one embodiment, a non-uniformity 376 may be located in the second subset of material layers (332, 342) above the second-tier lateral isolation trenches 279. The non-uniformity 376 may comprise a recess (i.e., dent), a structurally weak region, or a microcrack which may extend through the second subset of material layers (332, 342) above second-tier lateral isolation trenches 279. If the microcrack which extends through the second subset of material layers (332, 342) is not formed, then each material layer (i.e., each third insulating layer 332 and each sacrificial material layer 342) within the second subset of material layers is not exposed to any second-tier lateral isolation trenches 279. In one embodiment, the total thickness of the plurality of material layers (332, 342), i.e., the third alternating stack (332, 342), above a topmost horizontal surface of the second-tier structure may be at least 10 times the maximum lateral width of a second-tier lateral isolation trenches 279.

According to an embodiment of the present disclosure, the third insulating layers 332 comprise silicon oxide layers, and the third sacrificial material layers 342 comprise hydrogen-containing silicon nitride layers. In one embodiment, the atomic ratio of hydrogen atoms to silicon atoms in the hydrogen-containing silicon nitride layers as deposited may be in a range from 0.05 to 0.20, such as from 0.07 to 0.15. In other words, there may be at least 5 hydrogen atoms, such as 5 to 20 hydrogen atoms, for every 100 silicon atoms. Generally, an atomic ratio of hydrogen atoms silicon atoms greater than 0.05 in the hydrogen-containing silicon nitride layers may be provided by increasing the ratio of the ammonia flow rate to nitrogen flow rate during the plasma enhanced chemical vapor deposition of the hydrogen-containing silicon nitride layers. The atomic ratio of nitrogen atoms to silicon atoms in the hydrogen-containing silicon nitride layers of the third sacrificial material layers 342 may be (4-e): 3, in which e is in a range from 0 to 0.30.

Third stepped surfaces can be formed in the contact region 300 by pattering the third alternating stack (332, 342). A third stepped dielectric material portion 365 can be formed over the second stepped surfaces. The combination of the first stepped dielectric material portion 165, the second stepped dielectric material portion 265, and the third stepped dielectric material portion 365 may be referred to as a stepped dielectric material portion 65.

Figure 11B:
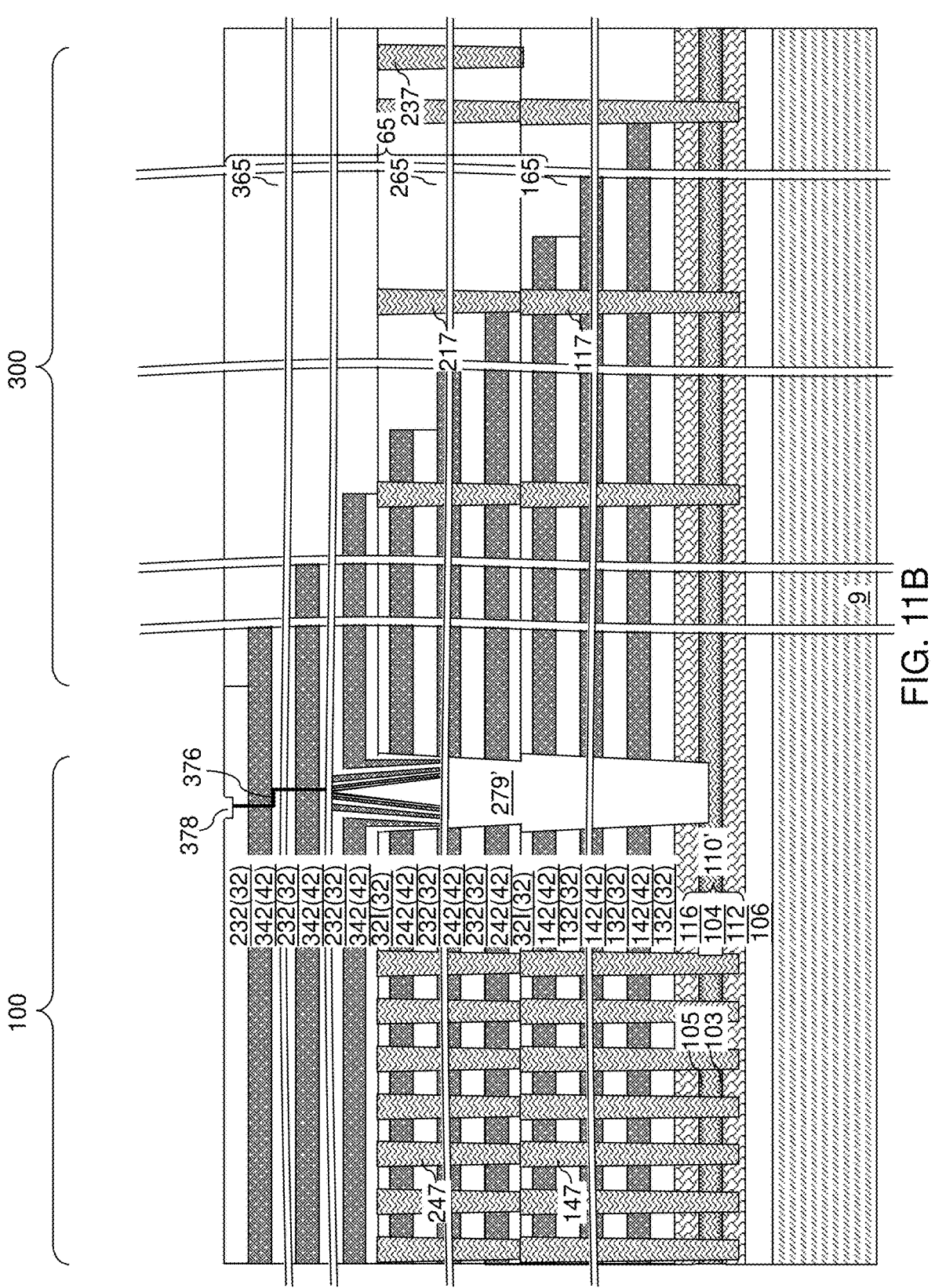

Referring to FIG. 11B, in an alternative embodiment, an optional second wedge (i.e., shallow trench) 378 may be formed at the top of the third alternating stack (332, 342) by photolithography and etching. The second wedge 378 may extend through one or more topmost layers of the third alternating stack (332, 342). The second wedge 278 may be present over the second non-uniformity 376. If the second non-uniformity is omitted, then the second wedge 278 may be present over the cavity 279'.

Figure 12A:
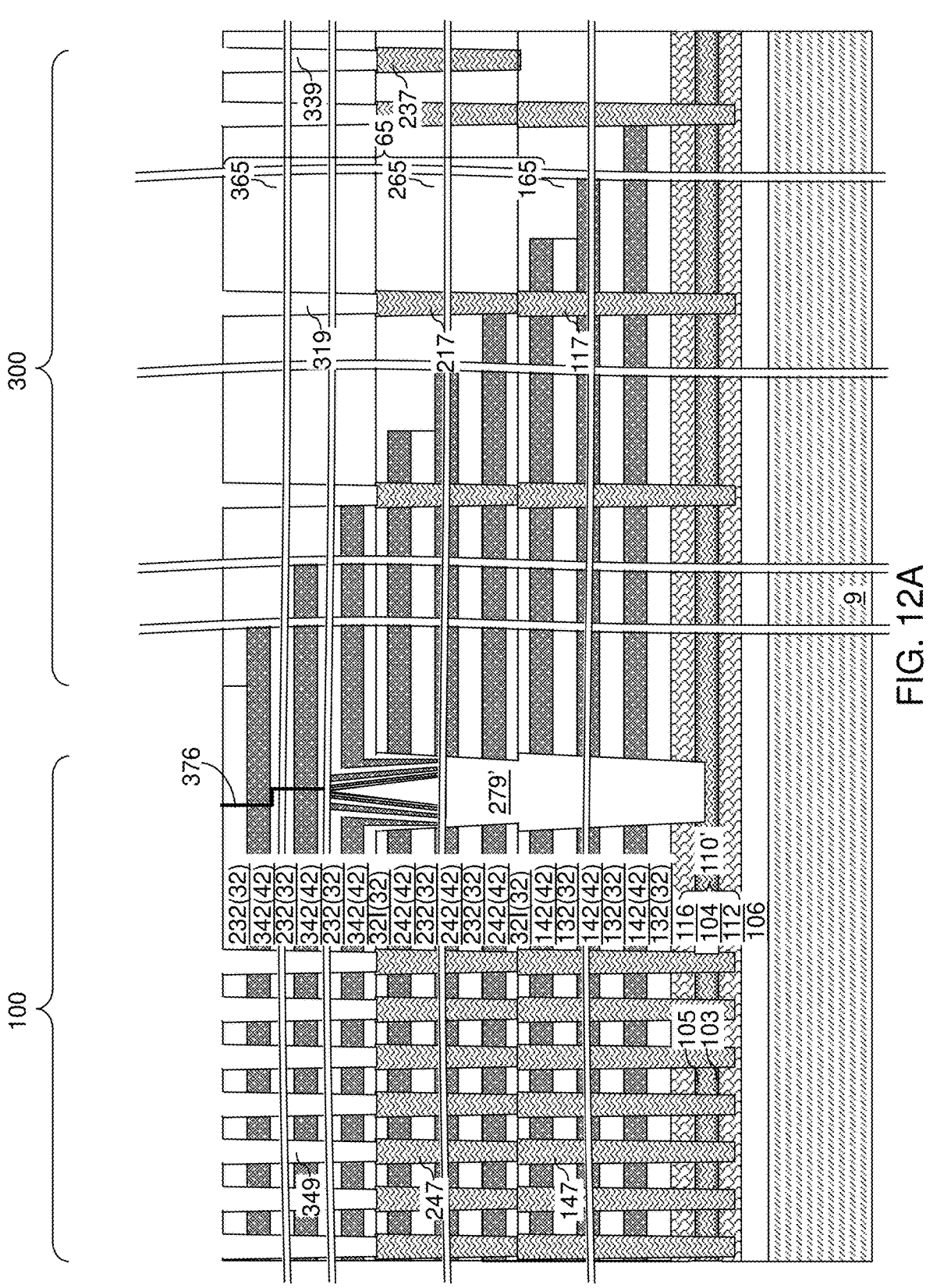
FIG. 12A is a schematic vertical cross-sectional view of the exemplary structure after formation of third-tier memory openings and third-tier support openings according to an embodiment of the present disclosure.
Figure 12B:
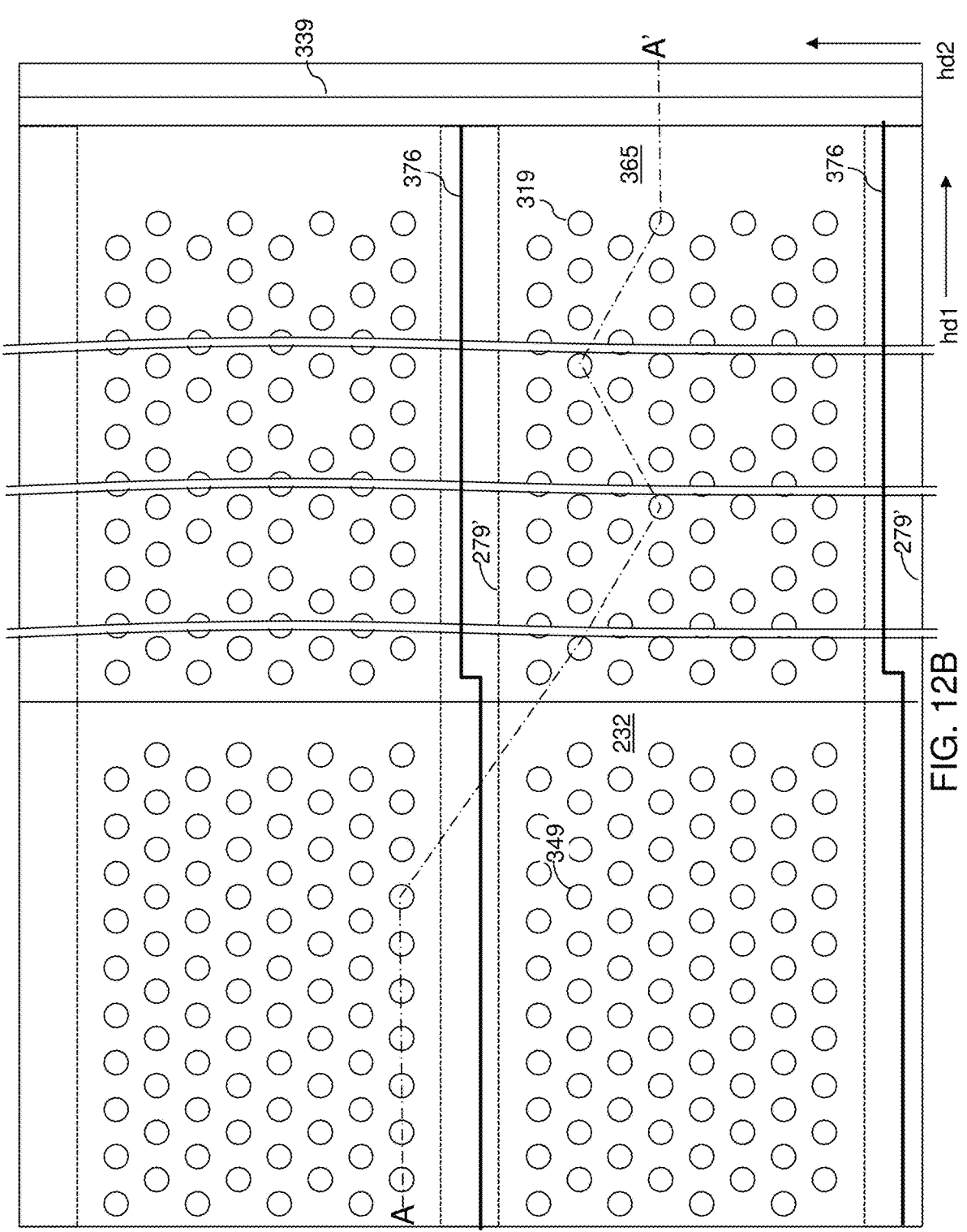
FIG. 12B is a top-down view of the exemplary structure of FIG. 12A. The vertical plane A-A' is the cut plane of the vertical cross-sectional view of FIG. 12A.

Referring to FIGS. 12A and 12B, a third etch mask layer (such as a patterned photoresist layer) can be formed over the topmost third insulating layer 332, and can be lithographically patterned to form various openings therein. A third anisotropic etch process can be performed to transfer the pattern of the openings in the third etch mask layer through the third alternating stack (332, 342) and the third stepped dielectric material portion 365. Various openings can be formed through the third alternating stack (332, 342) and the third stepped dielectric material portion 365. The various openings may comprise third-tier memory openings 349 that are formed in the memory array region 200 and third-tier support openings 319 that are formed in the contact region 300. Optional second crack-stop trenches 339 are formed in the contact region 300. The second crack-stop trenches 339 may be elongated along the third horizontal direction hd2.

Each of the third-tier memory openings 349, the third-tier support openings 319, and the second crack-stop trenches 339 can vertically extend through the third alternating stack (332, 342). Each third-tier memory opening 349 may be formed on a respective one of the second-tier sacrificial memory openings fill structures 247, and each third-tier support opening 319 may be formed on a respective one of the second-tier sacrificial support opening fill structures 217.

The second crack-stop trenches 339 can be formed in an area having an areal overlap with the first crack-stop structures 237. The area of each second crack-stop trench 339 may optionally have an areal overlap with end portions of the second-tier lateral isolation trenches 279 in a plan view. In one embodiment, the areas of the second-tier lateral isolation trenches 279 do not extend along the second horizontal direction hd1 beyond the areas of the second crack-stop trenches 339. In one embodiment, areas of a plurality of second-tier lateral isolation trenches 279 may be located between a pair of second crack-stop trenches 339. Thus, a pair of crack-stop trenches 339 may be formed around an area of one of the second-tier lateral isolation trenches 279 through the third-tier structure. In one embodiment, the area of each of the set of second-tier lateral isolation trenches 279 is located between, and does not have an areal overall in a plan view with, areas of the pair of crack-stop trenches 339. The third etch mask layer may be subsequently removed.

Figure 13:
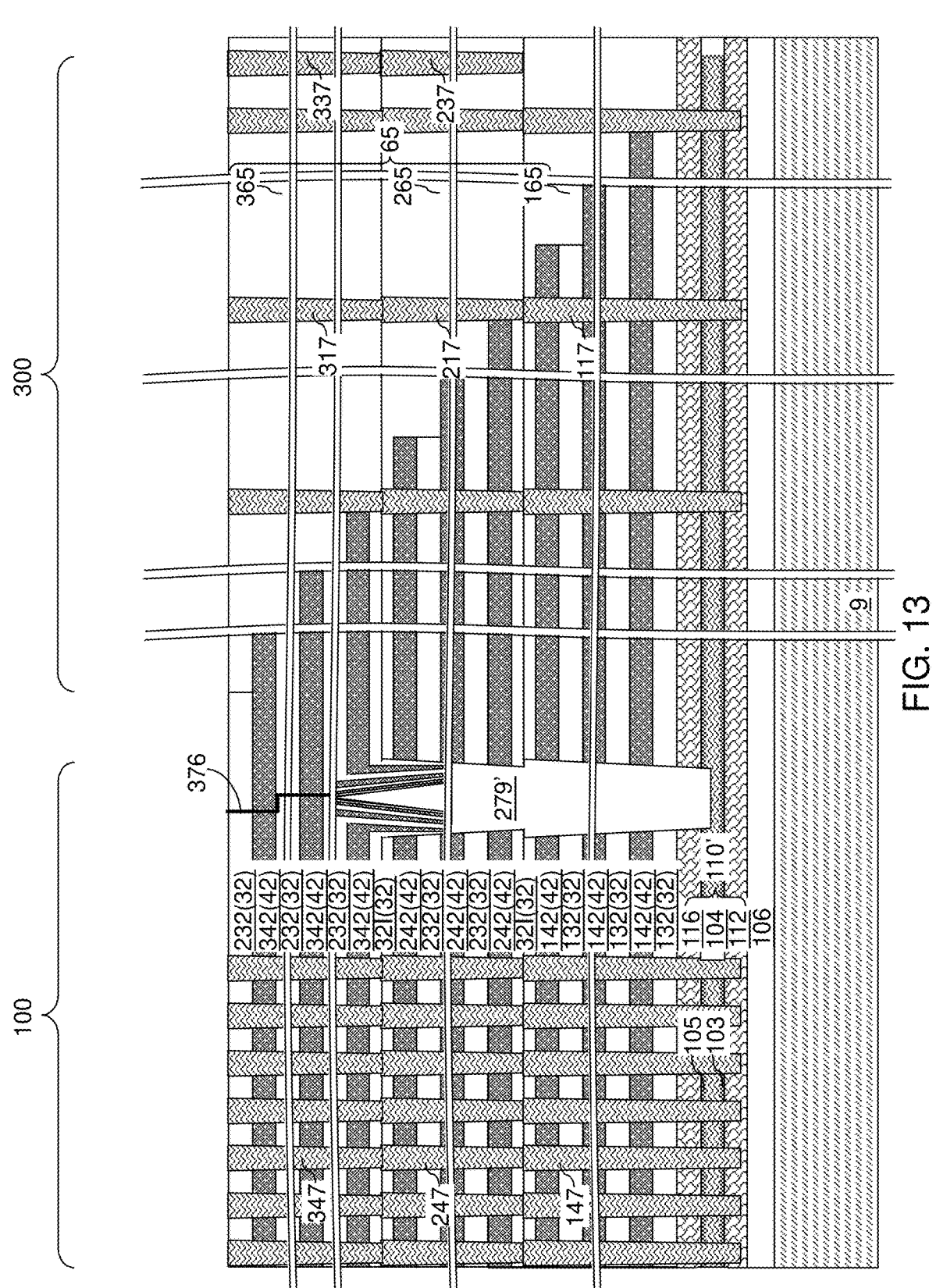
FIG. 13 is a schematic vertical cross-sectional view of the exemplary structure after formation of third-tier sacrificial memory opening fill structures and third-tier sacrificial support opening fill structures according to an embodiment of the present disclosure.

Referring to FIG. 13, an optional etch stop liner (not shown) and a third sacrificial fill material can be deposited in the third-tier memory openings, the third-tier support openings, and the second crack-stop trenches (if present). The optional etch stop liner (if present) comprises a thin silicon oxide layer having a thickness in a range from 3 nm to 6 nm. The third sacrificial fill material may comprise a carbon-based material, such as amorphous carbon or diamond-like carbon, or a semiconductor material, such as amorphous silicon.

A recess etch process can be performed to remove portions of the third sacrificial fill material from above the horizontal plane including the top surface of the topmost third insulating layer 332. Remaining portions of the third sacrificial fill material that fill the third-tier memory openings and the third-tier support openings constitute third-tier sacrificial opening fill structures (347, 317). The third-tier sacrificial opening fill structures (347, 317) comprise third-tier sacrificial memory opening fill structures 347 that are formed in the third-tier memory openings, and third-tier sacrificial support opening fill structures 317 that are formed in the third-tier support openings. Remaining portions of the third sacrificial fill material that fills the crack-stop trenches 339 constitute second crack-stop structures 337. In one embodiment, the third sacrificial fill material comprises a material having Young's modulus that is less than Young's modulus of the third sacrificial material layers 342.

Figure 14A:
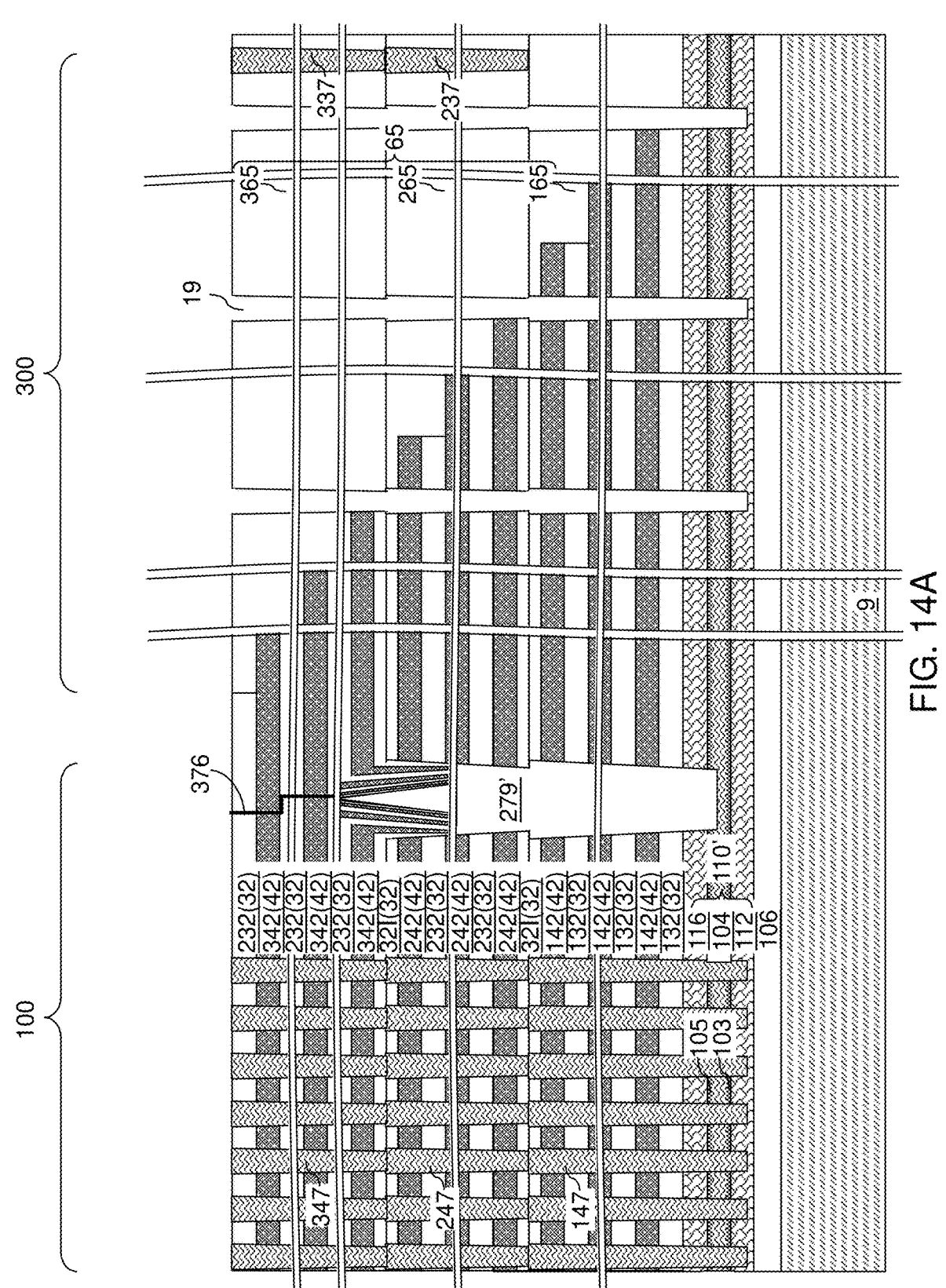
FIGS. 14A and 14B are schematic vertical cross-sectional views of the exemplary structures after formation of inter-tier support openings according to alternative embodiments of the present disclosure.

Referring to FIG. 14A, a patterned mask layer (not shown) can be applied over the third-tier structure. The patterned mask layer covers the third-tier sacrificial memory opening fill structures 347 and the second crack-stop structures 337 without covering the third-tier sacrificial support opening fill structures 317. In one embodiment, the patterned mask layer may comprise a patterned hardmask layer comprising a hardmask material, such as silicon oxide, silicon nitride, a dielectric metal oxide, or a metallic material. The sacrificial support opening fill structures (317, 217, 117) can be removed selective to the materials of the alternating stacks {(132, 142), (232, 242), (332, 342)} and the stepped dielectric material portions (165, 265, 365) by performing a selective removal process, which may comprise an ashing process or an isotropic etch process. Inter-tier support openings 19, which are also referred to as support openings 19, are formed in volumes from which the materials of the sacrificial support opening fill structures (317, 217, 117) are removed.

Figure 14B:
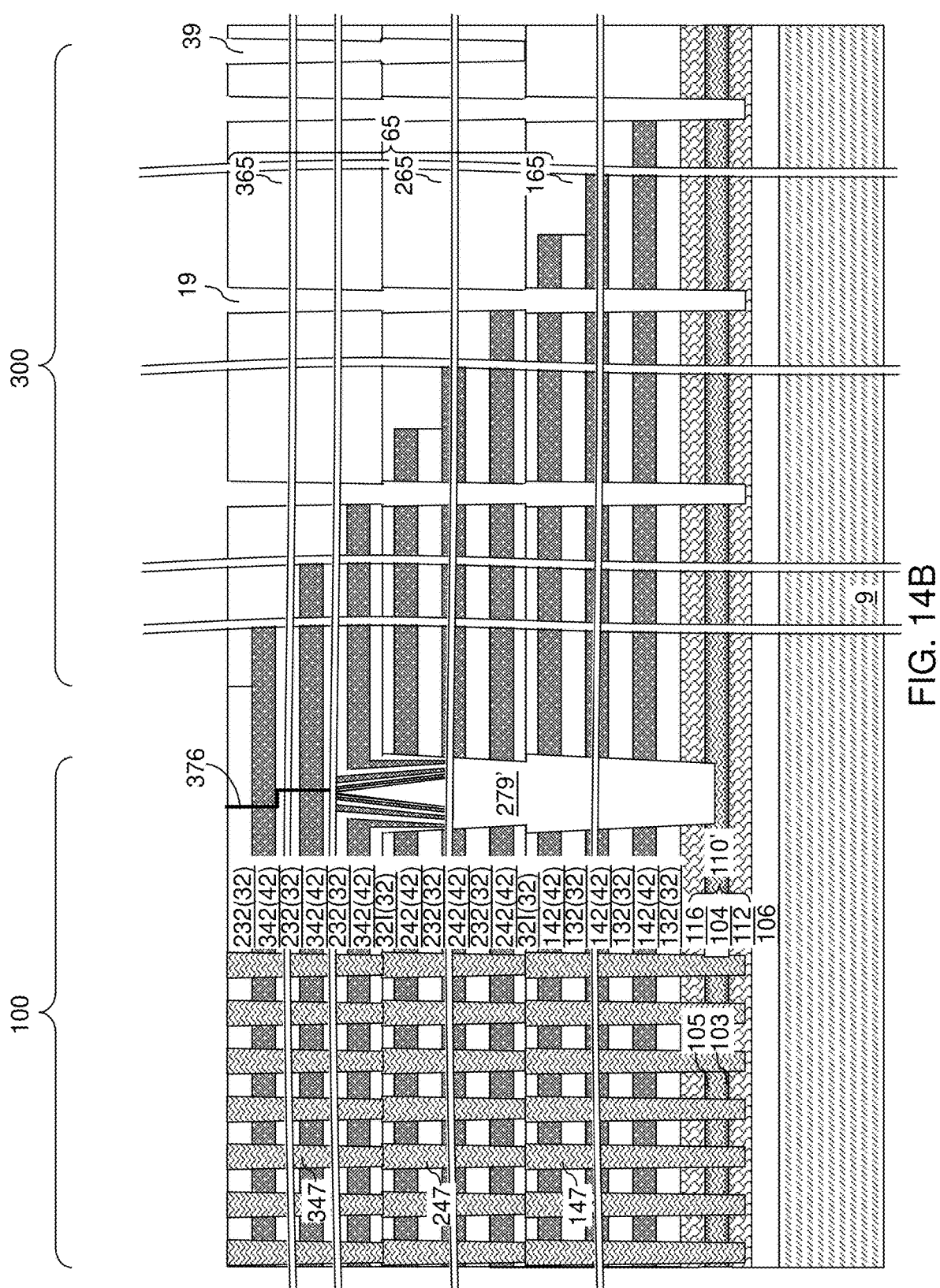

Referring to FIG. 14B, in an alternative embodiment, the patterned mask layer covers the third-tier sacrificial memory opening fill structures 347 without covering the third-tier sacrificial support opening fill structures 317 and the second crack-stop structures 337. The sacrificial support opening fill structures (317, 217, 117) and the crack-stop structures (237, 337) can be removed selective to the materials of the alternating stacks {(132, 142), (232, 242), (332, 342)} and the stepped dielectric material portions (165, 265, 365) by performing a selective removal process, which may comprise an ashing process or an isotropic etch process. Inter-tier support openings 19, which are also referred to as support openings 19, are formed in volumes from which the materials of the sacrificial support opening fill structures (317, 217, 117) are removed. Inter-tier crack-stop trenches (also referred to as crack-stop trenches) 39 are formed in volumes from which the crack-stop structures (237, 337) are removed.

Figure 15A:
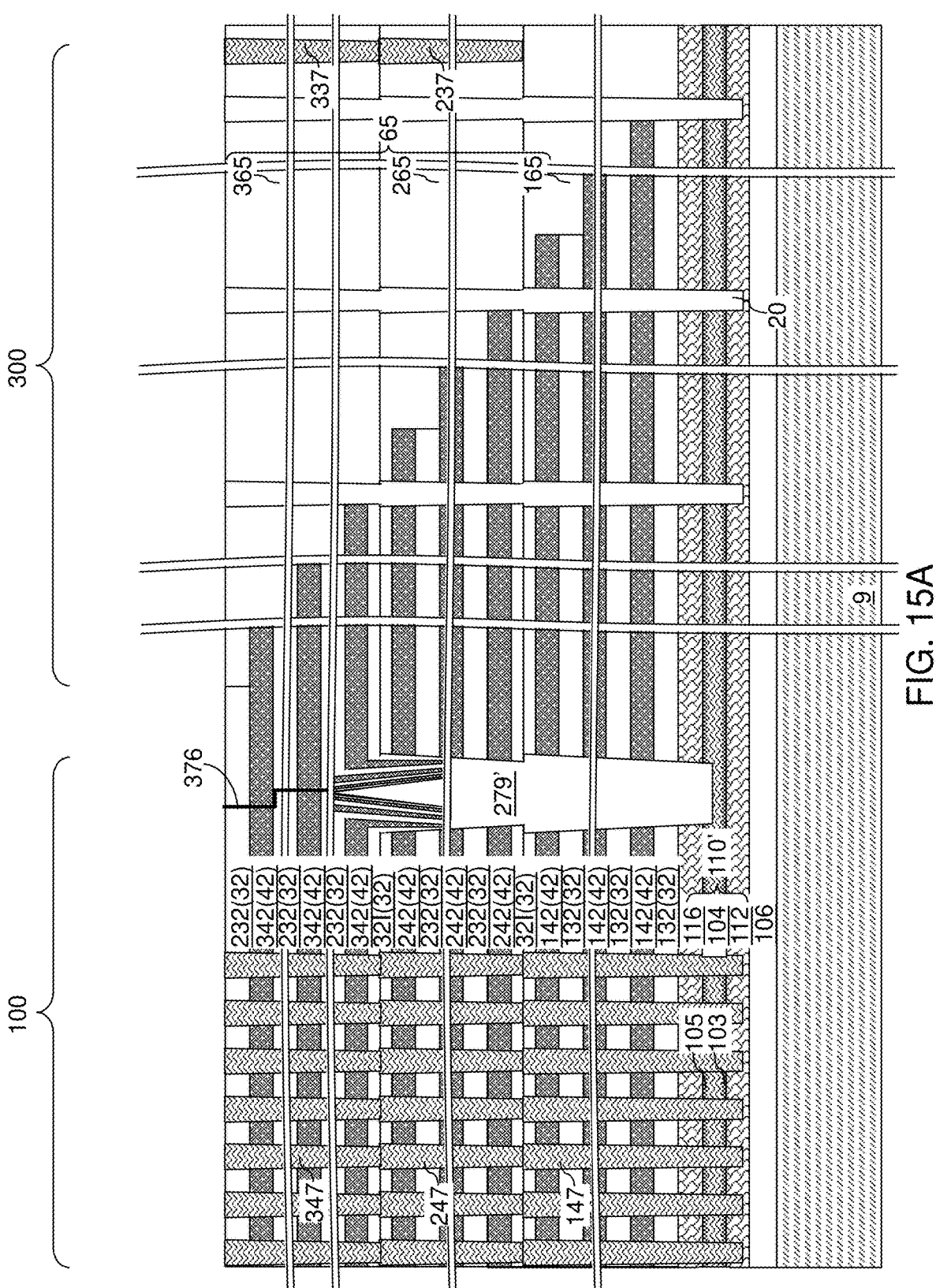
FIGS. 15A and 15B are schematic vertical cross-sectional views of the exemplary structures after formation of support pillar structures according to alternative embodiments of the present disclosure.

Referring to FIG. 15A, a dielectric fill material, such as silicon oxide, can be deposited in the cavities in the support openings 19 shown in FIG. 14A by a conformal deposition process. Excess portions of the dielectric fill material can be removed from above the top surface of the third-tier structure, for example, by a recess etch process. Each portion of the dielectric fill material that fills a respective support opening 19 constitutes a support pillar structure 20, which can be employed to provide structural support to the insulating layers (132, 232, 332) and the stepped dielectric material portions (165, 265, 365) during subsequent replacement of the sacrificial material layers (142, 242, 342) with electrically conductive layers.

Figure 15B:
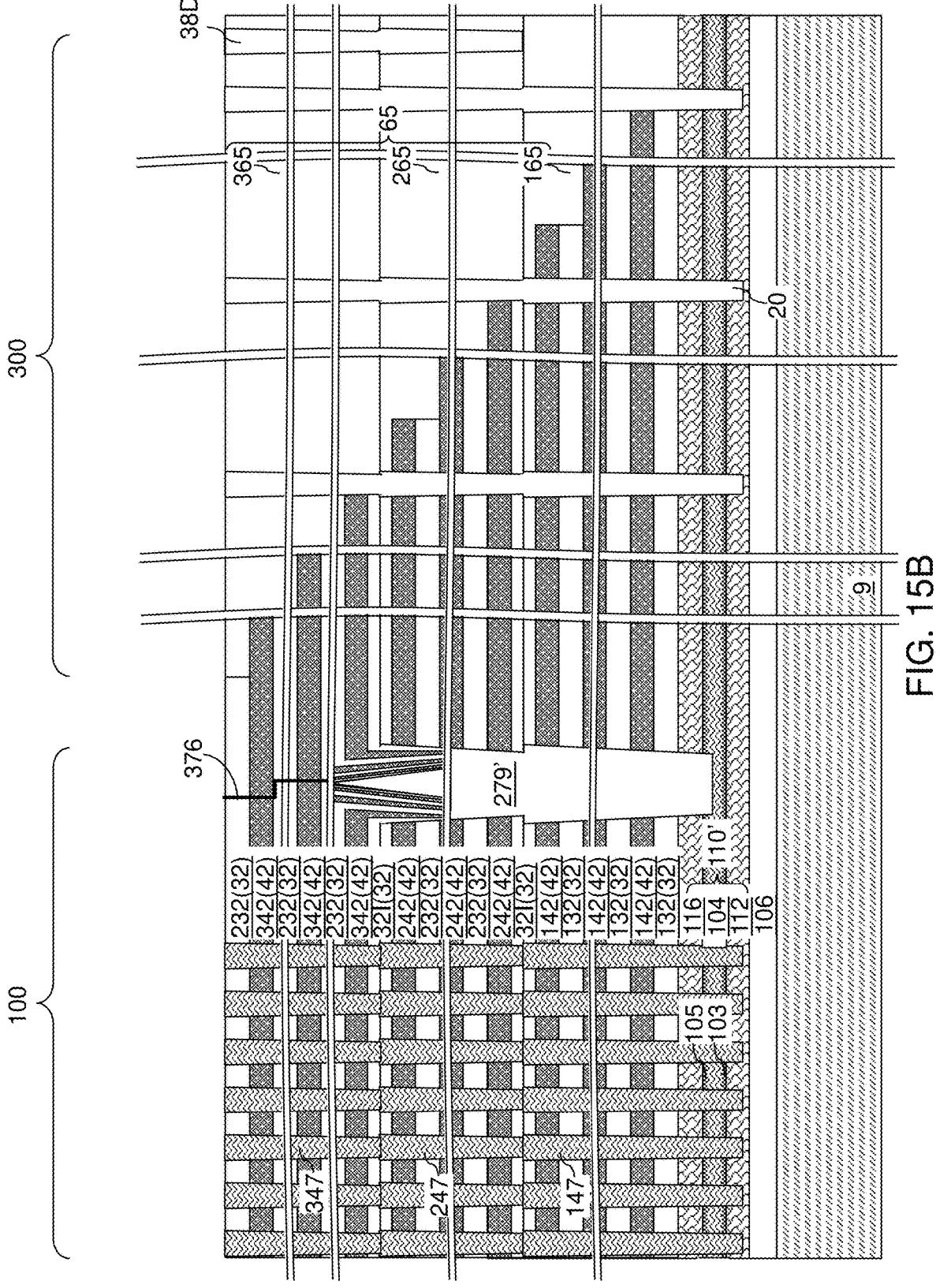

Referring to FIG. 15B, in the alternative embodiment, the dielectric fill material, such as silicon oxide, can be deposited in the cavities in the support openings 19 and in the inter-tier crack-stop trenches 39 shown in FIG. 14B by a conformal deposition process. Each portion of the dielectric fill material that fills a respective support opening 19 constitutes a support pillar structure 20. Each portion of the dielectric fill material that fills a respective crack-stop trench 39 constitutes a respective dielectric crack-stop structure 38D.

Figure 16:
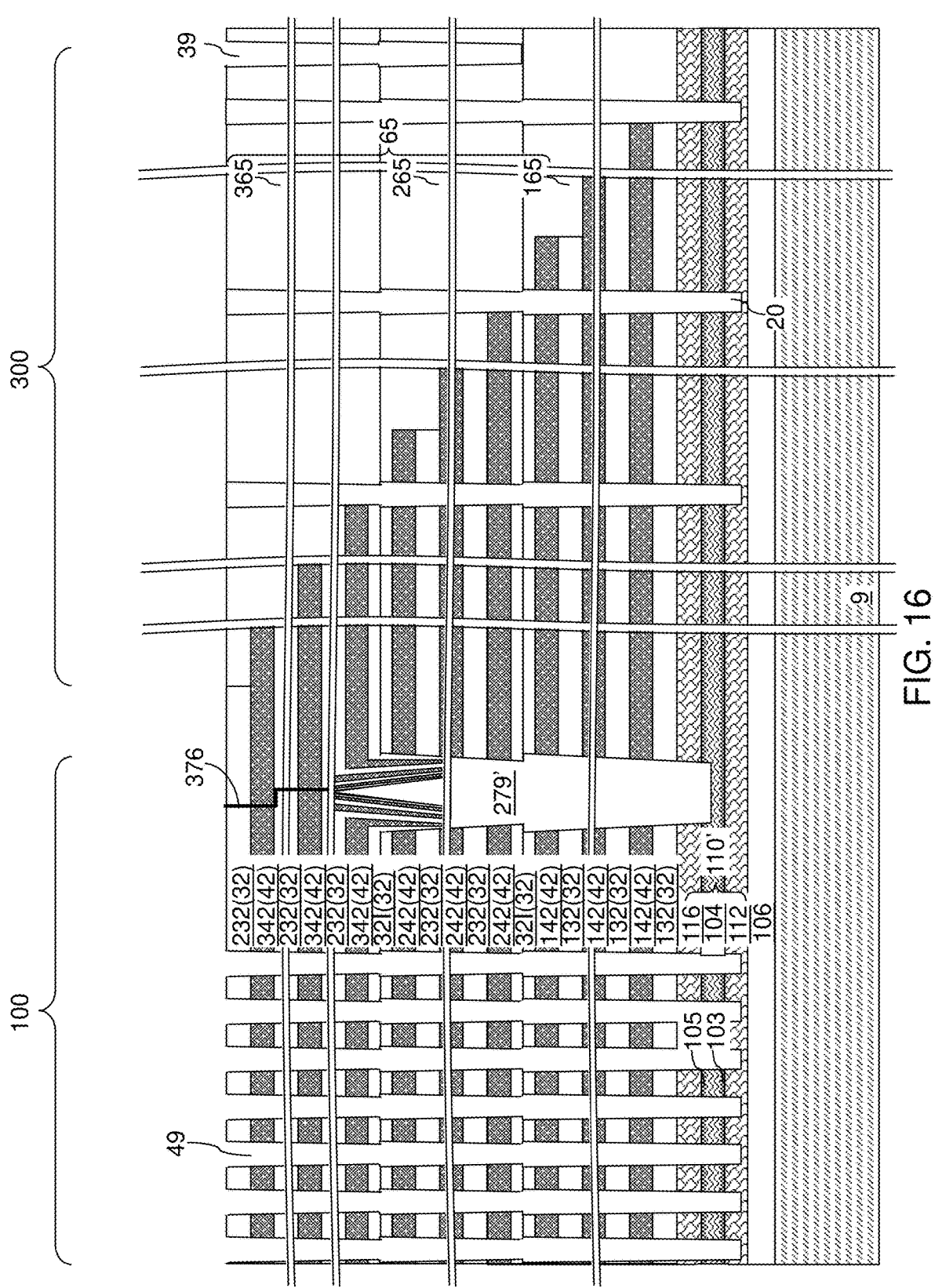
FIG. 16 is a schematic vertical cross-sectional view of the exemplary structure after formation of inter-tier memory openings and inter-tier crack-stop openings according to an embodiment of the present disclosure.
Figures 17A, 17B:
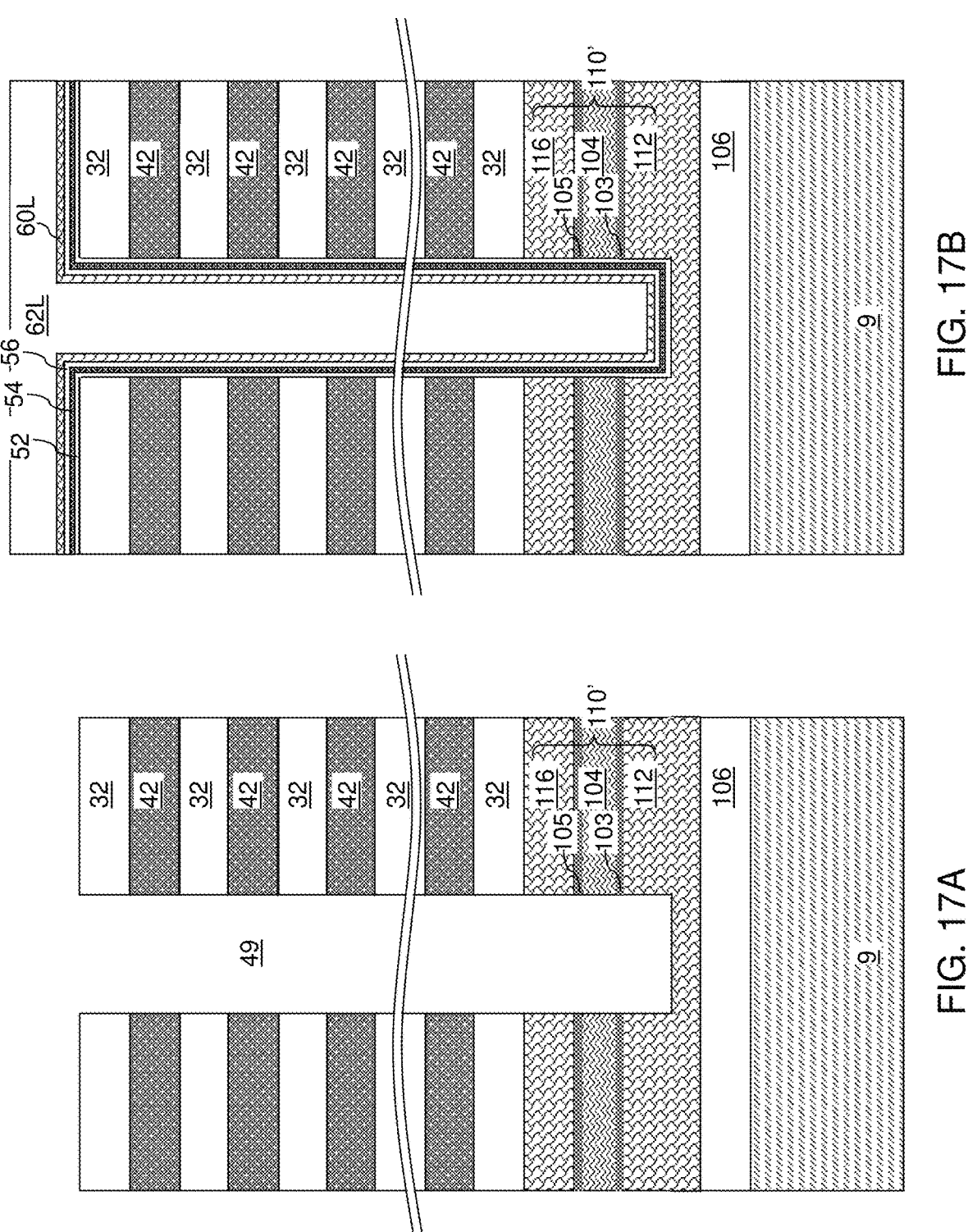
FIGS. 17A-17D are sequential vertical cross-sectional views of an inter-tier memory opening during formation of a memory opening fill structure according to an embodiments of the present disclosure.

Referring to FIGS. 16 and 17A, the sacrificial memory opening fill structures (347, 247, 147) can be removed selective to the materials of the alternating stacks {(132, 142), (232, 242), (332, 342)} and the stepped dielectric material portions (165, 265, 365) by performing a selective removal process, which may comprise an ashing process or an isotropic etch process. Inter-tier memory openings 49, which are also referred to as memory openings 49, are formed in volumes from which the materials of the sacrificial memory opening fill structures (347, 247, 147) are removed. If the crack-stop structures (237, 337) shown in FIGS. 14A and 15A are still present, then the crack-stop trenches 39, are formed in volumes from which the materials of the first crack stop structures 237 and the second crack stop structures 337 are removed.

Referring to FIG. 17B, a layer stack including a memory material layer 54 can be conformally deposited in each memory opening 49 and in each crack-stop trench 39. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferro-electric polarization, or any other measurable physical property. In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0 \times 10^{13}/\text{cm}^3$ to $3.0 \times 10^{17}/\text{cm}^3$, such as $1.0 \times 10^{14}/\text{cm}^3$ to $3.0 \times 10^{16}/\text{cm}^3$, although lesser and greater atomic concentrations may also be employed. A dielectric core layer 62L comprising a dielectric fill material (e.g., silicon oxide) can be deposited in remaining volumes of the memory openings 49 and over the alternating stack (32, 42).

Generally, a set of conformal material layers can be deposited in the memory openings 49 and in the crack-stop trenches 37. In one embodiment, the set of conformal material layers comprise, in order of deposition, a blocking dielectric layer 52, a memory material layer 54, a dielectric liner 56 (which may comprise a tunneling dielectric layer), a semiconductor channel material layer 60L, and a dielectric core layer 62L.

Figures 17C, 17D:
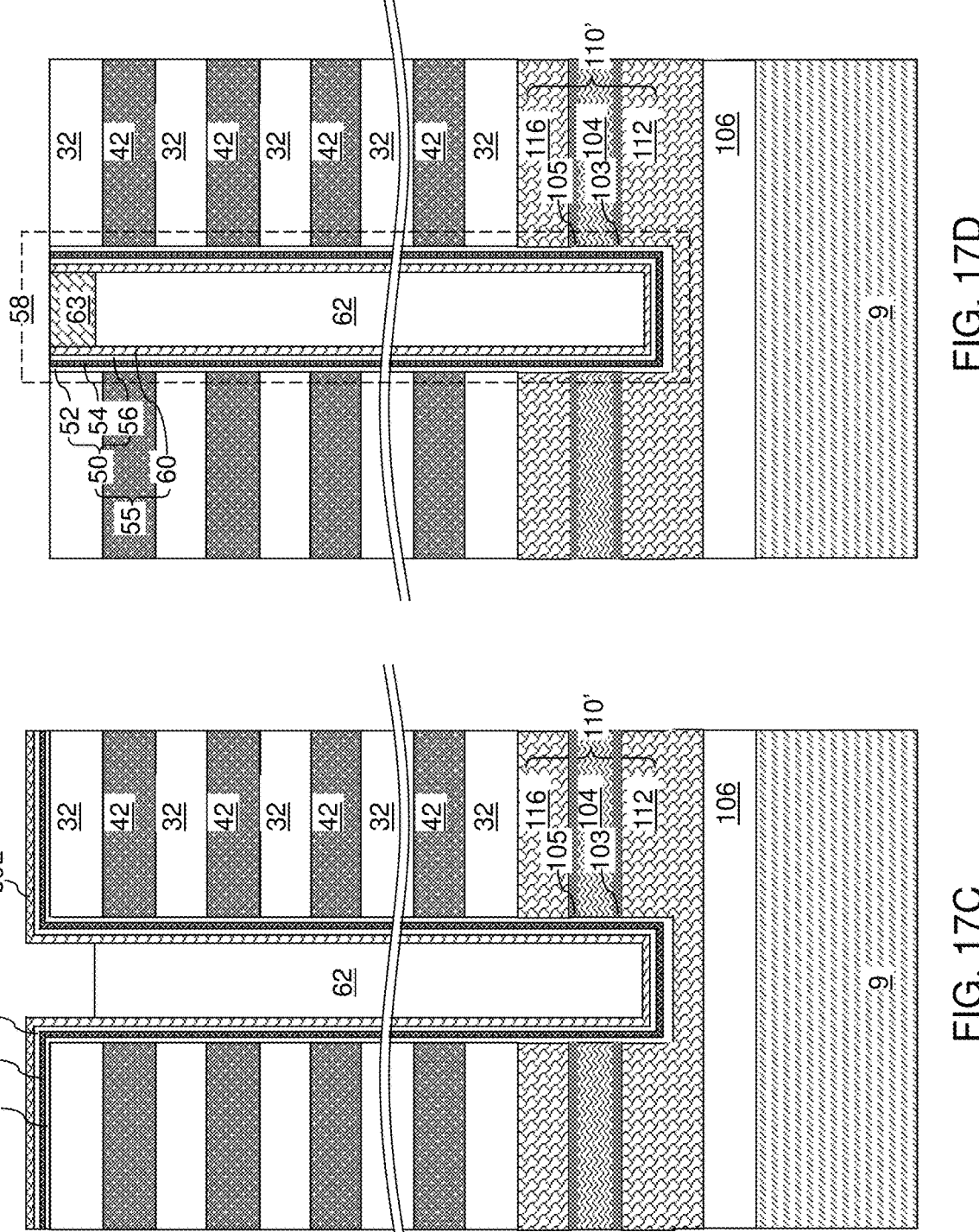

Referring to FIG. 17C, the dielectric core layer 62L can be vertically recessed such that each remaining portion of the dielectric core layer 62L has a top surface at, or about, the horizontal plane including the bottom surface of a topmost insulating layer 32 (such as a topmost third insulating layer 332). Each remaining portion of the dielectric core layer 62L constitutes a dielectric core 62.

Figure 18A:
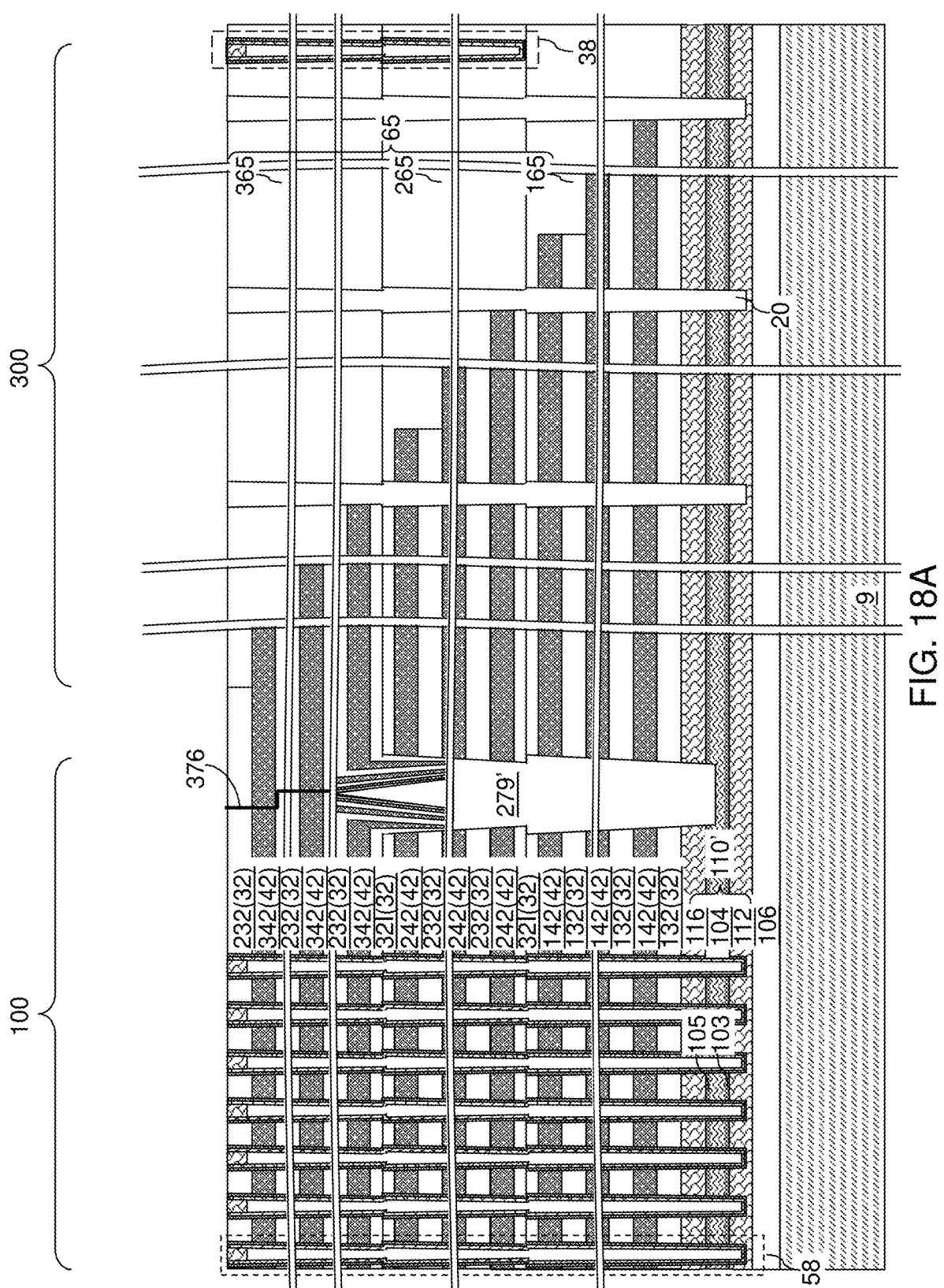
FIG. 18A is a vertical cross-sectional view of the exemplary structure after formation of memory opening fill structures and crack-stop structures according to an embodiment of the present disclosure.
Figure 18B:
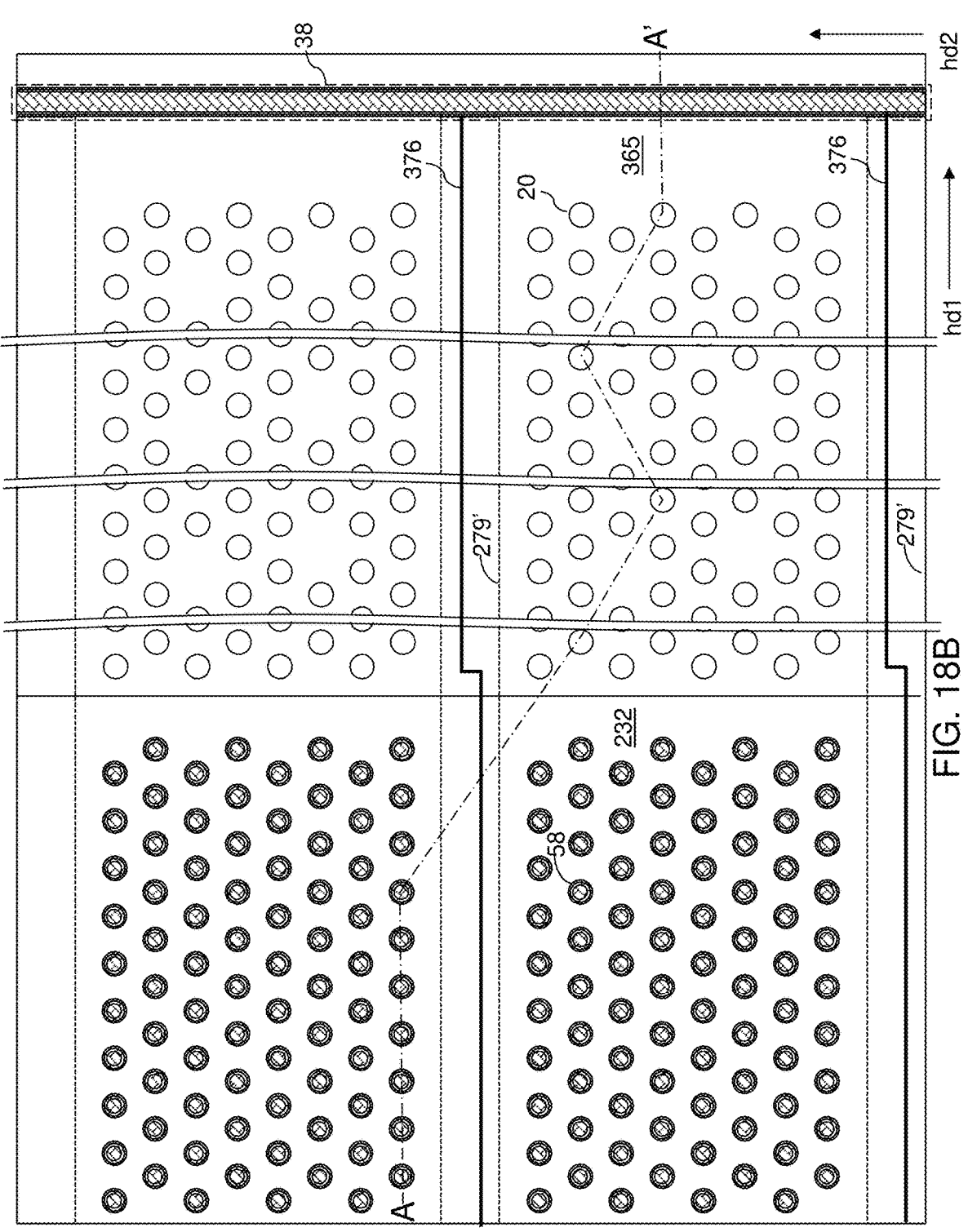
FIG. 18B is a top-down view of the exemplary structure of FIG. 18A. The vertical plane A-A' is the cut plane of the vertical cross-sectional view of FIG. 18A.

Referring to FIGS. 17D, 18A, and 18B, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42.

In one embodiment, each crack-stop trench 39 can be filled with a respective crack-stop structure 38. Each crack-stop structure 38 may comprise a respective set of structural elements having the same material composition as a corresponding structural element in a memory opening fill structure 58. Further, each material layer within a crack-stop structure 38 may have the same thickness as the thickness of a corresponding material layer in a memory opening fill structure 58. The crack-stop structures 38 vertically extend through the second-tier structure and the third-tier structure, and thus, are also referred to as inter-tier crack-stop structures 38. In the alternative embodiment described above, the dielectric crack-stop structures 38D of FIG. 15B are present instead of the crack-stop structures 38 which have the same composition as the memory opening fill structures 58.

In one embodiment, memory openings 49 can be formed through a plurality of material layers (such as the third alternating stack (332, 242) and the second alternating stack (232, 242)) and the first-tier structure. Crack-stop trenches 38 can be formed through the same plurality of material layers. Memory opening fill structures 58 are formed in the memory openings 49. The memory opening fill structures 58 comprise portions of the set of conformal material layers that fill the memory openings 49. Crack-stop structures 38 are formed in the crack-stop trenches 39. The crack-stop structures 38 comprise portions of the set of conformal material layers that fill the crack-stop trenches 39.

In one embodiment, each of the crack-stop structures 38 comprises a layer stack comprising a first dielectric material layer (having a same material composition and a same thickness as a blocking dielectric layer 52 in a memory opening fill structure 58), a memory material layer, a second dielectric material layer (having a same material composition and a same thickness as a dielectric liner 56 in a memory opening fill structure 58), a semiconductor material layer (having a same material composition and a same thickness as a vertical semiconductor channel 60 in a memory opening fill structure 58), and a third dielectric material layer (which is a remaining portion of the dielectric core layer 62L).

In one embodiment, the crack-stop trenches 39 can be formed around areas of the first-tier trenches (such as the first-tier lateral isolation trenches 179) through a plurality of material layers (such as the second alternating stack (232, 242) and the third alternating stack (332, 342)). Areas of the first-tier trenches can be located between, and do not have an areal overall in a plan view with, areas of the crack-stop trenches 39. According to an aspect of the present disclosure, each of the crack-stop structures 38 or the dielectric crack-stop structures 38D may have an average Young's modulus that is less than Young's modulus of the second sacrificial material layers 242, and is less than Young's modulus of the third sacrificial material layers 342.

Figure 19:
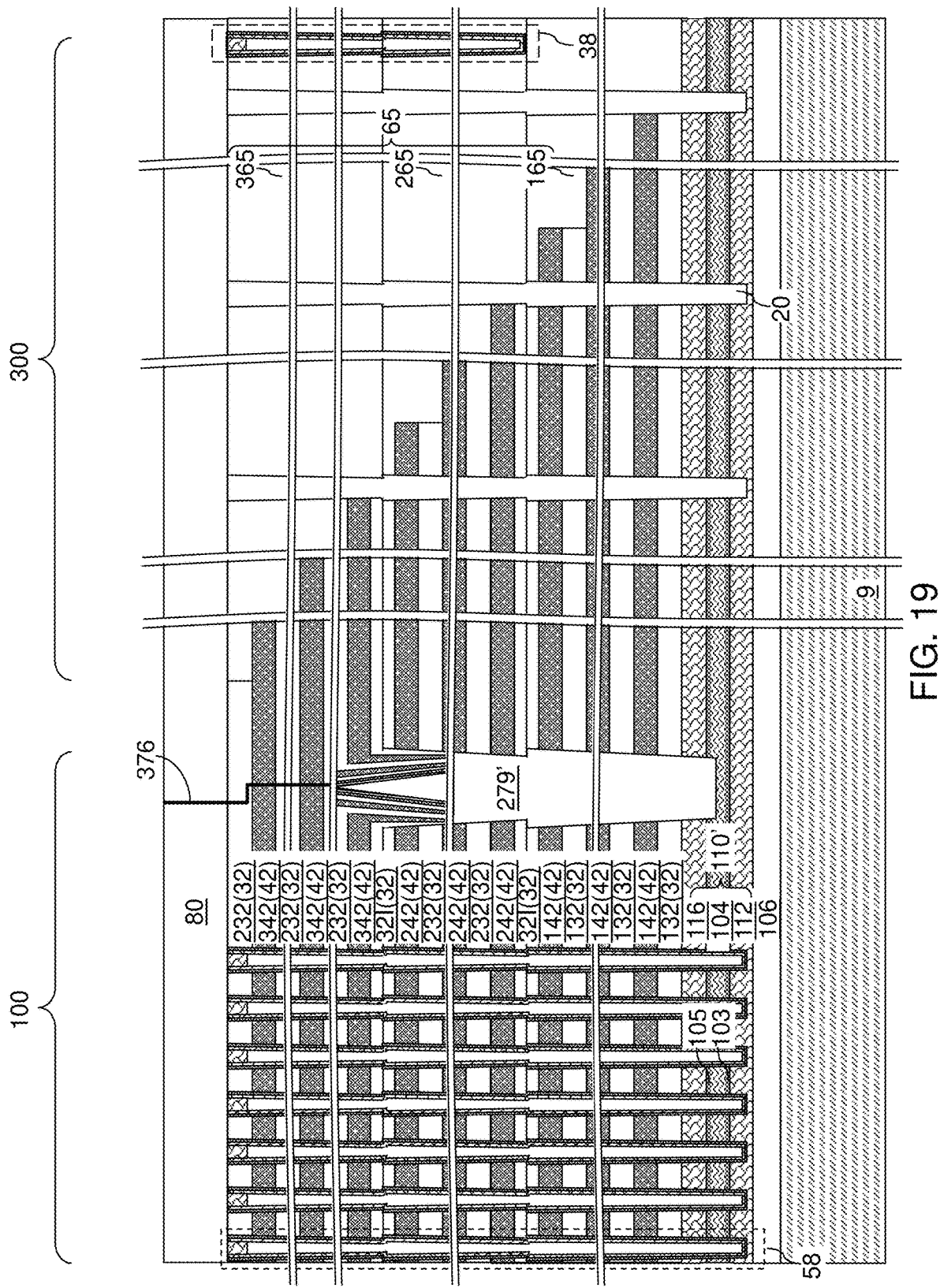
FIG. 19 is a vertical cross-sectional view of the exemplary structure after formation of a contact-level dielectric layer according to an embodiment of the present disclosure.

Referring to FIG. 19, a dielectric material, such as undoped silicate glass or a doped silicate glass, can be deposited over the alternating stacks {(132, 142), (232, 242), (332, 342)} to form a contact-level dielectric layer 80. The thickness of the contact-level dielectric layer 80 may be in a range from 100 nm to 600 nm, such as from 200 nm to 400 nm, although lesser and greater thicknesses may also be employed.

Figure 20A:
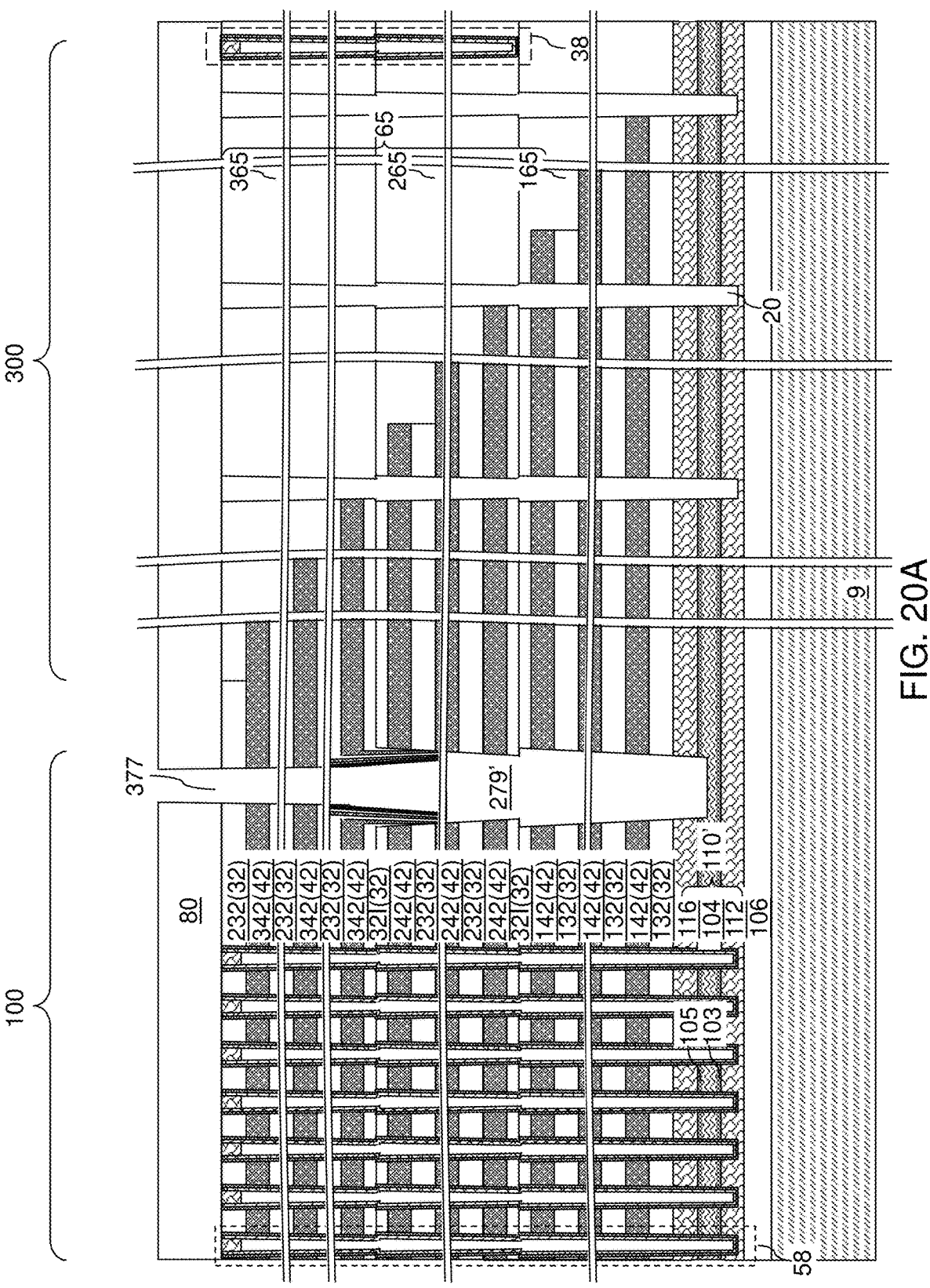
FIG. 20A is a schematic vertical cross-sectional view of the exemplary structure after formation of third-tier laterally-extending cracks in the third alternating stack according to an embodiment of the present disclosure.
Figure 20B:
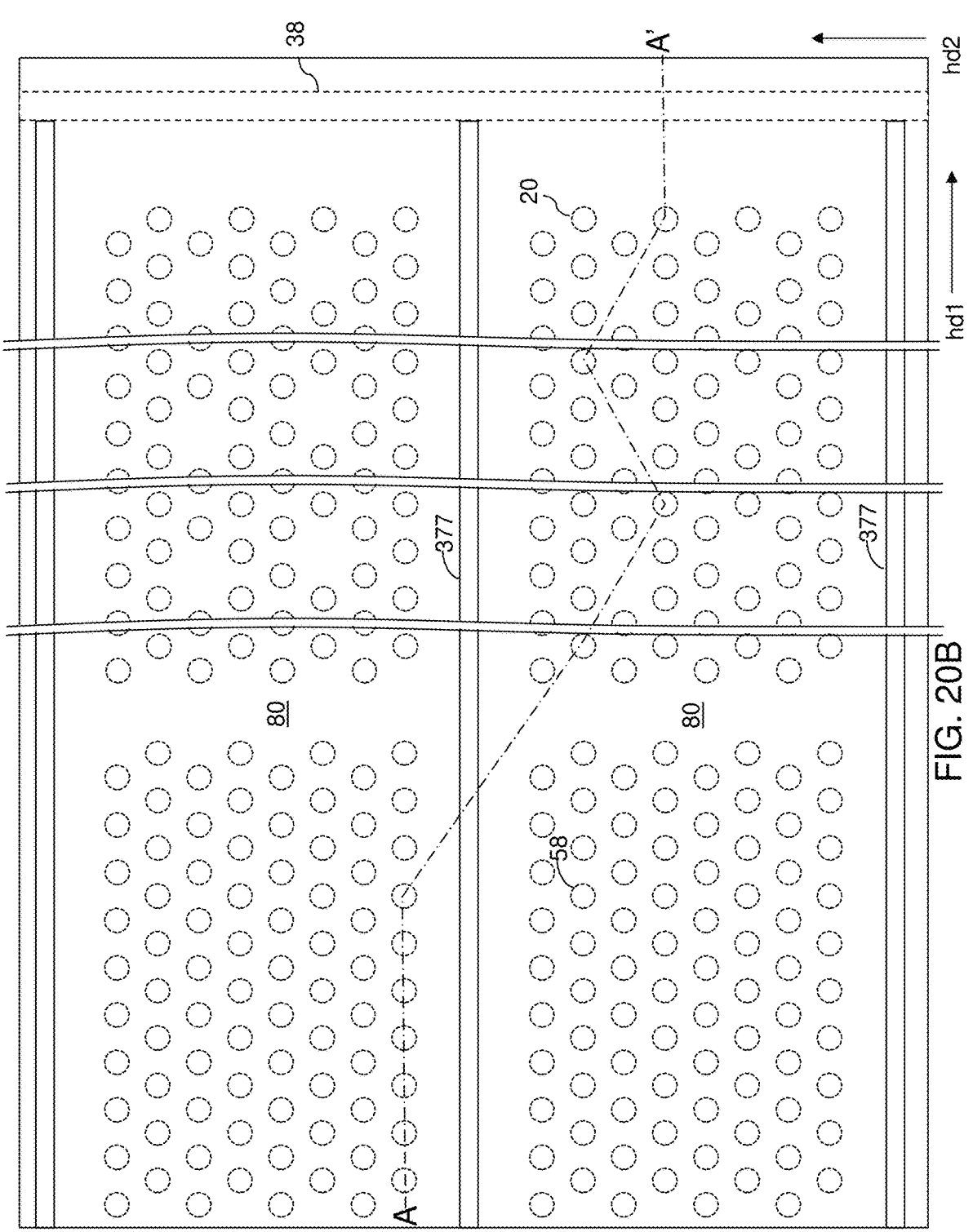
FIG. 20B is a top-down view of the exemplary structure of FIG. 20A. The vertical plane A-A' is the cut plane of the vertical cross-sectional view of FIG. 20A.

Referring to FIGS. 20A and 20B, third-tier laterally-extending cracks 377 can be formed through the third alternating stack (332, 342) by performing a second anneal process. The second anneal process may be carried out in a nitrogen-containing ambient. The second anneal process may be carried out at an elevated temperature in a range from 800 degrees Celsius to 1,100 degrees Celsius, for 1 second to 30 minutes. In one embodiment, the second anneal process causes stress in the third sacrificial material layers 342, which results in tension in the second non-uniformity 376 in the third sacrificial material layers 342. The tension causes the third sacrificial material layers 342 to separate at the second non-uniformity 376 to induce formation of third-tier laterally-extending cracks 377 located over the second-tier cavities 279'. The third-tier laterally-extending cracks 377 are connected to a respective underlying one of the second-tier cavities 279' and vertically extend to a topmost material layer of the third alternating stack (332, 342). At least one of the third-tier laterally-extending cracks 377 extends to and stops at the respective inter-tier crack-stop structures 38.

Figure 21A:
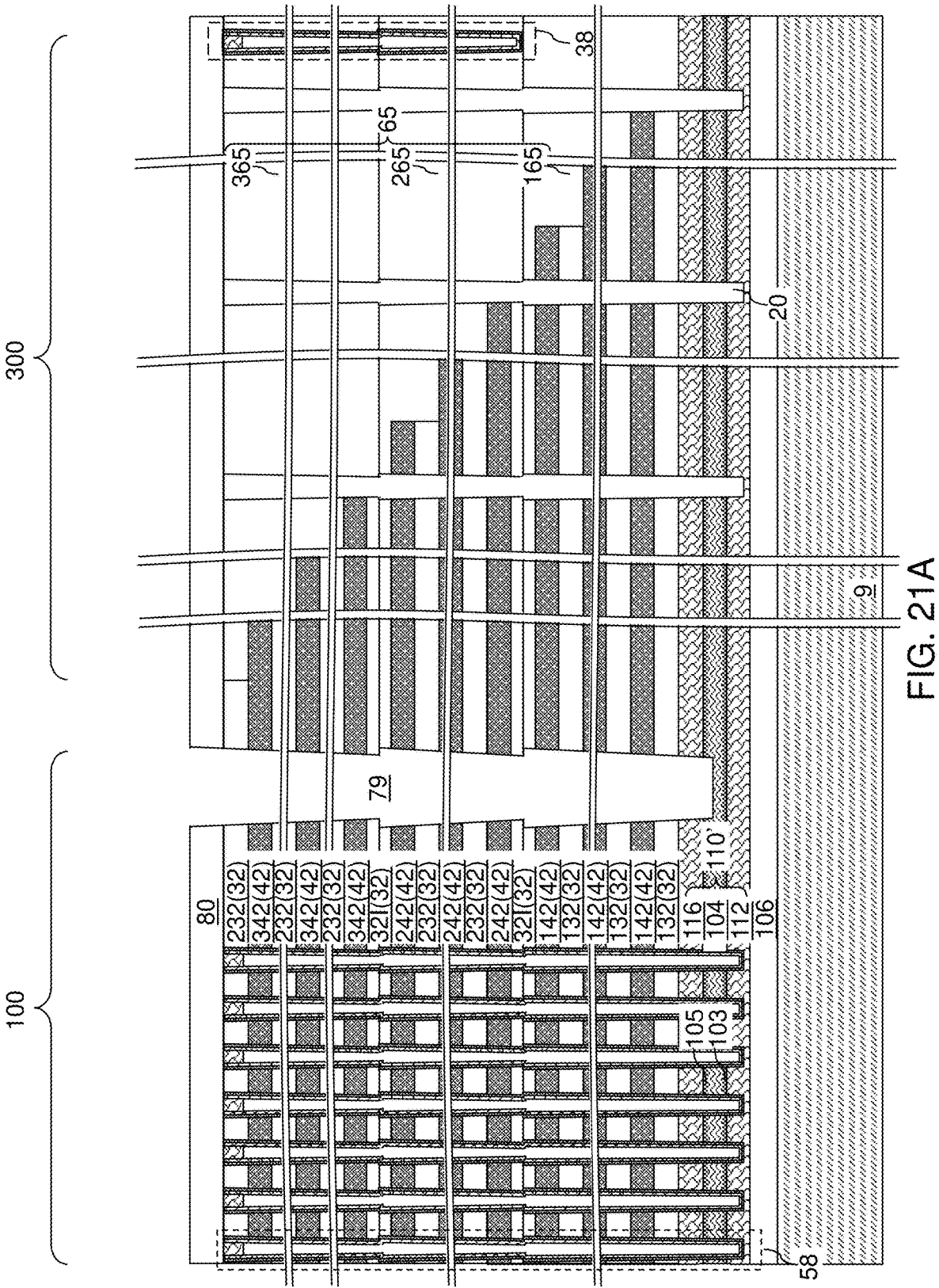
FIG. 21A is a schematic vertical cross-sectional view of the exemplary after formation of third-tier lateral isolation trenches according to an embodiment of the present disclosure.
Figure 21B:
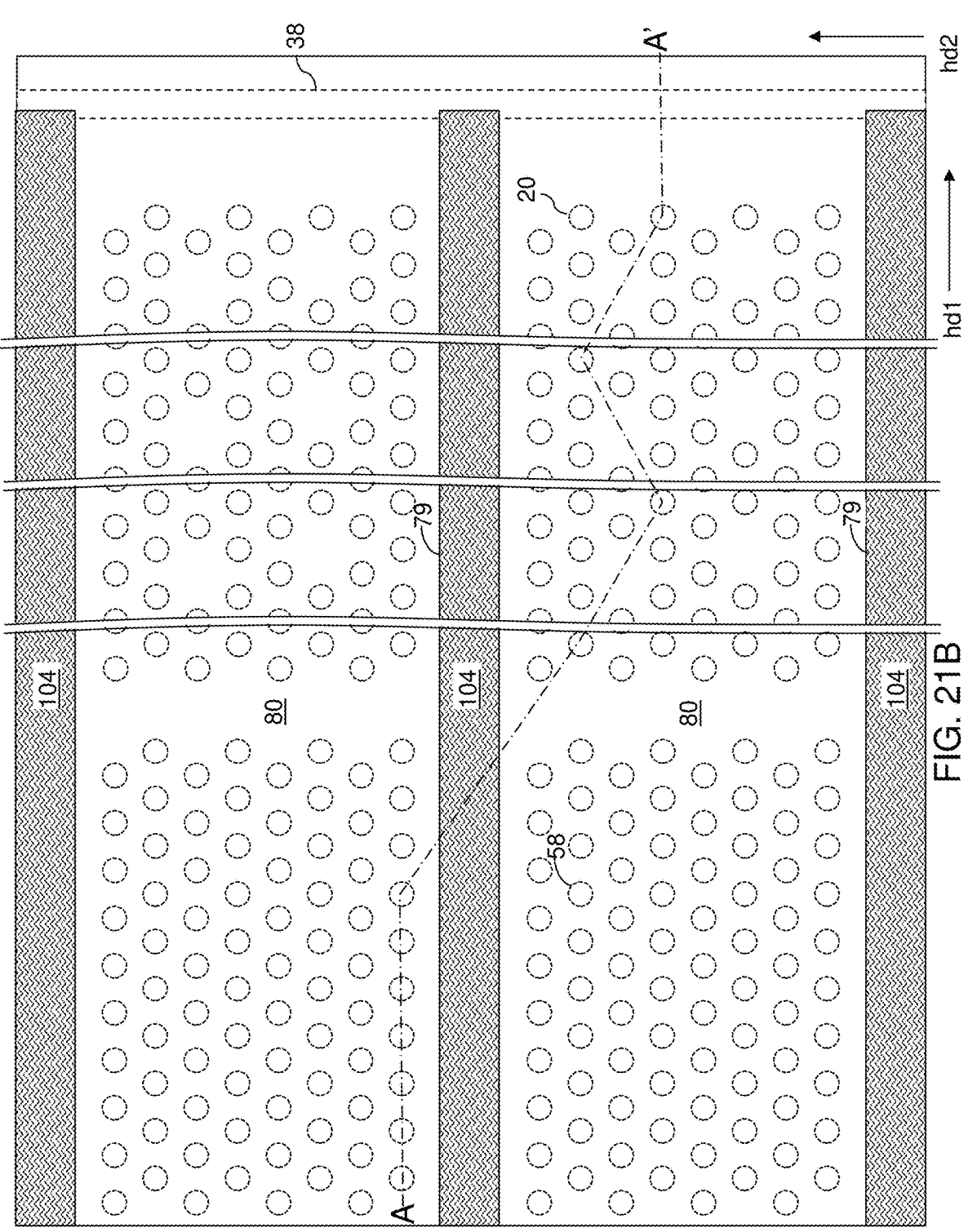
FIG. 21B is a top-down view of the exemplary structure of FIG. 21A. The vertical plane A-A' is the cut plane of the vertical cross-sectional view of FIG. 21A.

Referring to FIGS. 21A and 21B, a photoresist layer (not shown) can be applied over the exemplary structure, and can be lithographically patterned to form elongated opening over the third-tier laterally-extending cracks 377. In one embodiment, the areas of the elongated openings in the photoresist layer can be greater than the areas of the third-tier laterally-extending cracks 377. In some embodiments, the areas of the elongated opening in the photoresist layer may be the same as, or may be substantially the same as, the areas of the second-tier lateral isolation trenches 279.

An anisotropic etch process can be performed to etch unmasked portions of the third alternating stack (332, 342). According to an aspect of the present disclosure, all layers of the third alternating stack (332, 342) have sidewalls that are exposed to the third-tier laterally-extending cracks 377. Thus, each third-tier laterally-extending crack 377 can be expanded in volume to form a third-tier lateral isolation trench 379. Due to the exposure of each physically exposed sidewall of the third alternating stack (332, 342) to the etchant ion throughout the anisotropic etch process, the duration of the anisotropic etch time can be significantly shorter than a conventional etch process that etches each layer of the third alternating stack (332, 342) from top to bottom.

The materials of the third alternating stack (332, 342) that are deposited in the second-tier lateral isolation trenches 279 are removed by the anisotropic etch process. The anisotropic etch process expands the laterally-extending cracks 377, and converts the laterally-extending cracks 377 into third-tier lateral isolation trenches 379 that are adjoined to a respective one of the second-tier lateral isolation trenches 279. Each third-tier lateral isolation trench 379 overlies, and is adjoined to, a respective underlying second-tier lateral isolation trench 279. The third-tier structure includes patterned portions of the third alternating stack (332, 342) as formed at the processing steps of FIG. 16 and the third-tier lateral isolation trenches 379. The photoresist layer can be subsequently removed, for example, by ashing.

The third-tier lateral isolation trenches 379, the second-tier lateral isolation trenches 279, and the first-tier lateral isolation trenches 179 are vertically interconnected with each other to form inter-tier lateral isolation trenches 79, which are also referred to as lateral isolation trenches 79.

Figure 22:
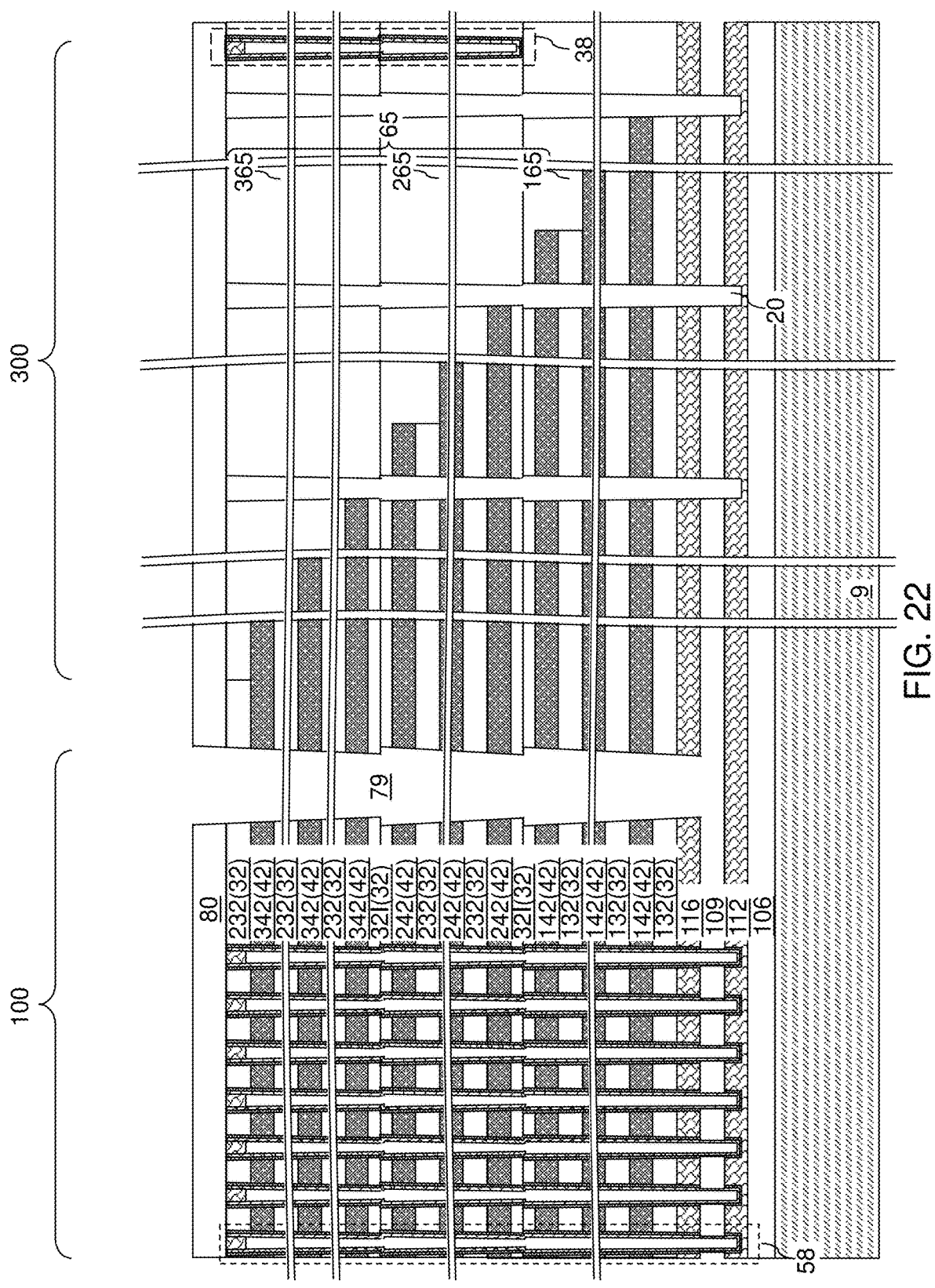
FIG. 22 is a vertical cross-sectional view of the exemplary structure after formation of a source-level cavity according to an embodiment of the present disclosure.

Referring to FIG. 22, an etchant that etches the material of the source-level sacrificial layer 104 selective to the materials of the alternating stacks {(132, 142), (232, 242), (332, 342)}, the contact-level dielectric layer 80, the stepped dielectric material portions (165, 265, 365), the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stacks {(132, 142), (232, 242), (332, 342)}, the contact-level dielectric layer 80, the stepped dielectric material portion 65, the lower source-level semiconductor layer 112, and the upper source-level semiconductor layer 116. A source cavity 109 is formed in the volume from which the source-level sacrificial layer 104 is removed. Each of the memory opening fill structures 58 is physically exposed to the source cavity 109. Specifically, each of the memory opening fill structures 58 includes a sidewall that is physically exposed to the source cavity 109.

Figure 23:
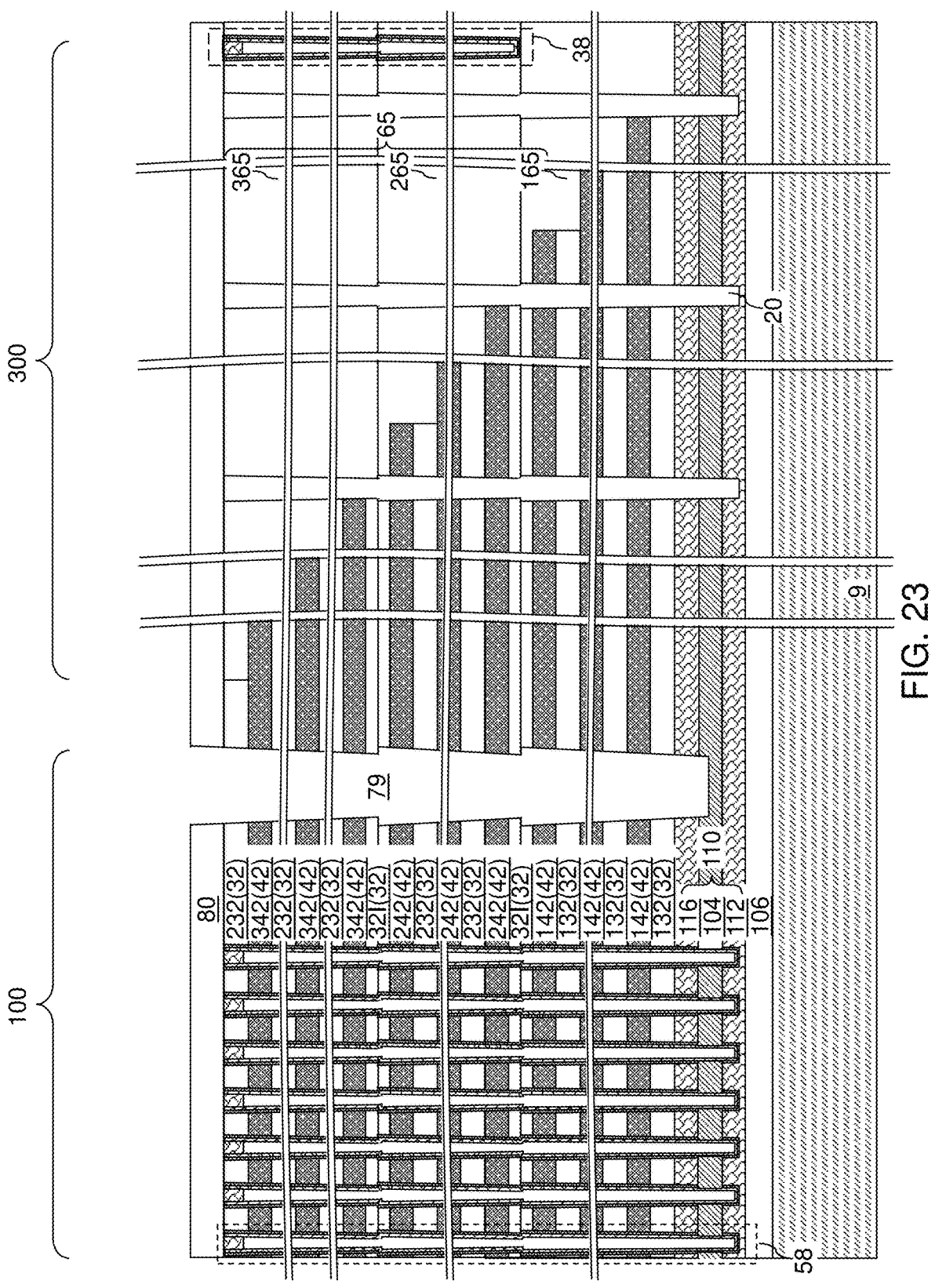
FIG. 23 is a vertical cross-sectional view of the exemplary structure after formation of a source contact layer according to an embodiment of the present disclosure.

Referring to FIG. 23, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

A semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{19}/cm^3$ to $2.0 \times 10^{21}/cm^3$, such as from $1.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The layer stack including the lower source-level semiconductor layer 112, the source contact layer 114, and the upper source-level semiconductor layer 116 constitutes a source layer 110, which replaces the in-process source-level material layers 110'. The source layer 110 contacts an end portion of each of the vertical semiconductor channels 60.

Figure 24:
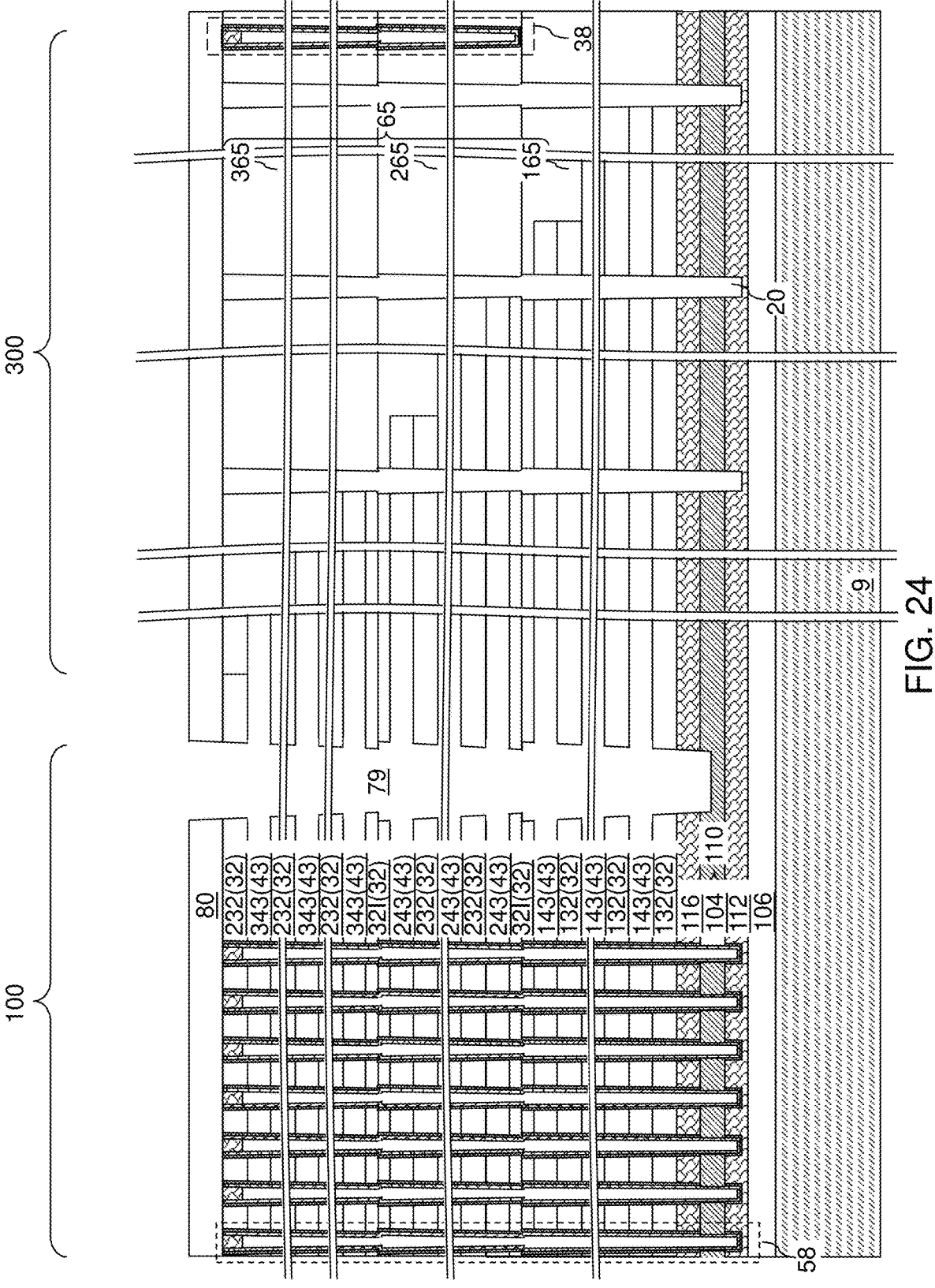
FIG. 24 is a vertical cross-sectional view of the exemplary structure after formation of laterally-extending cavities according to an embodiment of the present disclosure.
Figure 25A:
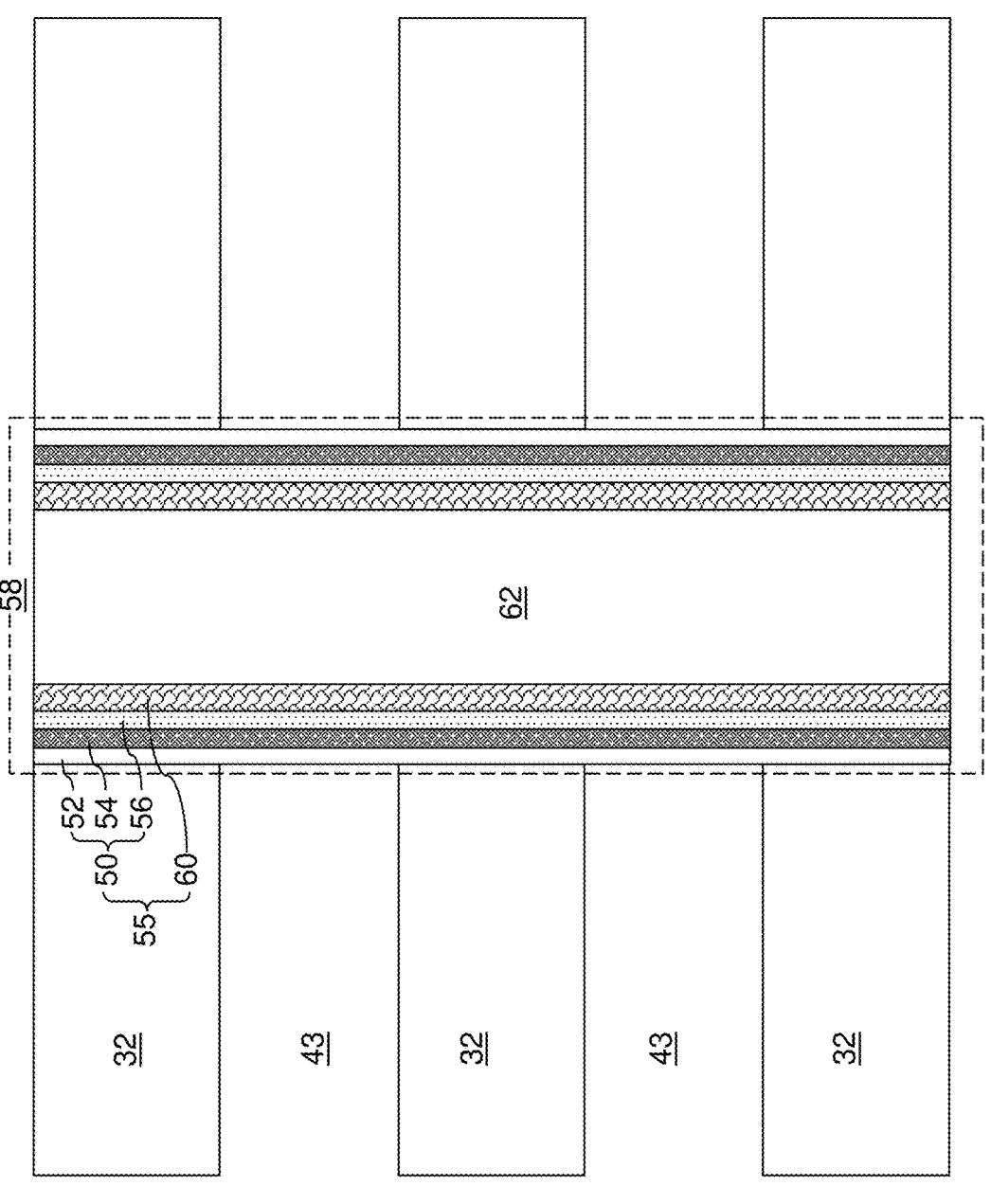
FIGS. 25A-25D are sequential vertical cross-sectional views of a region of the exemplary structure during formation of a backside blocking dielectric layer and electrically conductive layers according to an embodiment of the present disclosure.

Referring to FIGS. 24 and 25A, an isotropic etch process can be performed to remove the sacrificial material layers (142, 242, 342) selective to the insulating layers (132, 232, 332), the stopper insulating layer 106, the memory opening fill structures 58, and the source layer 110. In an illustrative example, the insulating layers (132, 232, 332) may comprise silicon oxide, the sacrificial material layers (142, 242, 342) may comprise silicon nitride. In this case, the isotropic etch process that removes the sacrificial material layers (142, 242, 342) may comprise a wet etch process employing hot phosphoric acid. Laterally-extending cavities 43 can be formed in volumes from which the sacrificial material layers (142, 242, 342) are removed. Sidewall surface segments of the memory opening fill structures 58 can be physically exposed to the laterally-extending cavities 43.

Figure 25B:
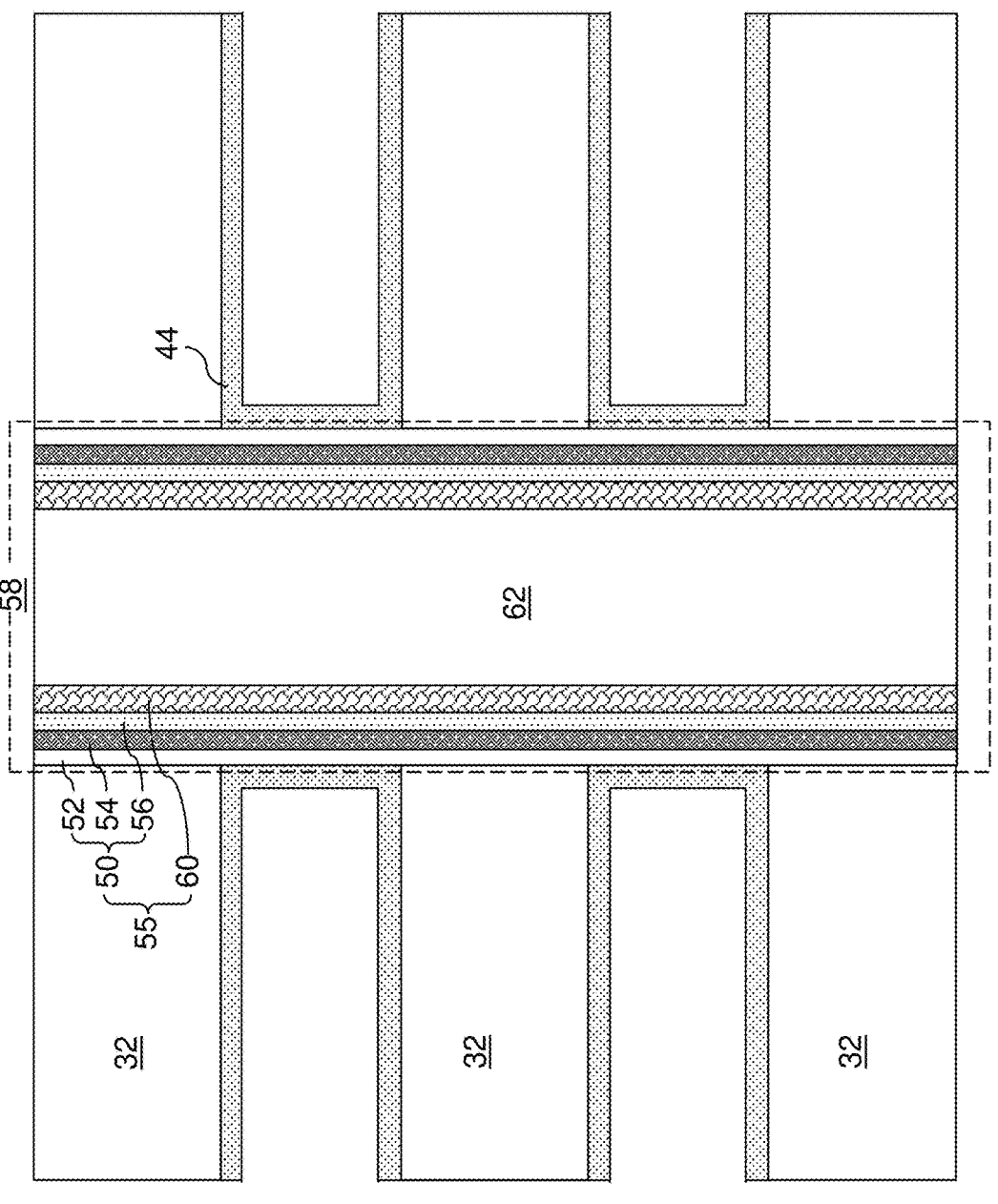

Referring to FIG. 25B, an outer blocking dielectric layer 44, such as an aluminum oxide layer, can be optionally formed in the laterally-extending cavities 43 by a conformal deposition process.

Figure 25C:
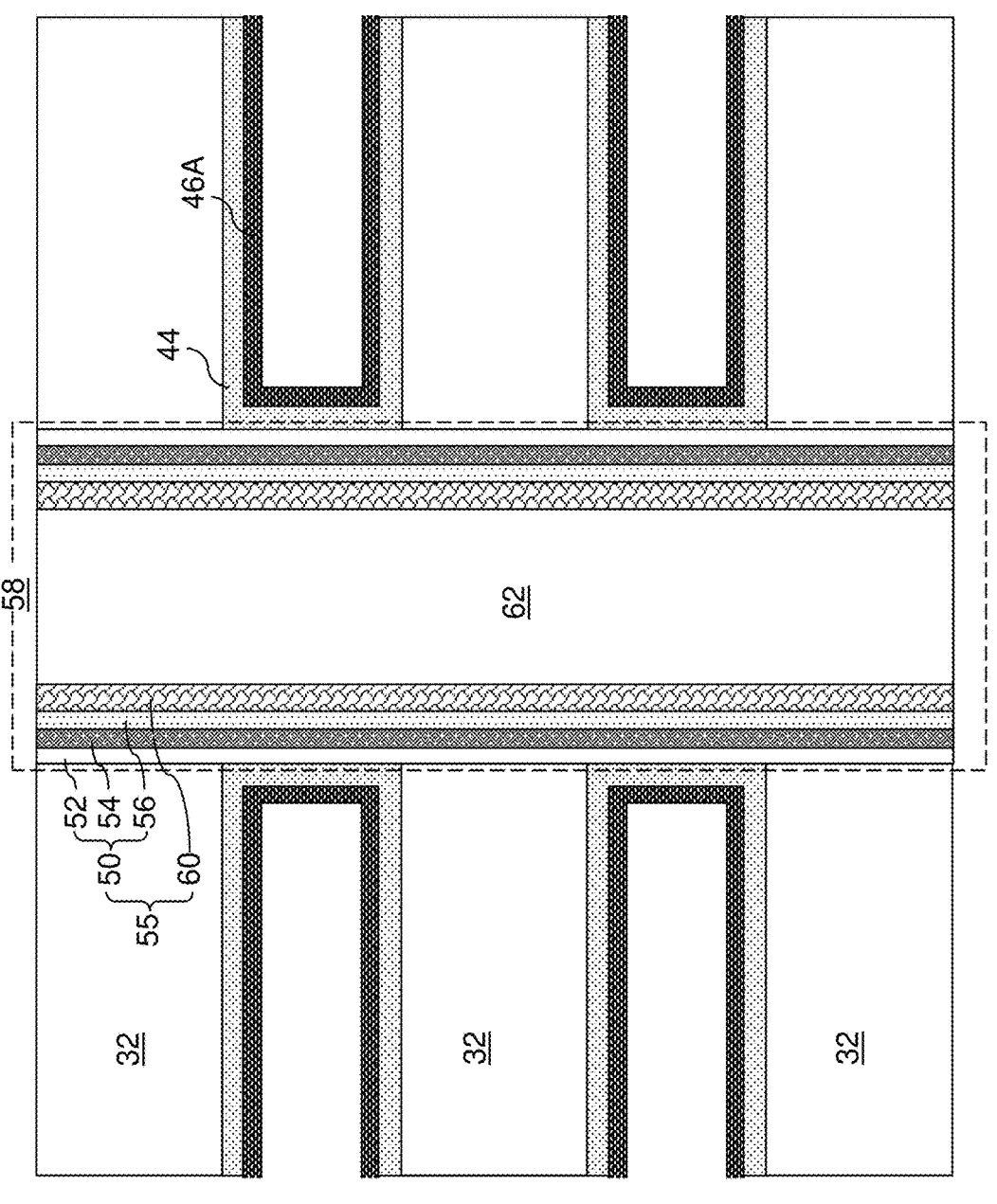

Referring to FIG. 25C, a metallic barrier material can be conformally deposited in the laterally-extending cavities 43 to form a metallic barrier layer 46A. The metallic barrier material may comprise, for example, TiN, TaN, WN, MON, TIC, TaC, WC, or a combination thereof.

Figure 25D:
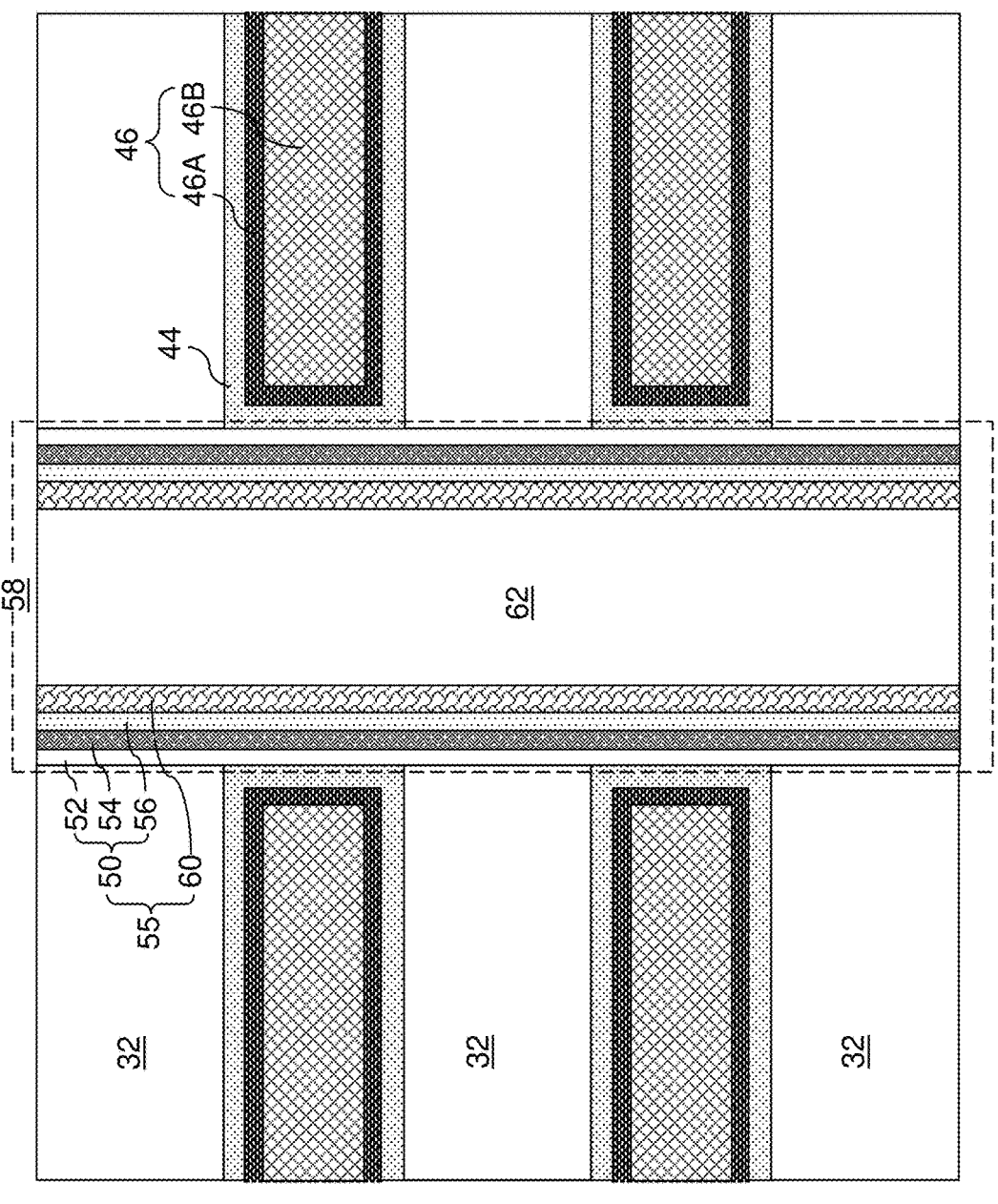
Figure 26:
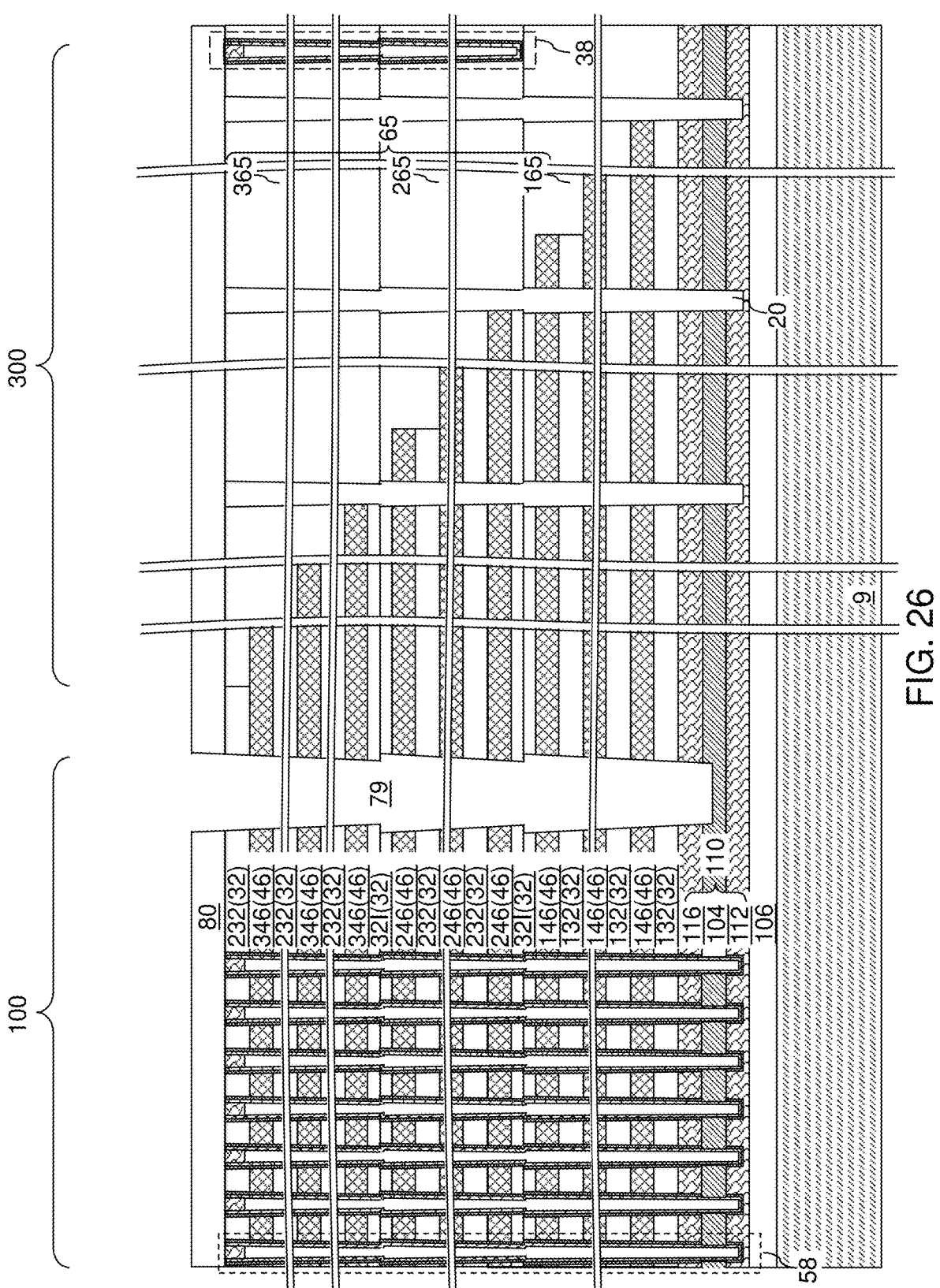
FIG. 26 is a vertical cross-sectional view of the exemplary structure after formation of electrically conductive layers according to an embodiment of the present disclosure.

Referring to FIG. 25D, a metallic fill material can be conformally deposited in unfilled volumes of the laterally-extending cavities 43 to form metallic fill material portions 46B. The metallic fill material may comprise, for example, Ti, Ta, Mo, Co, Ru, W, Cu, other transition metals, and/or alloys or layer stacks thereof. Excess portions of the metallic barrier material and the metallic fill material that are deposited in the lateral isolation trenches 79 or above the contact-level dielectric layer 80 can be removed by performing an etch-back process, which may comprise an isotropic etch process and/or an anisotropic etch process. Each contiguous combination of remaining portions of the metallic barrier material and the metallic fill material filling a respective one of the laterally-extending cavities 43 constitutes an electrically conductive layer 46. The electrically conductive layers 46 may comprise first electrically conductive layers 146 that replace respective portions of the first sacrificial material layers 142, second electrically conductive layers 246 that replace respective portions of the second sacrificial material layers 242, and third electrically conductive layers 346 that replace respective portions of the third sacrificial material layers 342. An alternating stack of insulating layers 32 and electrically conductive layers 46 can be formed between each neighboring pair of lateral isolation trenches 79 over the carrier substrate 9. A plurality of alternating stacks of insulating layers 32 and electrically conductive layers 46 can be laterally spaced apart among one another by the lateral isolation trenches 79.

Figure 27A:
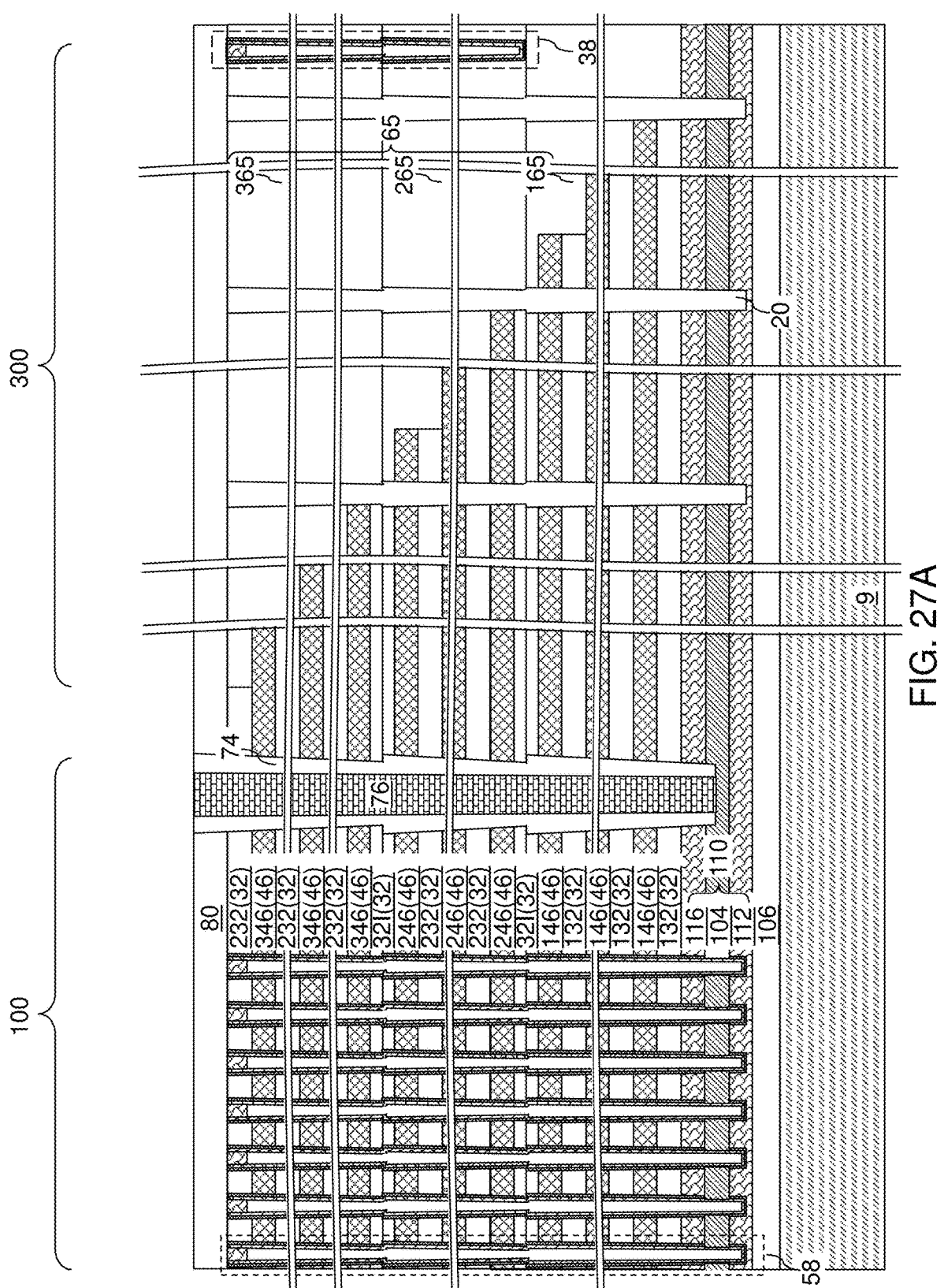
FIGS. 27A and 27B are vertical cross-sectional view of the exemplary structures after formation of lateral isolation trench fill structures and contact via structures according to alternative embodiments of the present disclosure.
Figure 27B:
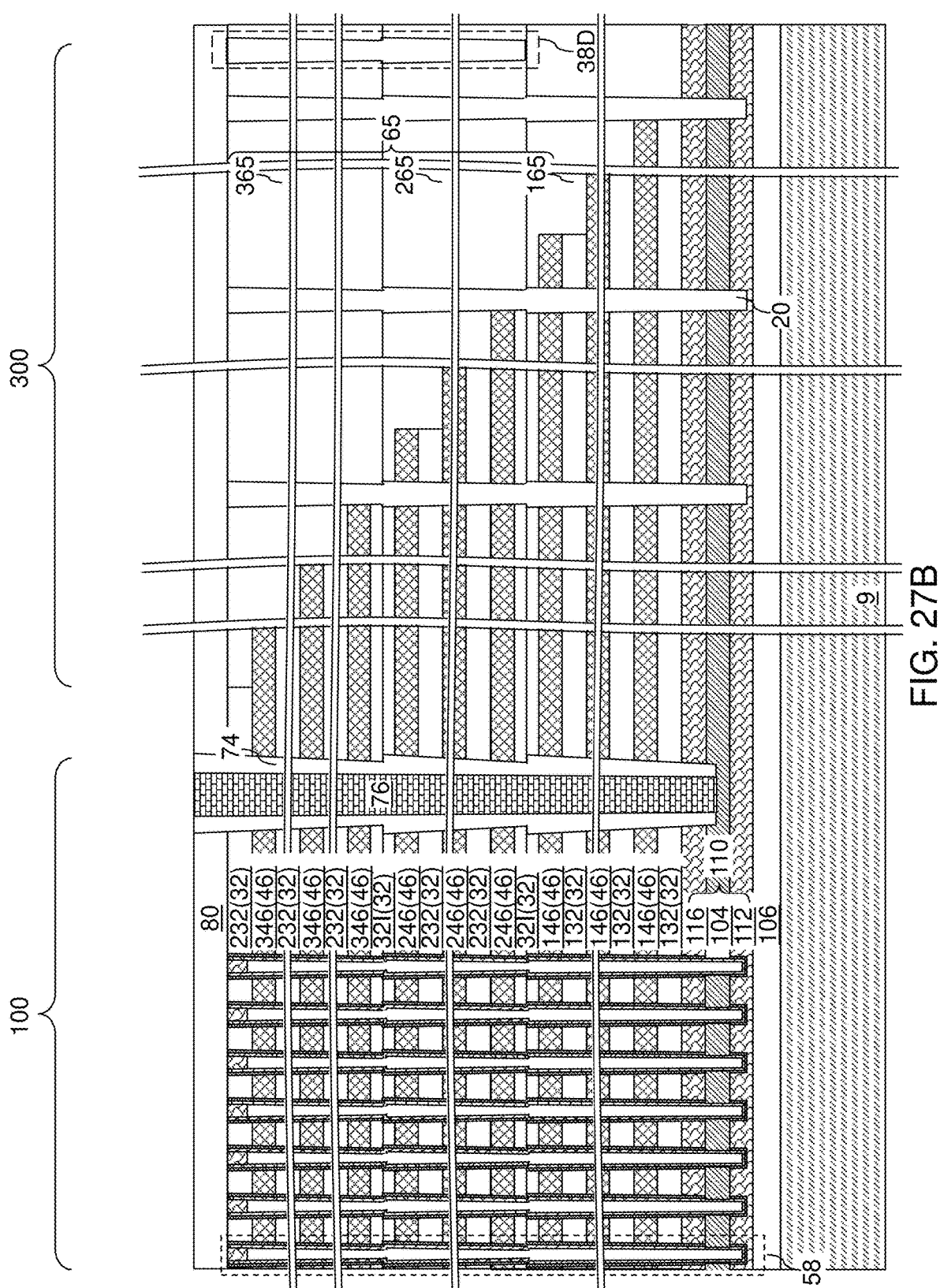
Figure 27C:
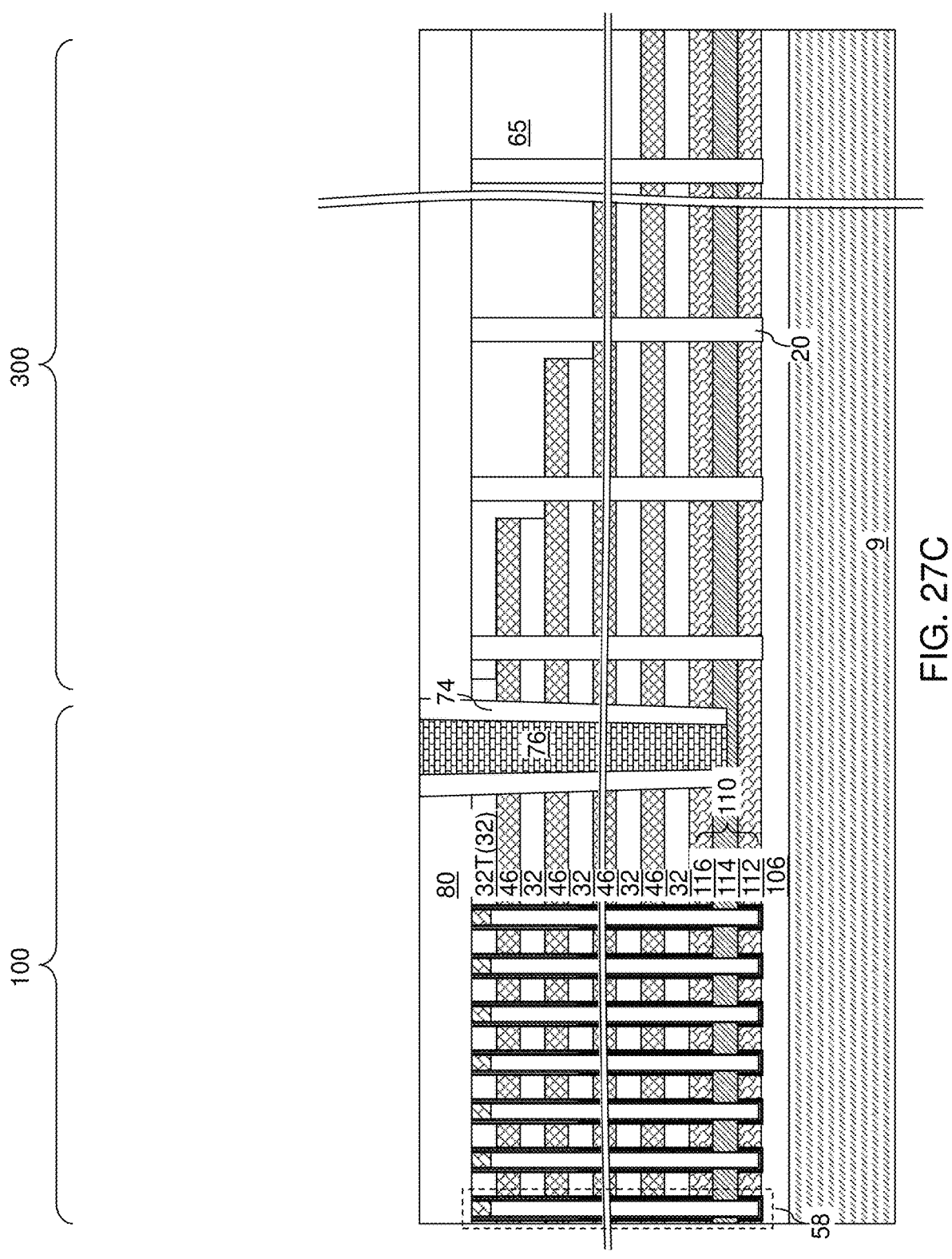
FIG. 27C is a schematic vertical cross-sectional view of the exemplary structure of FIG. 27A in which structural elements in FIG. 27A are schematically illustrated and the crack-stop structures are omitted.

Referring to FIG. 27A, the exemplary structure is illustrated with the optional crack-stop structures 38. Referring to FIG. 27B, the exemplary structure is illustrated with the optional dielectric crack-stop structures 38D. In one embodiment, the crack-stop structures 38 or the dielectric crack-stop structures 38D may be located in a kerf region. Referring to FIG. 27C, the exemplary structure is illustrated without the optional crack-stop structures 38 and without the dielectric crack-stop structures 38D. Generally, an insulating material can be conformally deposited and anisotropically etched to form an insulating spacer 74 in a peripheral portion of each lateral isolation trench 79. At least one conductive fill material can be deposited in remaining volumes of the lateral isolation trenches 79 to form conducive trench fill structures 76, which may function as source contact via structures and/or conductive wall structures.

Figure 28A:
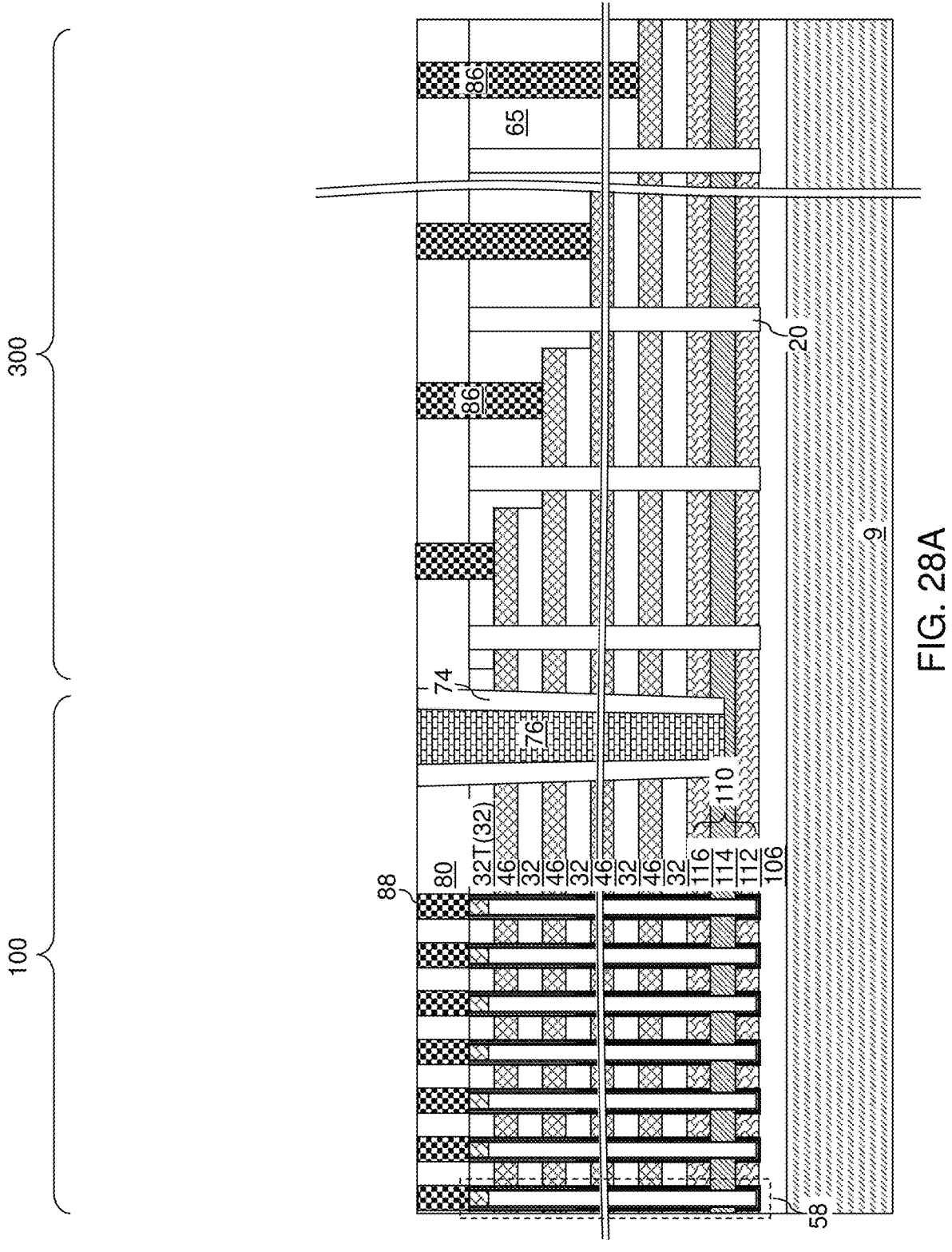
FIG. 28A is a vertical cross-sectional view of the exemplary structure after formation of contact via structures.
Figure 28B:
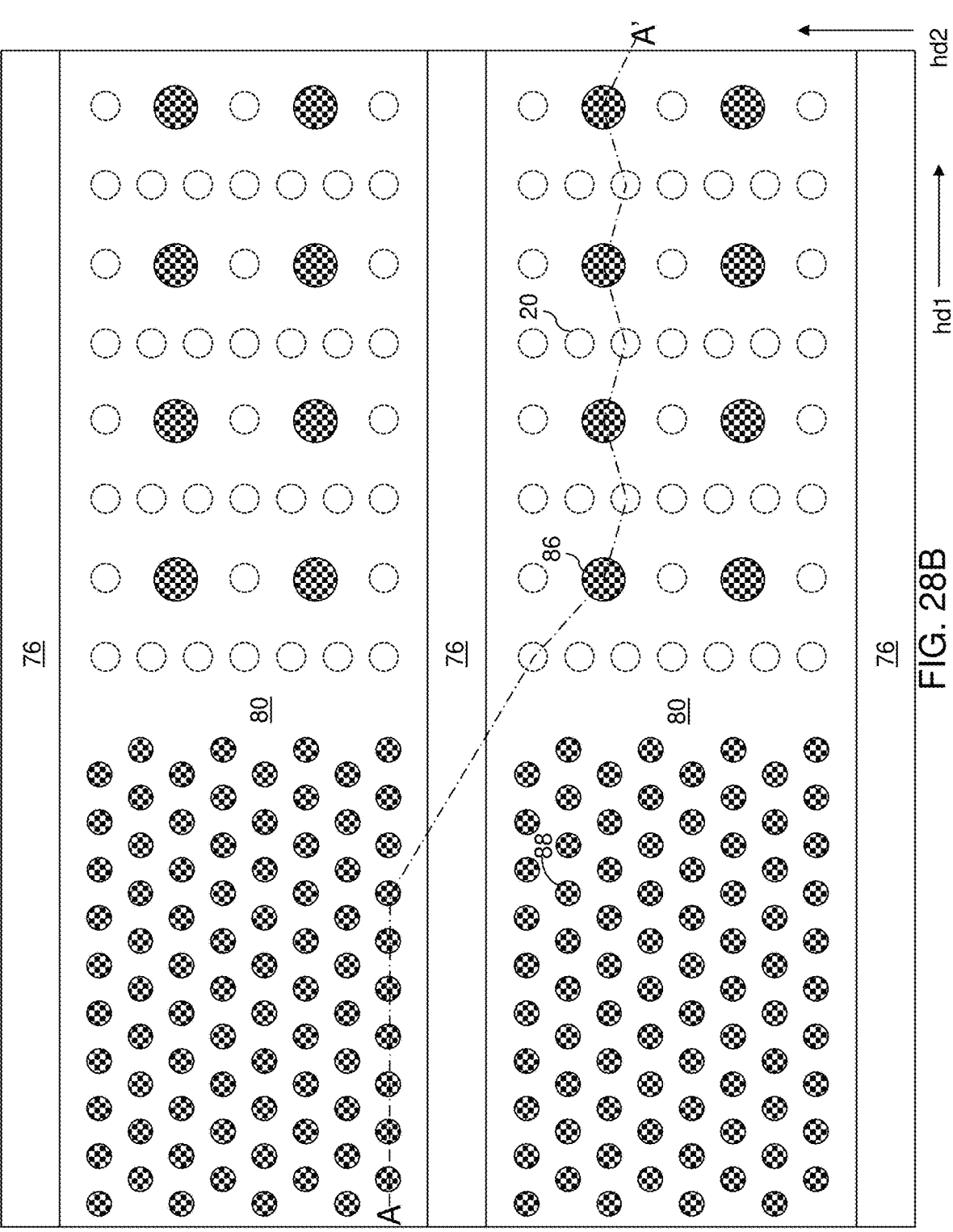
FIG. 28B is a top-down view of the exemplary structure of FIG. 28A. The vertical plane A-A' is the cut plane of the vertical cross-sectional view of FIG. 28A.

Referring to FIGS. 28A and 28B, a photoresist layer (not shown) can be applied over the contact-level dielectric layer 80, and can be lithographically patterned to form openings over each of the memory opening fill structures 58 over the horizontally-extending surfaces of the stepped surfaces in the contact region. An anisotropic etch process can be performed to transfer the pattern of the openings in the photoresist layer through the contact-level dielectric layer 80 and the stepped dielectric material portion 65. Drain contact via cavities can be formed through the contact-level dielectric layer 80 over the memory opening fill structures 58. Layer contact via structures can be formed through the contact-level dielectric layer 80 and the stepped dielectric material portion 65 on a top surface of a respective one of the electrically conductive layers 46. The photoresist layer can be subsequently removed, for example, by ashing.

At least one conductive material, such as a combination of a metallic barrier material and a metallic fill material, can be deposited in the drain contact via cavities and the layer contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the drain contact via cavities constitute drain contact via structures 88 contacting a top surface of a respective one of the drain regions 63. Remaining portions of the at least one conductive material that fill the layer contact via cavities constitute layer contact via structures 86 contacting a top surface of a respective one of the electrically conductive layers 46.

Figure 29A:
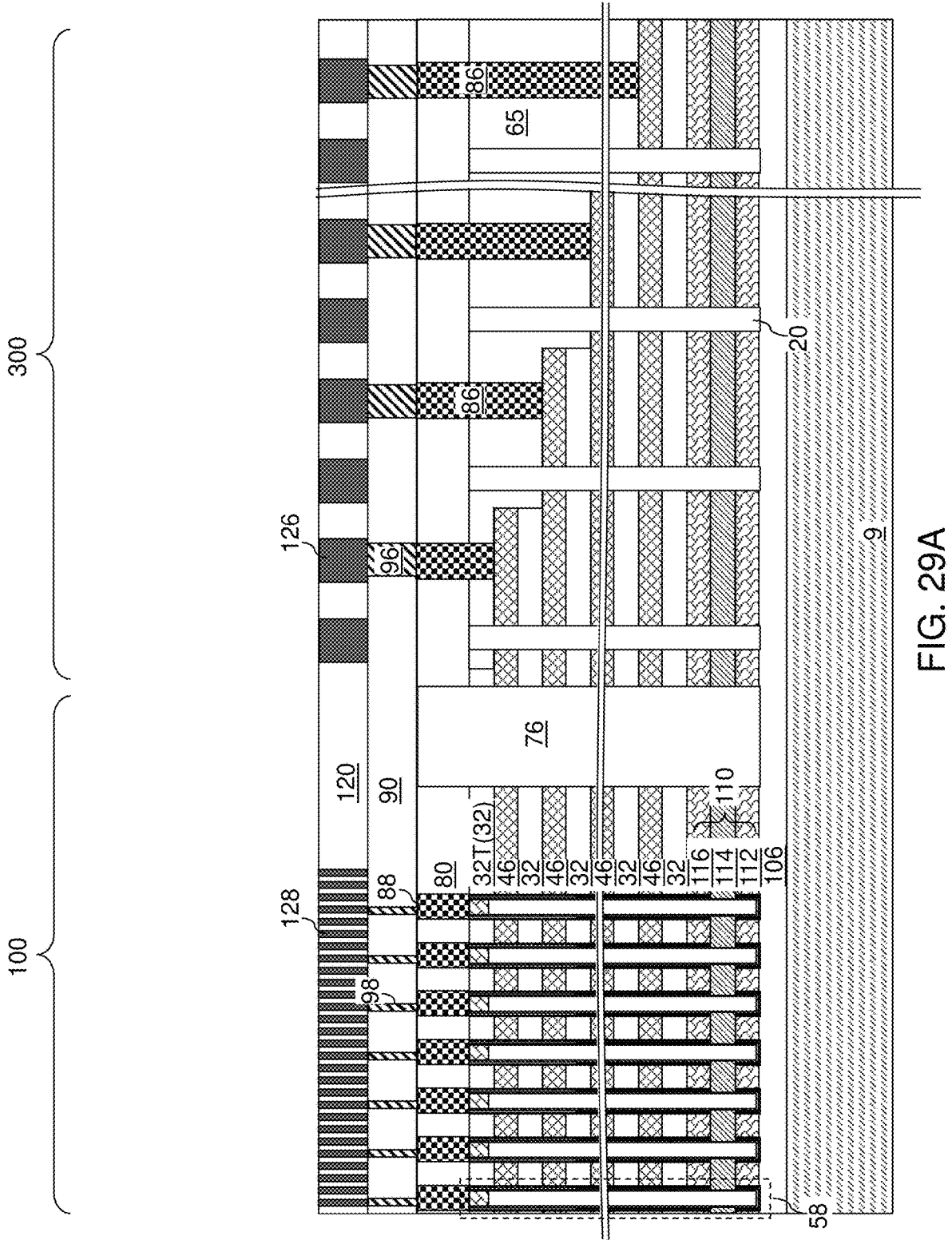
FIG. 29A is a vertical cross-sectional view of the exemplary structure after formation of bit lines and bit-line-level metal lines according to an embodiment of the present disclosure.
Figure 29B:
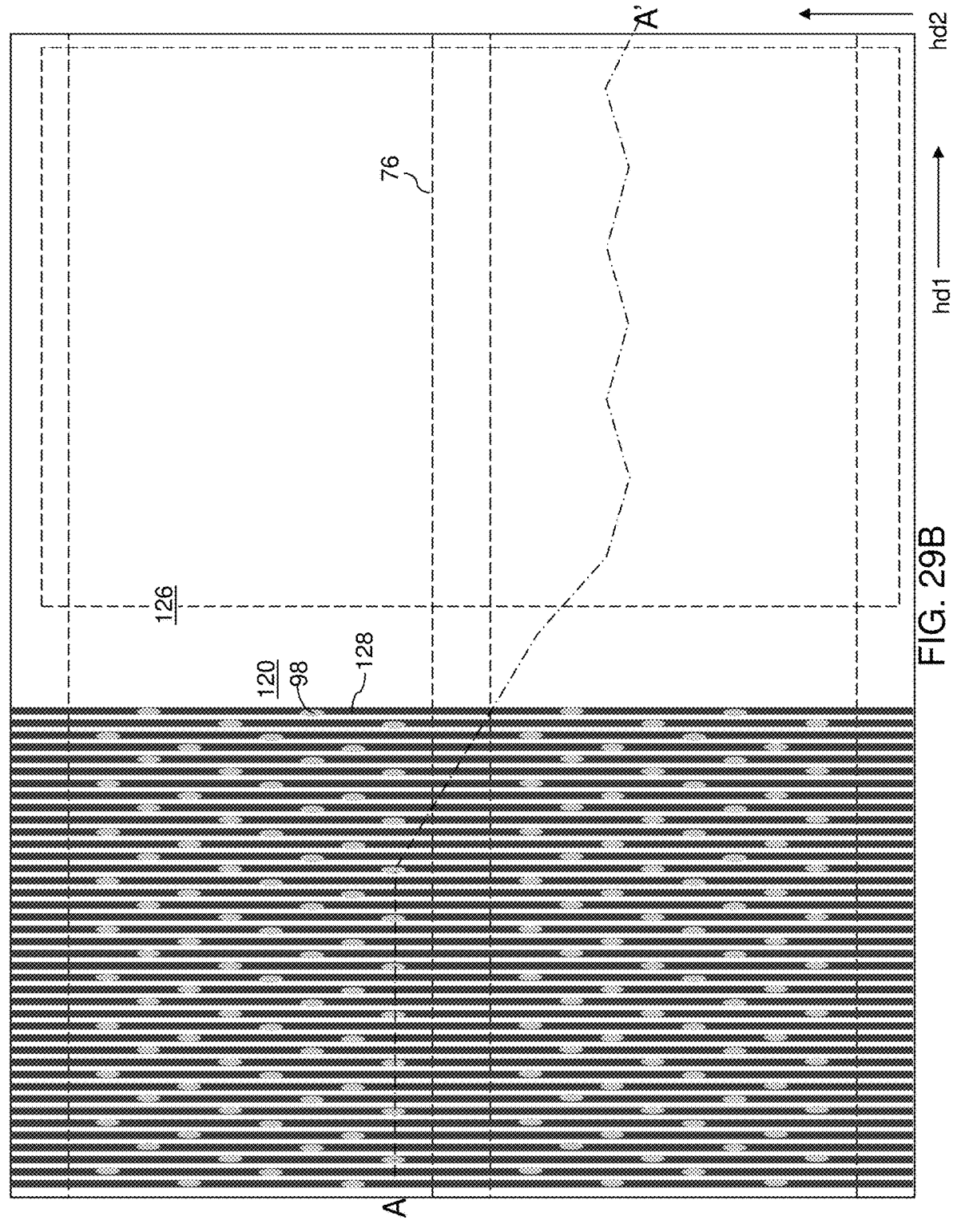
FIG. 29B is a top-down view of the exemplary structure of FIG. 29A. The vertical plane A-A' is the cut plane of the vertical cross-sectional view of FIG. 29A.

Referring to FIGS. 29A and 29B, a connection-level dielectric layer 90 can be formed above the contact-level dielectric layer 80. Connection via cavities can be formed through the connection-level dielectric layer 90, and can be filled with at least one conductive material (which may comprise at least one metallic material) to form connection-level via structures (98, 96). The connection-level via structures (98, 96) comprise drain connection via structures 98 that contact a respective one of the drain contact via structures 88, and layer connection via structures 96 that contact a respective one of the layer contact via structures 86.

A bit-line-level dielectric layer 120 can be formed above the connection-level dielectric layer 90. Bit-line-level line cavities can be formed through the bit-line-level dielectric layer 120, and can be filled with at least one conductive material (which may comprise at least one metallic material) to form bit-line-level metal lines (128, 126). The bit-line-level metal lines may comprise bit lines 128 that laterally extend along the second horizontal direction hd2, and bit-line-level interconnect metal lines 126 (not individually shown) that can be employed to provide electrical connection to the layer connection via structures 96.

Figure 30:
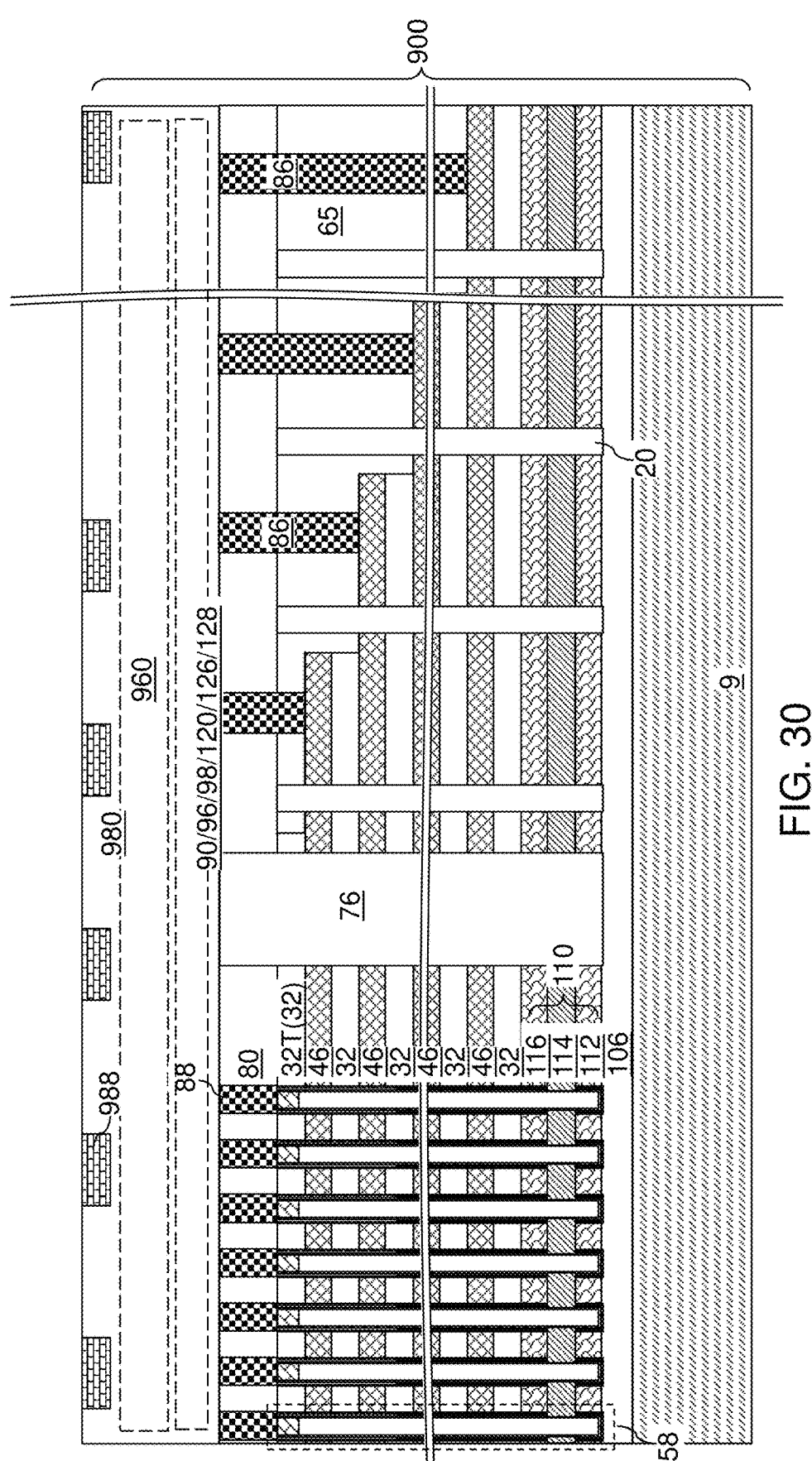
FIG. 30 is a vertical cross-sectional view of the exemplary structure after formation of a memory die according to an embodiment of the present disclosure.

Referring to FIG. 30, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side metal interconnect structures 980. The memory-side dielectric material layers 960 comprise a bit-line-level dielectric material layer embedding the bit lines 128, which are a subset of the memory-side metal interconnect structures 980.

Metal bonding pads, which are herein referred to as upper bonding pads 988, may be formed at the topmost level of the memory-side dielectric material layers 960. The upper bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; a two-dimensional array of drain contact via structures 88 electrically connected to a respective one of the vertical semiconductor channels 60; and a two-dimensional array of layer contact via structures 86 electrically connected to a respective one of the electrically conductive layers 46, a subset of which functions as word lines for the three-dimensional memory array.

In summary, a memory die 900 comprises a memory array, memory-side metal interconnect structures 980, and memory-side bonding pads 988 embedded within memory-side dielectric material layers 960. The memory die 900 comprises a memory device, which may comprise a three-dimensional memory array including an alternating stack of insulating layers 32 and electrically conductive layers 46, and further comprises a two-dimensional array of NAND strings (e.g., the memory opening fill structures 58) vertically extending through the alternating stack (32, 46). In one embodiment, the electrically conductive layers 46 comprise word lines of the two-dimensional array of NAND strings. In one embodiment, the memory-side metal interconnect structures 980 comprise the bit lines 128 for the two-dimensional array of NAND strings.

Figure 31:
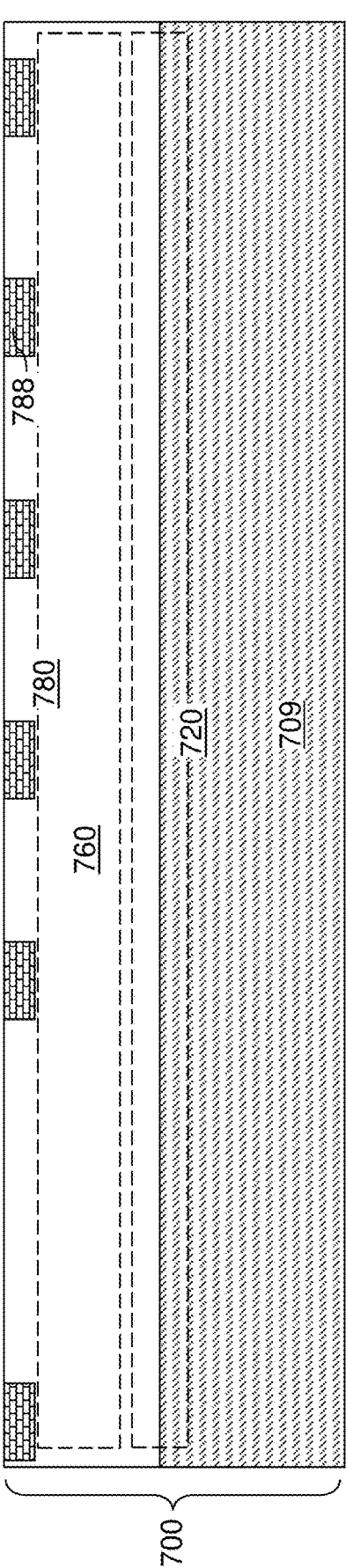
FIG. 31 is a vertical cross-sectional view of a logic die according to an embodiment of the present disclosure.

Referring to FIG. 31, a logic die 700 is provided. The logic die 700 comprises a peripheral circuit 720 that is formed on a logic-side substrate 709. According to an aspect of the present disclosure, the peripheral circuit 720 can be configured to control operation of the memory array within the memory die 900. For example, the peripheral circuit 720 may comprise word line driver regions, bit line driver regions, sense amplifier regions, input/output buffer regions, etc. Logic-side metal interconnect structures 780 embedded within logic-side dielectric material layers 760 can be formed over the peripheral circuit 720. The logic die 700 comprises logic-side bonding pads 788 embedded within logic-side dielectric material layers 760.

Figure 32:
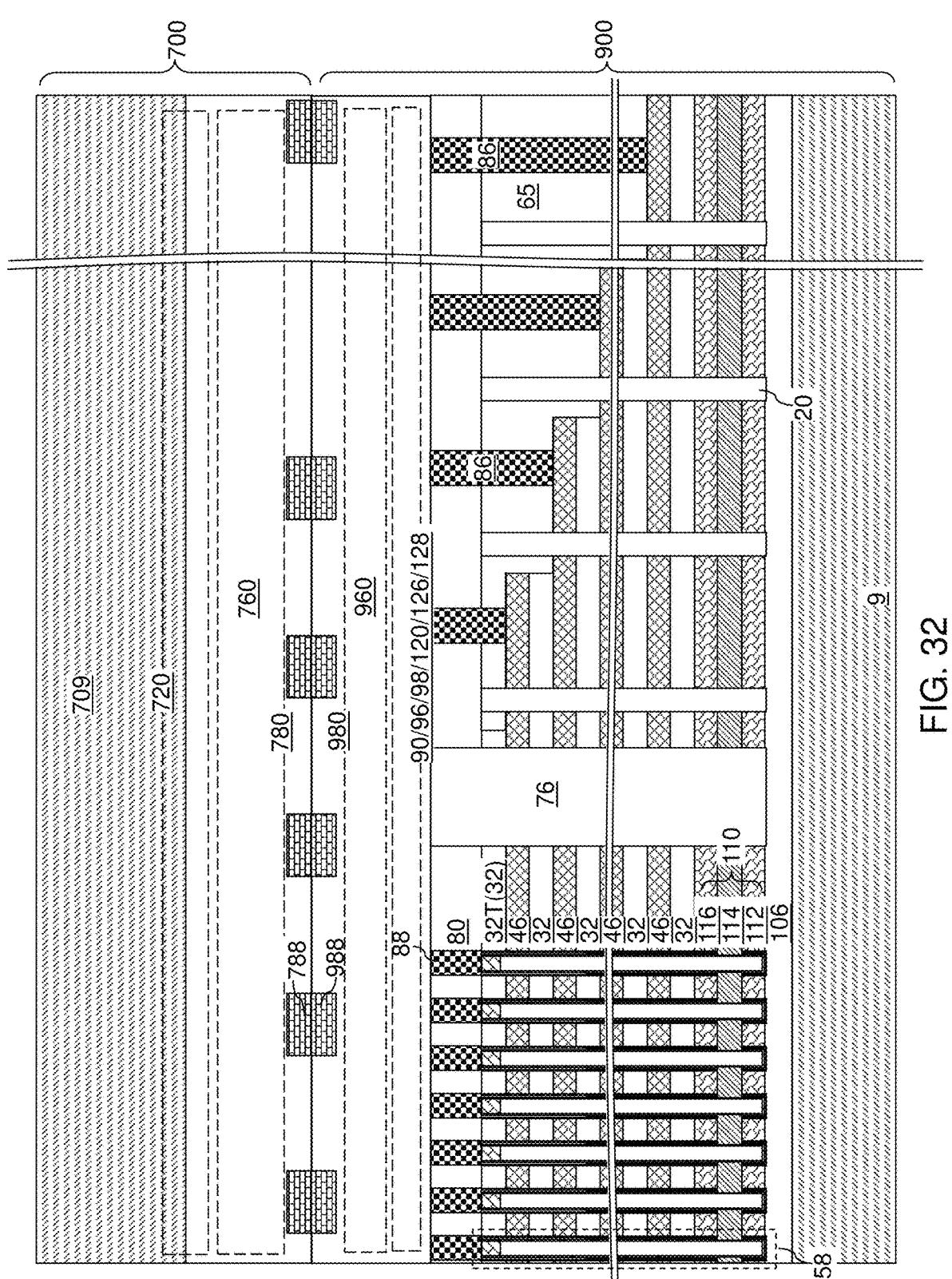
FIG. 32 is a vertical cross-sectional view of the exemplary structure after formation of a bonded assembly of the memory die and the logic die according to an embodiment of the present disclosure.

Referring to FIG. 32, a bonded assembly can be formed by bonding a logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 33:
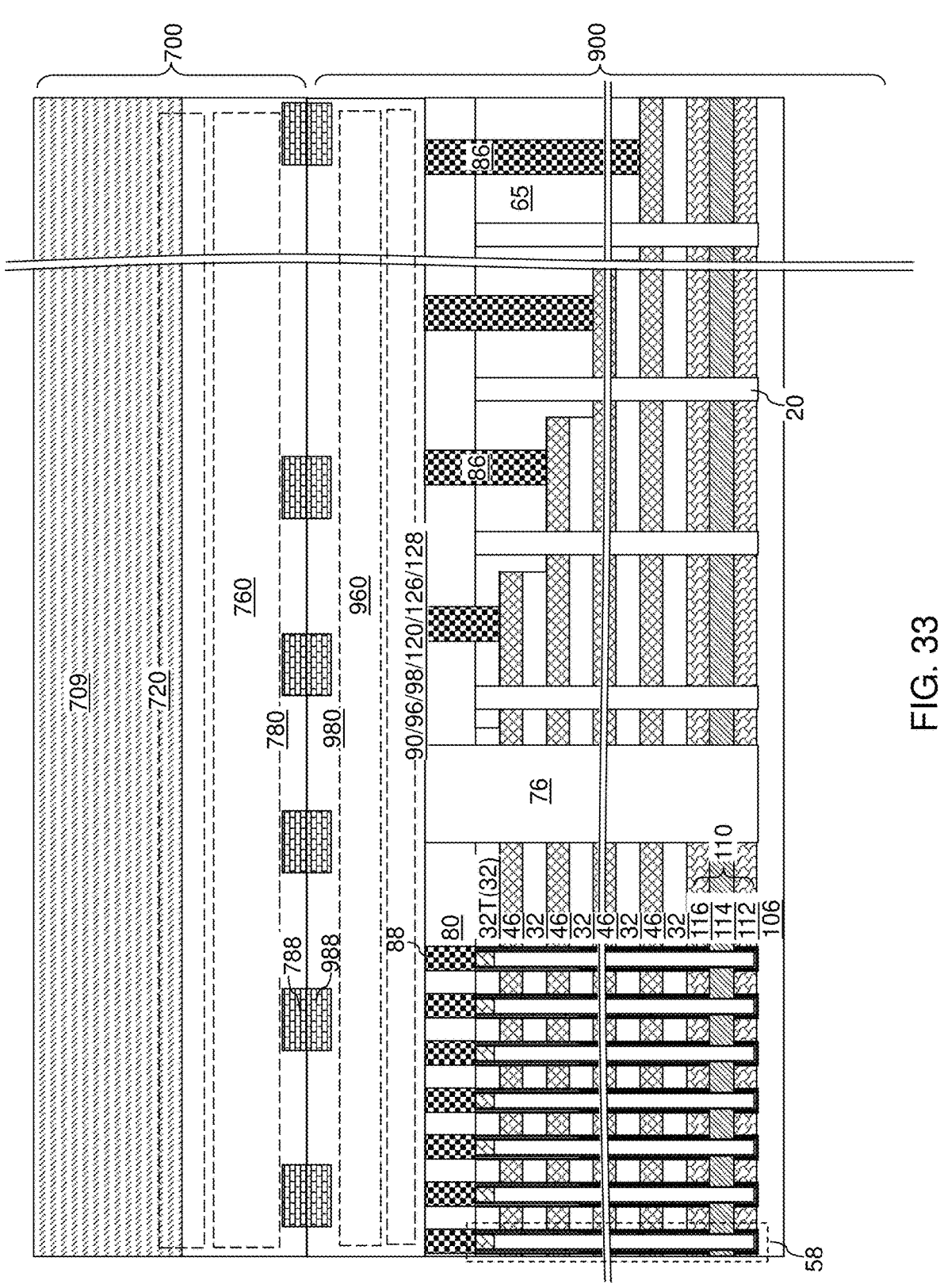
FIG. 33 is a vertical cross-sectional view of the exemplary structure after optional removal of a carrier substrate from the memory die according to an embodiment of the present disclosure.

Referring to FIG. 33, the carrier substrate 9 may optionally be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process such as a wet etch process is employed to remove the carrier substrate 9, the stopper insulating layer 106 may be subsequently employed as an etch stop material layer. Optional electrical contacts may be formed on the bottom side of the bonded assembly of the memory die 900 and the logic die 700.

Figure 34:
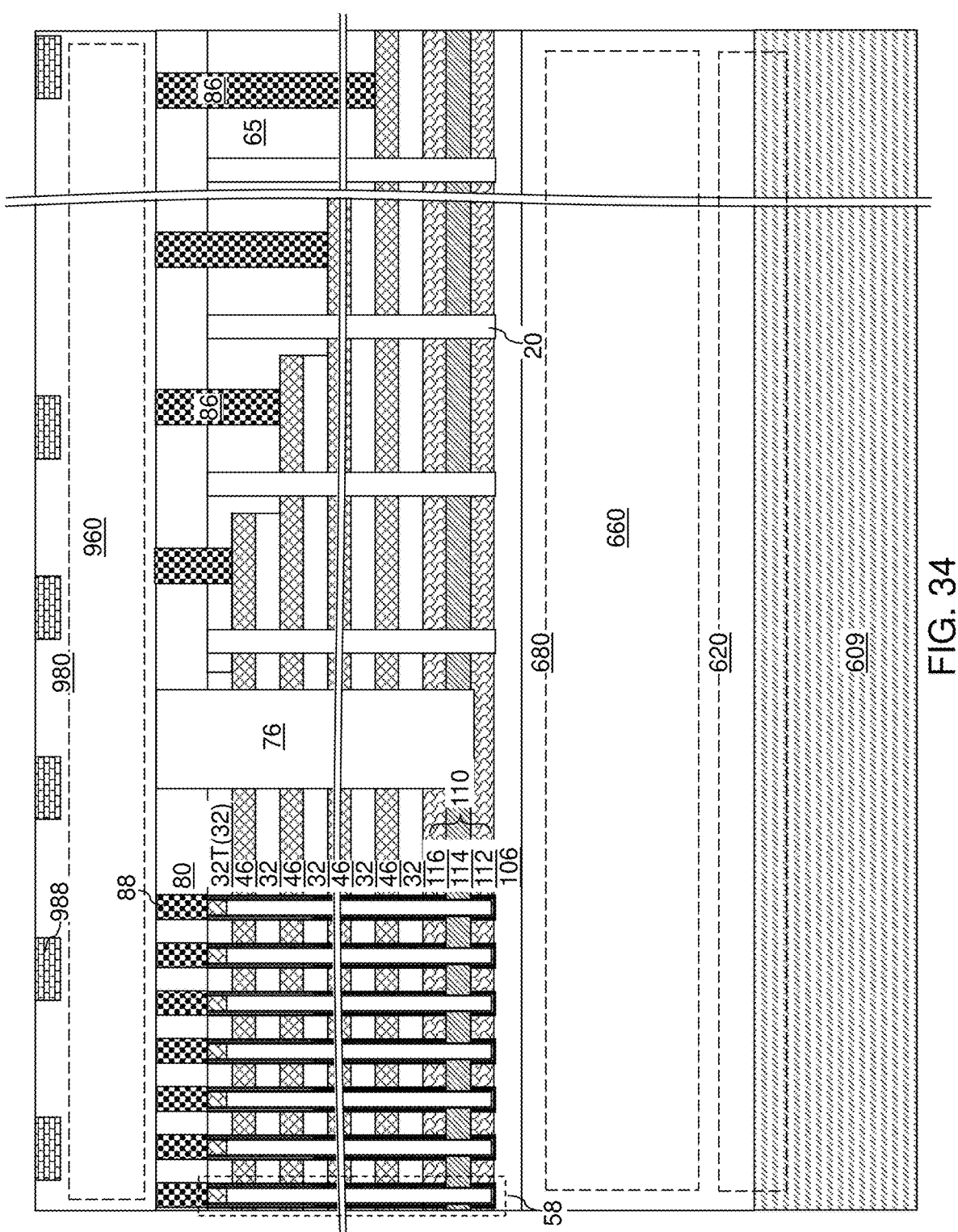
FIG. 34 is a vertical cross-sectional view of an alternative configuration of the exemplary structure according to an alternative embodiment of the present disclosure.

FIG. 34 illustrates an alternative configuration of the exemplary structure according to an alternative embodiment. The alternative configuration of the exemplary structure can be provided by forming semiconductor devices 620 comprising a peripheral circuit for controlling operation of a three-dimensional memory device on a semiconductor substrate 609, by forming metal interconnect structures 680 embedded in dielectric material layers 660 over the semiconductor devices 620, and then forming the structural elements described with reference to FIGS. 1-30. In other words, the combination of the semiconductor substrate 609, the semiconductor devices 620, the dielectric material layers 660, and the metal interconnect structures 680 can be employed in lieu of the carrier substrate 9 and the stopper insulating layer 106.

The various embodiments of the present disclosure can be employed to form cracks through multiple material layers such as a second alternating stack (232, 242) or a third alternating stack (332, 342). The cracks are formed in a controlled manner at locations of non-uniformities (276, 376) that overlie encapsulated cavities such as the first-tier cavities 179' or the second-tier cavities 279'. Second-tier laterally-extending cracks 277 or third-tier laterally-extending cracks 377 can be formed over the first-tier cavities 179' or the second-tier cavities 279'. Sidewall of each layer in the multiple material layers can be physically exposed to the laterally-extending cracks (277, 377). Thus, etchant ions employed in a subsequent anisotropic etch process can immediately etch the physically exposed sidewalls of the layers of the multiple material layers around the laterally-extending cracks (277, 377), and the etch time for forming second-tier lateral isolation trenches 279 or third-tier lateral isolation trenches 379 may be reduced compared to prior art methods in which multiple material layers are etched without use of cracks. Therefore, the methods of the embodiments of the present disclosure can reduce the etch time employed to form lateral isolation trenches (such as the second-tier lateral isolation trenches 279 and the third-tier lateral isolation trenches 379).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A method, comprising:
forming a first-tier structure over a substrate;
forming first-tier trenches laterally extending along a first horizontal direction and laterally spaced apart from each other along a second horizontal direction through the first-tier structure;
non-conformally depositing a plurality of material layers over the first-tier structure such that first-tier cavities are formed in volumes of the first-tier trenches that are not filled with the plurality of material layers; and
inducing laterally-extending cracks in portions of the plurality of material layers that overlie the first-tier cavities, wherein the laterally-extending cracks are connected to a respective underlying one of the first-tier cavities and vertically extend to a topmost material layer of the plurality of material layers.

2. The method of claim 1, wherein the laterally-extending cracks are induced by performing an anneal process at an elevated temperature.

3. The method of claim 2, further comprising performing an anisotropic etch process after formation of the laterally-extending cracks, wherein the laterally-extending cracks are converted into second-tier trenches that are adjoined to a respective one of the first-tier trenches.

4. The method of claim 3, wherein the materials of the plurality of material layers that are deposited in the first-tier trenches are removed by the anisotropic etch process.

5. The method of claim 3, wherein a total thickness of the plurality of material layers located above a topmost horizontal surface of the first-tier structure is at least 10 times a maximum lateral width of the first-tier trenches.

6. The method of claim 3, wherein the plurality of material layers comprise a second-tier structure comprising an alternating stack of insulating layers and sacrificial material layers.

7. The method of claim 6, wherein:
the insulating layers comprise silicon oxide layers; and
the sacrificial material layers comprise hydrogen-containing silicon nitride layers.

8. The method of claim 7, wherein an atomic ratio of hydrogen atoms to silicon atoms in the hydrogen-containing silicon nitride layers is in a range from 0.05 to 0.20 prior to the inducing the laterally-extending cracks.

9. The method of claim 7, wherein:
the laterally-extending cracks are induced by performing an anneal process at an elevated temperature in a nitrogen-containing ambient; and
the anneal process reduces hydrogen content in the hydrogen-containing silicon nitride layers.

10. The method of claim 6, further comprising:
forming laterally-extending cavities by removing the sacrificial material layers selective to the insulating layers;
forming electrically conductive layers in the laterally-extending cavities by conformally depositing an electrically conductive material in the laterally-extending cavities; and
removing portions of the electrically conductive material from volumes of the first-tier trenches and the second-tier trenches, such that the electrically conductive layers are electrically isolated from each other.

11. The method of claim 6, further comprising:
forming a pair of crack-stop trenches at ends of the first-tier cavities; and
filling the pair of crack-stop trenches with a pair of crack-stop structures comprising a carbon or a semiconductor material.

12. The method of claim 11, wherein one of the laterally-extending cracks stops at the pair of crack-stop structures.

13. The method of claim 11, further comprising:
forming memory openings through the second-tier structure and the first-tier structure; and
depositing a set of conformal material layers in the memory openings and in the pair of crack-stop trenches, wherein:
memory opening fill structures comprise first portions of the set of conformal material layers that fill the memory openings;
the pair of crack-stop structures comprise second portions of the set of conformal material layers that fill the pair of crack-stop trenches; and
the set of conformal material layers comprise, in order of deposition, a blocking dielectric layer, a memory material layer, a tunneling dielectric layer, a semiconductor channel material layer, and a dielectric core layer.

14. The method of claim 6, wherein non-uniformities are located in the alternating stack above the first-tier cavities.

15. The method of claim 14, wherein the non-uniformities comprise microcracks.

16. The method of claim 14, wherein the non-uniformities comprise recesses.

17. The method of claim 14, wherein the non-uniformities comprise structurally weak regions.

18. The method of claim 14, further comprising forming wedges in an upper portion of the second-tier structure above the non-uniformities.

19. The method of claim 6, further comprising:
non-conformally depositing a plurality of additional material layers over the second-tier structure such that second-tier cavities are formed in volumes of the second-tier trenches that are not filled with the plurality of additional material layers; and inducing additional laterally-extending cracks in portions of the plurality of additional material layers that overlie the second-tier cavities, wherein the additional laterally-extending cracks are connected to a respective underlying one of the second-tier cavities and vertically extend to a topmost material layer among the plurality of additional material layers.

20. The method of claim 19, further comprising:

expanding the additional laterally-extending cracks into third-tier trenches by performing an anisotropic etch process;

forming memory openings through patterned portions of the plurality of additional material layers, the first-tier structure, and the first-tier structure; and forming memory opening fill structures in the memory openings, wherein each of the memory opening fill structures comprises a respective vertical stack of memory elements and a vertical semiconductor channel.

* * * * *